(12) United States Patent
Pan

(10) Patent No.: US 10,445,048 B2
(45) Date of Patent: *Oct. 15, 2019

(54) LARGER DISPLAYS FORMED BY MULTIPLE INTEGRATED LED ARRAY MICRO-DISPLAYS

(71) Applicant: Shaoher Pan, Palo Alto, CA (US)

(72) Inventor: Shaoher Pan, Palo Alto, CA (US)

(*) Notice: Subject to any disclaimer, the term of this patent is extended or adjusted under 35 U.S.C. 154(b) by 144 days.

This patent is subject to a terminal disclaimer.

(21) Appl. No.: 15/396,135

(22) Filed: Dec. 30, 2016

(65) Prior Publication Data

US 2018/0190615 A1 Jul. 5, 2018

(51) Int. Cl.
*G06F 3/14* (2006.01)
*H01L 25/065* (2006.01)
(Continued)

(52) U.S. Cl.
CPC .............. *G06F 3/1446* (2013.01); *G09G 3/32* (2013.01); *G09G 2300/026* (2013.01); *G09G 2300/0408* (2013.01)

(58) Field of Classification Search
CPC ...... G06F 3/041; G06F 3/0412; G06F 3/0416; G06F 3/044; G06F 3/1423–1446;
(Continued)

(56) References Cited

U.S. PATENT DOCUMENTS 5,827,753 A 10/1998 Huang et al.
6,844,903 B2 1/2005 Mueller-Mach et al.
(Continued)

FOREIGN PATENT DOCUMENTS

CN 102751296 10/2012
JP 2002-141492 5/2002
(Continued)

OTHER PUBLICATIONS

Horng et al., "Performance of GaN-based Light-emitting Diodes Fabricated Using GaN Epilayers Grown on Silicon Substrates," Optics Express, 22(1):179-187.
(Continued)

*Primary Examiner* — Nathan Danielsen
(74) *Attorney, Agent, or Firm* — Fish & Richardson P.C.

(57) ABSTRACT

Larger displays formed by multiple sub-displays, e.g., integrated light-emitting diode (LED) pixel array micro-displays, and methods of operating and making the larger displays are provided. An example larger display includes a plurality of sub-displays arranged on a display substrate. Each sub-display includes an array of light-emitting pixels formed on a first side of a substrate, each pixel including at least one light-emitting element, integrated circuits formed on a second side of the substrate, conductive electrodes penetrating through the substrate and coupling the array of light-emitting pixels to the integrated circuits, and a conductive grid array package, e.g., a ball grid array (BGA) package, formed on the second side of the substrate and conductively coupled to the integrated circuits. Interconnects are conductively coupled to the conductive grid array packages of the plurality of sub-displays to form the larger display.

25 Claims, 36 Drawing Sheets

(51) Int. Cl.
*H01L 23/48* (2006.01)
*G06F 3/044* (2006.01)
*G09G 3/32* (2016.01)
*H01L 25/075* (2006.01)

(58) Field of Classification Search
CPC ......... G09G 3/2003; G09G 3/32–3291; G09G 2300/02–026; G09G 2300/0408; G09G 2300/0417–0426; G09G 2310/0264–0297; G09G 2350/00; G09G 2352/00; G09G 2356/00; H01L 23/481; H01L 25/0655; H01L 25/50; H01L 27/15–156; H01L 33/06; H01L 33/32; H01L 33/382; H01L 33/504–508

See application file for complete search history.

(56) References Cited

U.S. PATENT DOCUMENTS

| | | | |
|---|---|---|---|
| 7,248,310 B2 | 7/2007 | Mueller-Mach et al. | |
| 7,956,370 B2 | 6/2011 | Pan | |
| 8,278,828 B1* | 10/2012 | Rutherford | G09G 3/3225 315/169.1 |
| 8,642,363 B2 | 2/2014 | Lau et al. | |
| 8,674,383 B2 | 3/2014 | Pan | |
| 9,423,535 B1 | 8/2016 | Hu et al. | |
| 9,905,602 B2* | 2/2018 | Takahashi | H01L 21/76898 |
| 2003/0025118 A1 | 2/2003 | Yamazaki et al. | |
| 2003/0082889 A1 | 5/2003 | Maruyama et al. | |
| 2004/0238827 A1 | 12/2004 | Takayama et al. | |
| 2005/0078104 A1* | 4/2005 | Matthies | G02F 1/13336 345/204 |
| 2006/0022909 A1* | 2/2006 | Kwak | G09G 3/3233 345/76 |
| 2007/0159061 A1* | 7/2007 | Krummacher | H05B 33/22 313/501 |
| 2008/0116468 A1 | 5/2008 | Radkov et al. | |
| 2008/0122055 A1* | 5/2008 | Perkins | H01L 27/14618 257/680 |
| 2009/0032799 A1 | 2/2009 | Pan | |
| 2010/0308300 A1 | 12/2010 | Pan | |
| 2011/0177636 A1 | 7/2011 | Pan et al. | |
| 2011/0193056 A1 | 8/2011 | Wang | |
| 2012/0169682 A1 | 7/2012 | Kuhlman et al. | |
| 2012/0223875 A1* | 9/2012 | Lau | G09G 3/32 345/83 |
| 2012/0241809 A1 | 9/2012 | Pan et al. | |
| 2012/0256814 A1* | 10/2012 | Ootorii | G09G 3/3208 345/82 |
| 2013/0293498 A1* | 11/2013 | Kim | G06F 3/0412 345/173 |
| 2014/0063393 A1 | 3/2014 | Zhong et al. | |
| 2014/0152619 A1 | 6/2014 | Hotelling et al. | |
| 2014/0225838 A1 | 8/2014 | Gupta et al. | |
| 2014/0264268 A1* | 9/2014 | Tseng | H01L 33/505 257/13 |
| 2015/0091849 A1 | 4/2015 | Ludden | |
| 2015/0169011 A1* | 6/2015 | Bibl | G06F 3/0412 345/175 |
| 2016/0163765 A1 | 6/2016 | Hu et al. | |
| 2016/0259368 A1 | 9/2016 | Bibl et al. | |
| 2016/0299395 A1 | 10/2016 | Kosuge et al. | |
| 2016/0313848 A1 | 10/2016 | Rhee | |
| 2017/0069611 A1 | 3/2017 | Zhang et al. | |
| 2017/0123529 A1 | 5/2017 | Ho | |
| 2017/0185193 A1 | 6/2017 | Kim | |
| 2017/0352791 A1* | 12/2017 | Kang | H01L 33/58 |
| 2018/0102085 A1 | 4/2018 | Pan | |
| 2018/0114800 A1 | 4/2018 | Pan | |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-State Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: An International Journal (ESTIJ), ISSN: 2250-3498, 5(4):299-301, Aug. 2015.

International Search Report and Written Opinion in PCT/US2017/056378, dated Mar. 6, 2018, 17 pages.

U.S. Appl. No. 15/937,735, filed Mar. 27, 2018, Shaoher Pan.

U.S. Appl. No. 15/291,330, filed Oct. 12, 2016, Integrated Light-Emitting Diode Arrays for Displays, Shaoher Pan.

U.S. Appl. No. 15/842,772, filed Dec. 14, 2017, Fabricating Integrated Light-Emitting Pixel Arrays for Displays, Shaoher Pan.

* cited by examiner

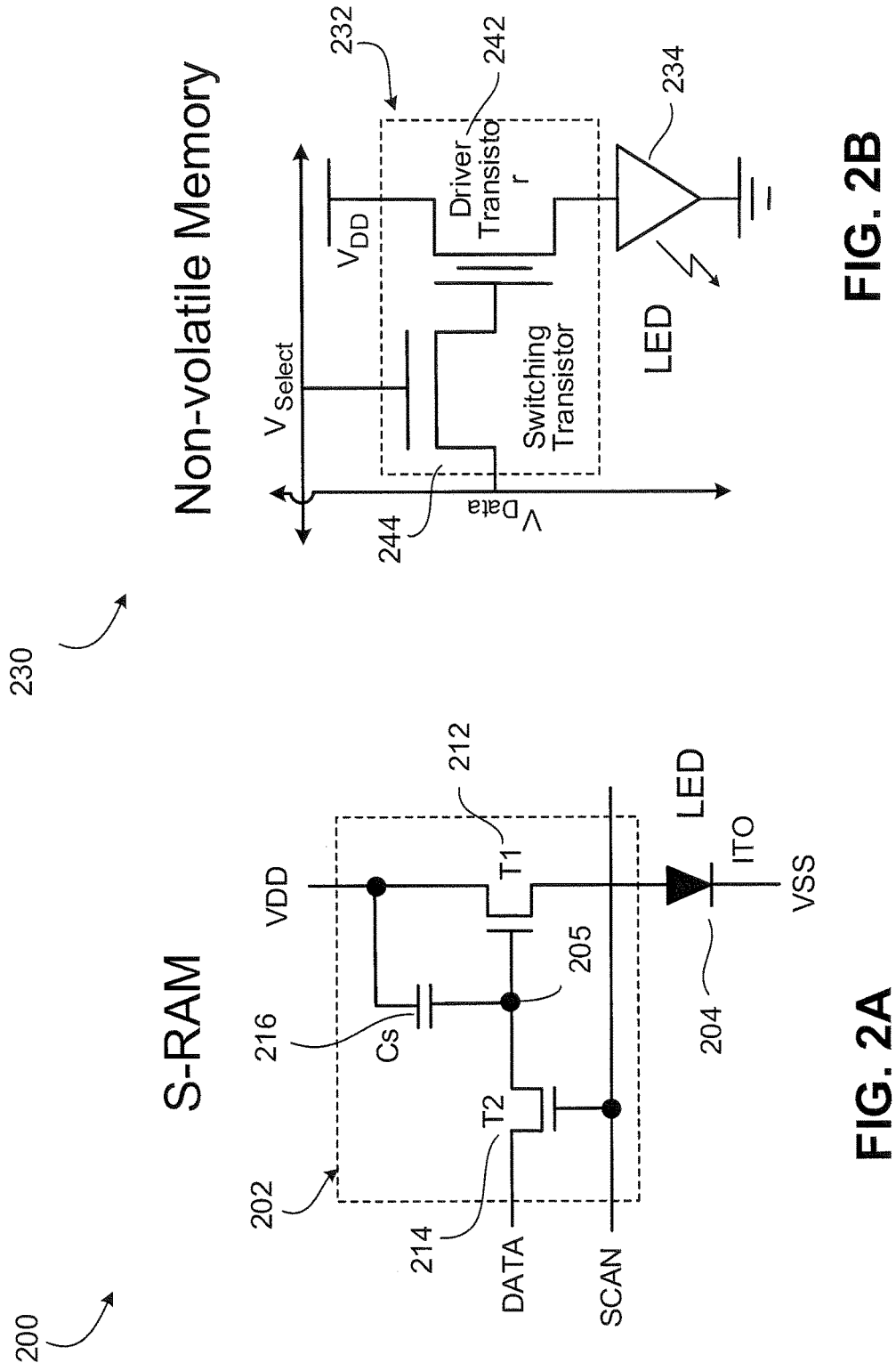

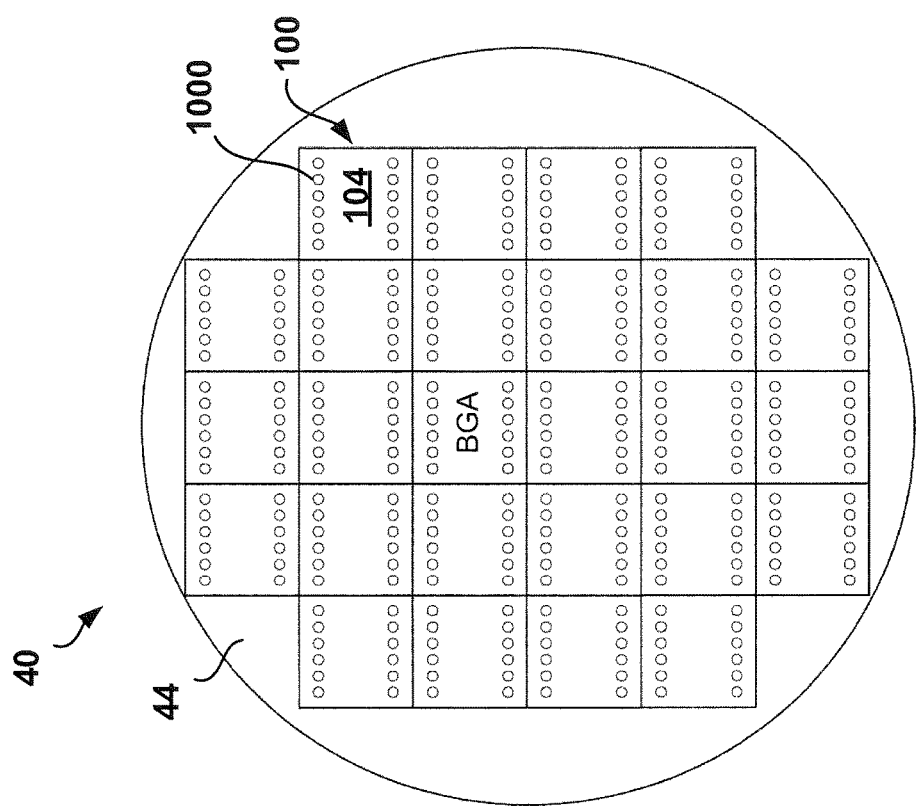
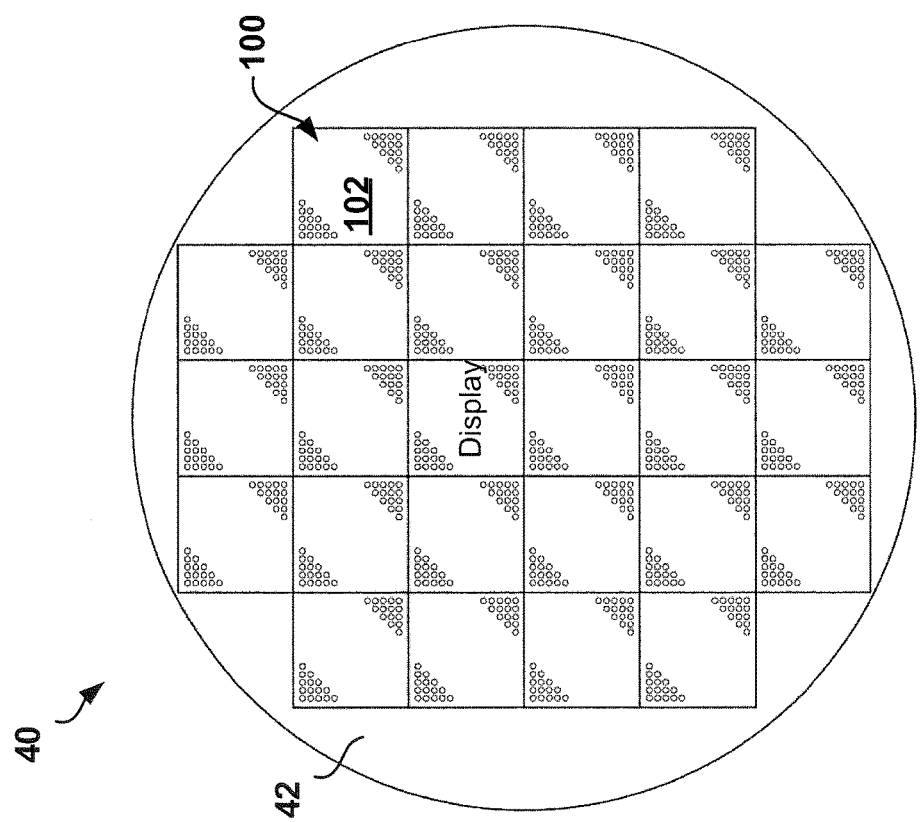
FIG. 4B
FIG. 4A

LARGER DISPLAYS FORMED BY MULTIPLE INTEGRATED LED ARRAY MICRO-DISPLAYS

TECHNICAL FIELD

This disclosure relates generally to display devices or systems, particularly to larger displays formed by multiple integrated light-emitting diode (LED) array micro-displays.

BACKGROUND

Displays utilizing arrays of light emitting pixels are popular in the electronic field, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a disadvantage is the complexity of their manufacturing process. Another disadvantage is current sizes of standard semiconductor integrated circuits (IC) manufacturing wafers, which limits the dimension of a display fabricated by using standard silicon wafers.

SUMMARY

Described herein are larger displays formed by multiple sub-displays, e.g., integrated light-emitting diode (LED) pixel array micro-displays, and methods of operating and making them.

One aspect of the present disclosure features a display formed by sub-displays comprising a plurality of sub-displays. Each sub-display includes an array of light-emitting pixels formed on a first side of a substrate, each pixel including at least one light-emitting element; integrated circuits formed on a second side of the substrate; conductive electrodes penetrating through the substrate and coupling the array of light-emitting pixels on the first side to the integrated circuits on the second side; and a conductive grid array package formed on the second side of the substrate and conductively coupled to the integrated circuits; and interconnects conductively coupled to the conductive grid array packages of the plurality of sub-displays.

The foregoing and other embodiments can each optionally include one or more of the following features, alone or in combination. For instance, the conductive grid array package can comprise a ball grid array (BGA) package, and the BGA package is formed on a surface of the integrated circuits. The integrated circuits can comprise display drivers configured to transmit image or video data to one or more particular light-emitting pixels and control the particular light-emitting pixels to emit light based on the image or video data.

In some implementations, each of the light-emitting pixels comprises at least one non-volatile memory formed on the first side of the substrate and coupled to the at least one light-emitting element, the sub-display further comprises word lines and bit lines formed on the first side of the substrate and coupled to the non-volatile memories of the light-emitting pixels, and the display drivers comprise scanning drivers and control drivers coupled to the word lines and the bit lines through the conductive electrodes, respectively, such that each of the non-volatile memories is coupled to one of the scanning drivers through at least one word line and to one of the data drivers through at least one bit line.

In some implementations, the integrated circuits comprise a plurality of non-volatile memories formed on the second side of the substrate and coupled to the light-emitting elements on the first side through the conductive electrodes, and the display drivers comprise scanning drivers and data drivers, and each of the non-volatile memories is coupled to one of the scanning drivers through at least one word line and to one of the data drivers through at least one bit line, the word lines and the bits lines being formed on the second side.

The integrated circuits can comprise control electronics, and the display drivers are coupled to the control electronics via first conductive connections formed on the second side of the substrate, and the control electronics are coupled to the conductive grid array package via second conductive connections formed on the second side of the substrate.

In some examples, the control electronics comprises at least one of: one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

In some implementations, the display further comprises a control unit coupled to the integrated circuits of the plurality of sub-displays through the interconnects and the conductive grid array packages of the plurality of sub-displays, and the control unit is configured to transmit image or video data and control signals to integrated circuits of one or more particular sub-displays of the plurality of sub-displays, such that the particular sub-displays are operable to display an integrated image or video representing the image or video data based on the control signals.

In some implementations, the display further comprises a display substrate, and the plurality of sub-display panels is arranged on the display substrate and adjacent to each other. A distance between adjacent light-emitting pixels on respective edges of adjacent sub-displays can be less than 1 mm. In some examples, the display substrate comprises a transparent solid substrate including one of a transparent glass substrate, a transparent plastic substrate, a transparent sapphire substrate, and a transparent thin-film substrate.

In some implementations, the display further comprises a conductive layer formed on a bottom side of the display substrate, and the conductive layer is arranged to face the light-emitting pixels on the plurality of sub-displays and coupled to respective electrodes of the light-emitting pixels. The conductive layer and the respective electrodes of the light-emitting pixels can form a touch screen position sensor operable to generate an electrical change in response to a touch on a spot of a top side of the display substrate.

In some implementations, the substrate is a silicon semiconductor substrate including: a first surface having a (111) orientation on the first side, and a second surface having a (111) orientation on the second side and opposite to the first surface, and the light-emitting pixels are formed on the first surface, and the integrated circuits are formed on the second surface.

Each of the pixels can include at least three light-emitting diodes (LEDs) operable to emit at least three different colors. The at least three LEDs can comprise same quantum well layers formed by Group III-V compounds and configured to emit light with a first color, and at least one of the at least three LEDs comprises a phosphor material or a quantum-dot material configured to emit a second light different from the first color.

In some implementations, each sub-display further comprises one or more display drivers formed on the first side of the substrate, and the display drivers are coupled to the array of light-emitting pixels via conductive connections on the first side and to the integrated circuits on the second side via the conductive electrodes. Each pixel can further comprise at least one non-volatile memory formed on the first side and coupled to the at least one light-emitting element, and each of the non-volatile memories is coupled to one of scanning drivers in the display drivers via at least one word line and to one of data drivers in the display drivers via at least one data line, the word lines and the data lines being formed on the first side.

In some implementations, the display further comprises a display substrate. The plurality of sub-display panels is arranged on the display substrate and adjacent to each other, and the display substrate comprises a scattering material configured to scatter light emitted from the pixels of the sub-displays to improve an illumination area of the pixels.

Another aspect of the present disclosure features a method of fabricating a display by multiple sub-displays, comprising: fabricating a plurality of sub-displays on one or more substrates that includes forming an array of sub-displays on each substrate, each sub-display including an array of light-emitting pixels formed on a first side of the substrate, each pixel including at least one light-emitting element; integrated circuits formed on a second side of the substrate; conductive electrodes penetrating through the substrate and coupling the array of light-emitting pixels on the first side to the integrated circuits on the second side; and a conductive grid array package formed on the second side of the substrate and coupled to the integrated circuits; then obtaining individual sub-displays from the substrates; arranging the individual sub-displays on a display substrate; and forming interconnects conductively coupled to the conductive grid array packages of the sub-displays arranged on the display substrate to form the display.

The foregoing and other embodiments can each optionally include one or more of the following features, alone or in combination. Each of the sub-displays can have a rectangular shape or a square shape. A distance between adjacent light-emitting pixels on respective edges of adjacent sub-displays of the display can be less than 1 mm. For each sub-display, the conductive grid array package can comprise a ball grid array (BGA) package, and the BGA package can be formed on a surface of the integrated circuits.

Arranging the individual sub-displays on the display substrate can comprise at least one of: arranging the individual sub-displays in rows and columns perpendicular to respective edges of the display substrate, the sub-displays in adjacent columns and rows being matched with each other, arranging the individual sub-displays in rows and columns with a titled angle to respective edges of the display substrate, the sub-displays in adjacent columns and rows being matched with each other, arranging the individual sub-displays in multiple columns or rows perpendicular to edges of the display substrate, the sub-displays of adjacent columns or rows being mismatched with each other in rows or columns, or arranging the individual sub-displays in multiple columns or rows with a titled angle to edges of the display substrate, the sub-displays in adjacent columns or rows being mismatched with each other in rows or columns.

A third aspect of the present disclosure features a method of displaying an image or video on a display formed by multiple sub-displays. The method includes: receiving an instruction to display an image or video on the display; analyzing, by a control unit of the display, the image or video to obtain image or video data; transmitting, by the control unit, the image or video data to a plurality of sub-displays of the display via interconnects coupled to grid array packages formed on the plurality of sub-displays, each sub-display comprising an array of light emitting pixels and receiving a respective part of the image/video data; at each sub-display, analyzing, by control electronics formed on a first side of a substrate of the sub-display, the respective part of image or video data to generate secondary image or video data; transmitting, by the control electronics, the secondary image or video data to display drivers; selecting, by the display drivers, particular light emitting pixels formed on a second side of the substrate, the particular light emitting pixels being coupled to the first side via conductive electrodes penetrating through the substrate; and controlling, by the display drivers, the selected particular light emitting pixels to emit light corresponding to the secondary image or video data; and transmitting, by the controller, control signals to the plurality of sub-displays, such that the sub-displays are operable to display an integrated image or video representing the image or video data based on the control signals.

In some implementations, the display drivers are formed on the first side of the substrate, and the particular light emitting pixels on the second side are coupled to the display drivers via the conductive electrodes penetrating through the substrate. In some implementations, the display drivers are formed on the second side of the substrate and coupled to the particular light emitting pixels via conductive connections formed on the second side and to the control electronics via the conductive electrodes penetrating through the substrate.

A fourth aspect of the present disclosure features a display formed by display panels, comprising: a transparent display substrate; and a plurality of display panels arranged on the transparent display substrate. Each display panel has a silicon substrate and comprises: an array of light emitting diode (LED) pixels formed on a first side of the silicon substrate, each pixel including at least one LED and at least one non-volatile memory coupled to the at least one LED; a display controller formed on a second side of the silicon substrate and coupled to the array of LED pixels through conductive electrodes penetrating through the silicon substrate; and a ball grid array (BGA) package formed on the second side of the silicon substrate and coupled to the display controller. In operation, image data is transmitted to respective display controllers of the display panels through the BGA packages of the display panels, and then the respective display controller coordinate with each other to control the corresponding LED pixels through the conductive electrodes to display an integrated single image corresponding to the image data.

The foregoing and other embodiments can each optionally include one or more of the following features, alone or in combination. A number of the plurality of display panels is larger than 1. The display controller can comprise column data drivers, row scanning drivers, signal processors, image memory, and signal amplifiers. A distance of adjacent display panels can be less than 1 mm. The transparent display substrate can comprise a transparent solid substrate that includes one of a transparent glass substrate, a transparent plastic substrate, a transparent sapphire substrate, and a transparent thin-film substrate. The display can further includes a transparent conductive film formed on a bottom of the transparent display substrate, and the transparent conductive film is coupled to electrodes in the LED pixels to form a touch screen sensor.

Particular embodiments of the subject matter described in this specification can be implemented so as to realize one or more of the following advantages. First, integrated light-emitting pixel array displays, e.g., integrated LED pixel array micro-displays, provide a number of advantages. For example, the light-emitting pixel arrays can be placed on one side of a substrate and are integrated with control electronics on the other side of the substrate and conductive interconnects through the substrate couple the control electronics to the pixel arrays. Accordingly, semiconductor based LED arrays can be integrated with display control electronics on a silicon substrate, enabling the use of standard semiconductor IC (integrated circuit) manufacturing equipment, facilities, and processes, resulting in reduced cost. Moreover, integrated LED arrays on a silicon substrate enables fabrication of an ultra-high resolution display, e.g., 100 μm per pixel, and/or micro-LED (μ-LED) displays with extremely high efficiency to save energy. The technology can use one or more quantum well layers of Group III-V compounds (e.g., GaN) as light emissive layers, which makes the LED arrays more energy efficient and more stable than OLED (organic LED) based arrays. The technology can also use phosphor materials or quantum-dot materials deposited on the III-V compound based LED arrays to produce multi-color displays. The technology can also integrate non-volatile memories, e.g., SRAM (static random-access memory), with the LEDs to form active-matrix LED pixels, enabling higher efficiency and faster response time than passive-matrix LED pixels. Furthermore, the technology allows integrating other components e.g., processors, memories, drivers, microcontrollers, sensors, timers, touch screen detectors, and/or amplifiers on the side of the silicon substrate opposite the pixel array, which greatly simplifies processing, achieves seamless integration and reduces cost. The integrated LED array-based display systems, particularly micro-display systems, can achieve low power consumption (e.g., one order of magnitude lower than current display devices such as OLED displays), high resolution (e.g., with pixels 10 times smaller than current display devices such as OLED displays), a thin device thickness (e.g., no more than 1 mm), a large view angle (e.g., no less than 160 degrees), a high luminance contrast modulation (e.g., 100%), a fast response time (e.g., 100 times faster than OLED displays), and/or low cost due to integration on a single substrate.

Second, this technology can use packaging techniques, e.g., ball grid array (BGA) packaging, to form larger displays with multiple integrated LED pixel array micro-displays (or panels). On one hand, the larger displays can still have the advantages of integrated LED pixel array microarrays as noted above. On the other hand, this technology can overcome the current dimensional limit of displays fabricated by using standard silicon wafers. Using multiple LED pixel arrays micro-displays to compose and assemble a larger micro-LED display, e.g., active-matrix, enables an unlimited size display at a significantly lower cost. Moreover, the integrated LED pixel array micro-displays can form LEDs or LED pixels all over areas of the micro-displays, including edges of the micro-displays, such that adjacent micro-displays have substantially no or little gap, e.g., less than 1 mm, which makes the larger display a whole piece to seamlessly display a single image or video. In some cases, the illumination areas over the physical areas of the larger displays can be about 90% or more, substantially larger than those of LCD displays or OLED displays.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIG. 2A shows an example active-matrix LED pixel with non-volatile memory.

FIG. 2B shows another example active-matrix LED pixel with non-volatile memory.

FIGS. 4A-4B show schematic diagrams of fabricating multiple square shape sub-displays on a wafer.

DETAILED DESCRIPTION

The following descriptions are example larger display devices or systems that are formed by multiple integrated light-emitting diode (LED) array micro-displays or panels using ball grid array (BGA) packaging technology. However, the disclosed implementations can be adopted to any suitable system that needs larger displays. Besides BGA packaging, the larger display devices or systems can adopt other grid array packaging or any other suitable packaging methods. And the light-emitting pixels can include any suitable light sources, e.g., semiconductor based LED pixels, OLED pixels, or laser diodes.

Example Larger Display Systems

Figure 1A:
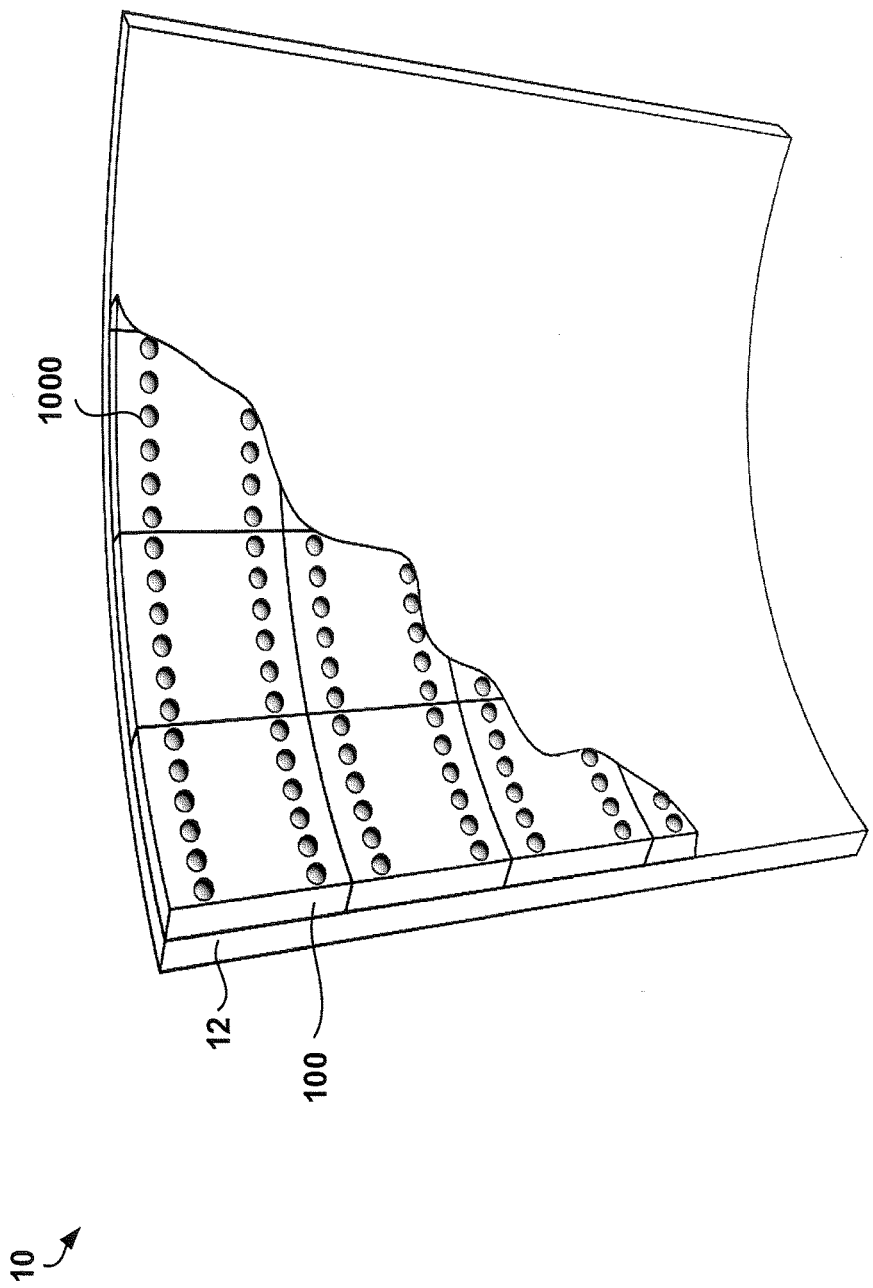
FIGS. 1A-1B show schematic diagrams of an example larger display by multiple sub-displays on a display substrate.
Figure 1B:
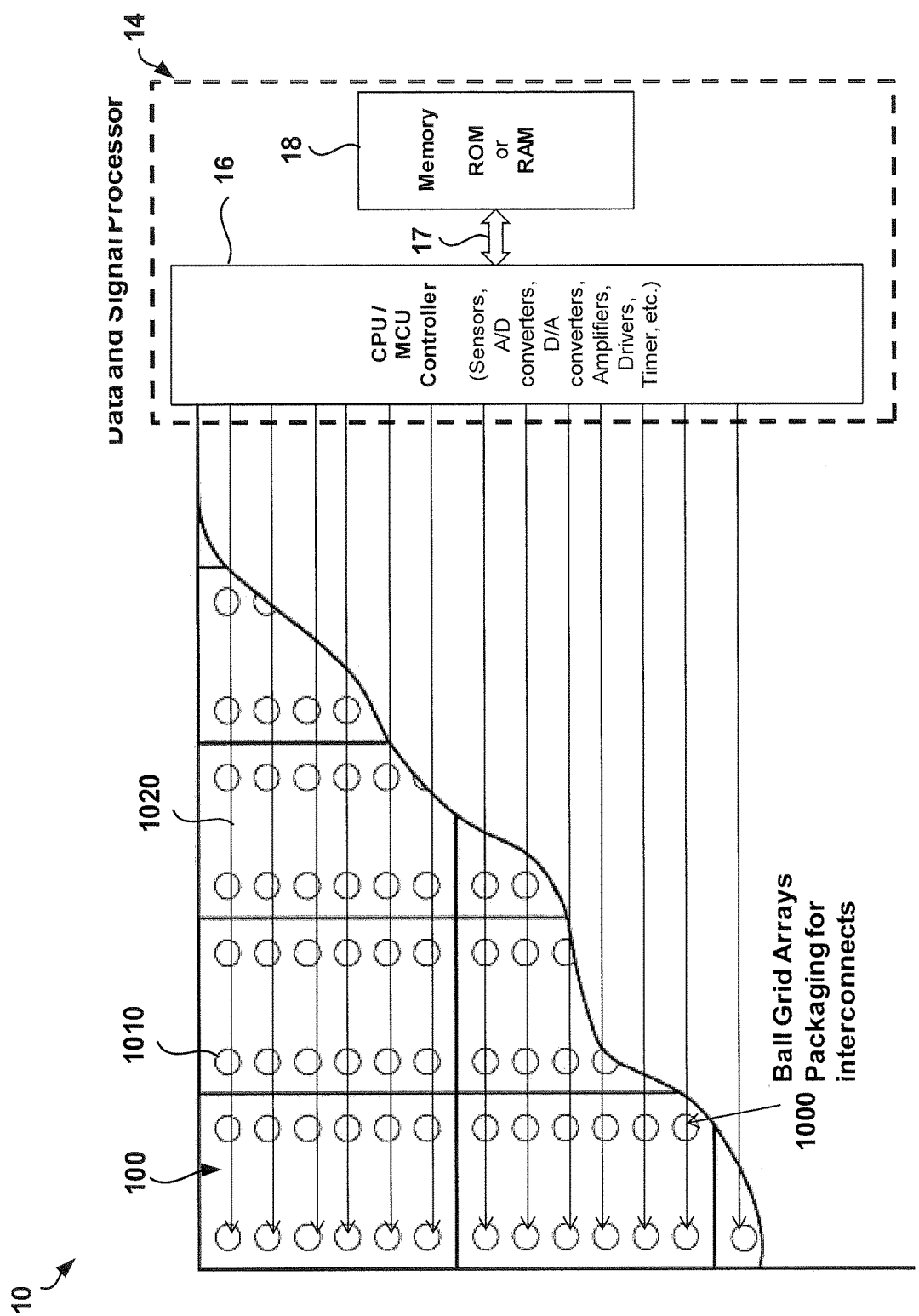

FIGS. 1A-1B show schematic diagrams of an example larger display 10. The display 10 can be used to display static or dynamic images/videos, e.g., in a large scale. The images/videos can have multiple colors.

The display 10 includes a display substrate 12 and multiple sub-displays 100 arranged on the display substrate 12. In some implementations, the display substrate 12 includes a transparent solid substrate, e.g., a transparent glass substrate, a transparent plastic substrate, a transparent sapphire substrate, or a transparent thin-film substrate. In some implementations, the display substrate 12 is semi-transparent. For example, the display substrate 12 can include scattering material to scatter or diffuse light emitted from the sub-displays 100, e.g., LEDs, to improve an illumination area of the display 10 and thus improve an aspect ratio of the display 10. The display substrate 12 can be flat or curved. The display substrate 12 can be square, circle, rectangular, or any other shapes, for the display 10.

As discussed in further details below, the sub-displays 100 can include integrated LED pixel array micro-displays. Each sub-display 100 can include a number of LED pixels on a first side of a substrate, e.g., a silicon substrate, and corresponding integrated circuits, e.g., display drivers and/or control electronics, on a second side of the substrate. The LED pixels are placed on a bottom side of the display substrate 12, such that light emitted from the LED pixels on the display 10 transmits out from a top side of the display substrate 12, e.g., to a viewer. As discussed in further details in FIGS. 7A-7D below, each sub-display 100 can have a square shape, a rectangular shape, or any suitable shape. The sub-display 100 can have a suitable size, e.g., 1 inch×1 inch. The sub-displays 100 are arranged on the display substrate 12 side by side. Each sub-display 100 is adjacent to other sub-displays 100 to form an integrated piece.

A ball grid array (BGA) package 1000 can be formed on the second side of the substrate, e.g., on a surface of the integrated circuits (ICs), and coupled to the integrated circuits of the sub-display 100. Each BGA package 1000 can include a number of BGA solider balls 1010 on the ICs, e.g., no less than 4. A larger number of BGA solider balls 1010 with corresponding grid lines enables a higher connection resolution for the sub-displays 100. In some examples, the BGA package 1000 includes fine pitch BGAs (FBGAs), plastic ball grid arrays (PBGAs), high thermal BGAs (H-PBGAs) such as flip chip (FC)-style, H-PBGAs, or any other types of BGAs.

As shown in FIG. 1B, the display 10 can include interconnects 1020 configured to connect together the BGA packages 1000 thus the integrated circuits of the multiple sub-displays 100. In such a way, the display 10 can control the LED pixels on the multiple sub-displays 100 to display an integrated single image or video. In some implementations, the display 10 includes a control unit 14, e.g., data and signal processors. The control unit 14 can include a CPU/MPU controller 16 having a central processing unit (CPU) and/or a microcontroller unit (MCU) and/or other integrated components, e.g., sensors, analog/digital converters (ADCs), digital/analog converters (DACs), amplifiers, drivers, and/or timers. The control unit 14 can also include a memory 18, e.g., a read-only memory (ROM) and/or a random-access memory (RAM). The memory 18 can receive and/or store images or videos for display, e.g., from an external computing device or a network. The CPU/MCU controller 16 can communicate with the memory 18 via connections 17, e.g., an internal bus. The CPU/MCU controller 16 can obtain an image/video form the memory 18 and process the image/video to generate image/video data. The BGA packages 1000 on multiple sub-displays 100 can be coupled to the CPU/MCU controller 16. As discussed in further details in FIG. 3, the control unit 14 can select individual sub-displays 100 and transmit respective parts of image/video data to the selected sub-displays 100 for displaying corresponding part of the image/video. The control unit 14 can also transmit control signals to the selected sub-displays 100 for controlling them to display the respective part of image/video data as a single image/video, e.g., simultaneously or in a time order.

In some implementations, the control unit 14 is external to the display 10. The control unit 14 can be included in a computing device coupled to the display 10. The computing device can be a mobile device, a desktop computer or a portable notebook, or any other data communication device.

In some implementations, a larger display is formed directly by the multiple sub-displays 100, without the display substrate 12. For example, the multiple sub-displays 100 can be glued or thermally coupled to each other on the vertical sides of the sub-displays 100.

Figure 1C:
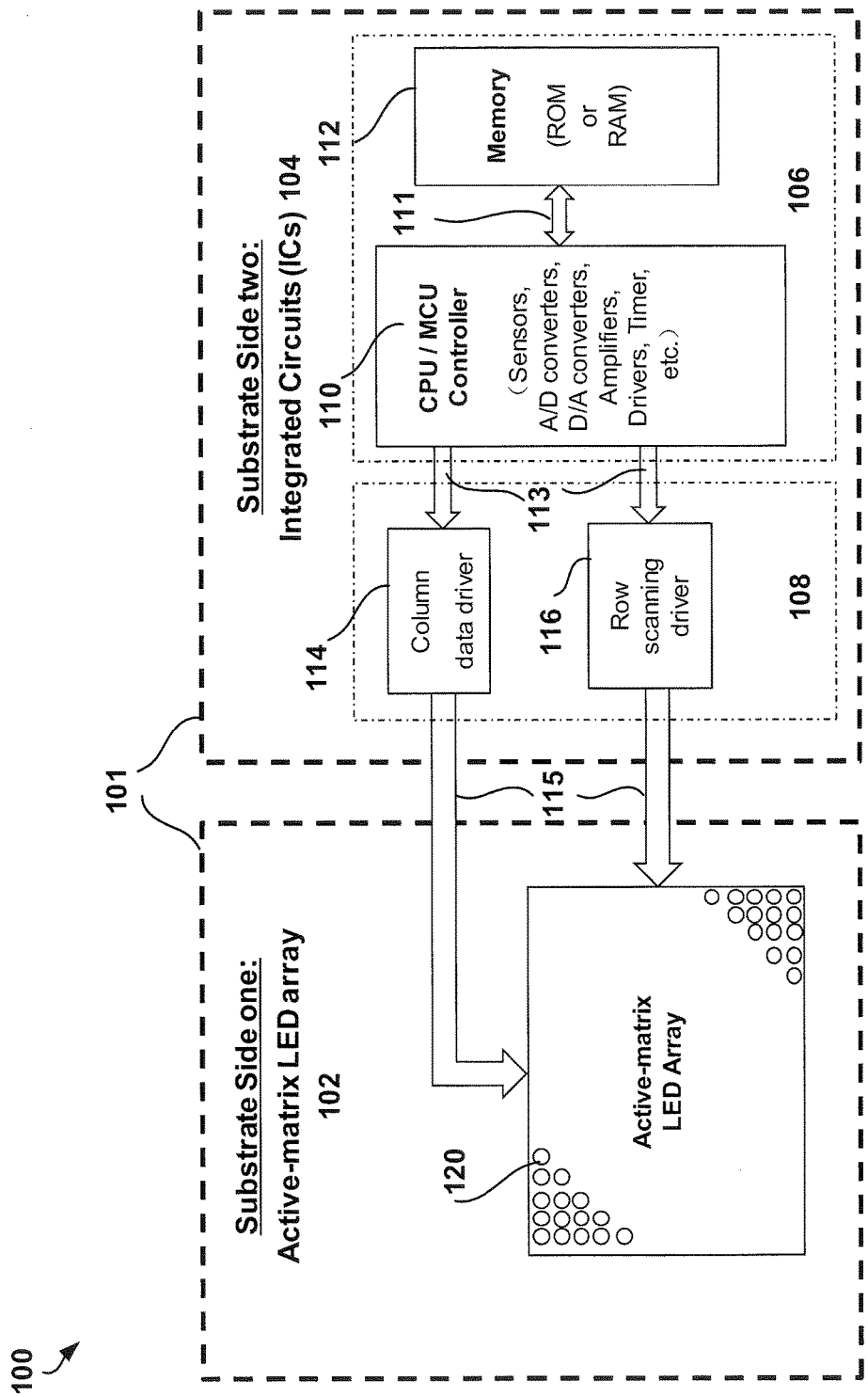
FIGS. 1C-1D is a schematic diagram of an example LED pixel array micro-display.

FIG. 1C is a schematic diagram of an example LED array micro-display 100. The micro-display 100 includes an active-matrix LED pixel array 102 formed on a first side of a substrate 101 and integrated circuits 104 formed on a second side of the substrate 101. The substrate 101 can be a silicon substrate, e.g., a silicon wafer. The LED pixel array 102 is coupled to the integrated circuits (ICs) 104 via conductive electrodes 115 and 117. The conductive electrodes 115 and 117 can penetrate through the substrate, e.g., via through-holes, and conductively couple the LED pixel array 102 to the integrated circuits 104. Components of the integrated circuit 104 can be monolithically manufactured on the second side of the substrate 101.

In some implementations, the integrated circuits 104 includes control electronics 106 and display drivers 108. As illustrated in FIG. 1C, the control electronics 106 can include a CPU/MCU controller 110 that have a CPU, an MCU, and/or integrated components such as sensors, analog/digital converters (ADCs), digital/analog converters (DACs), amplifiers, drivers, and/or timers. The control electronics 106 also includes a memory 112, e.g., a read-only memory (ROM) and/or a random-access memory (RAM). The CPU/MCU controller 110 can be coupled to the memory 112 via connections 111, e.g., internal bus, conductive electrodes, wired connections, or wireless connections. The CPU/MCU controller 110 are configured to read data from or store data into the memory 112. For example, the CPU/MCU controller 110 can receive image or video data to be displayed, e.g., from the control unit 14 of the display 10 via the BGA package 1000 on the sub-display 100 and the interconnects 1020. The CPU/MCU controller 110 can process the image or video data, and/or store the processed image or video data in the memory 112. The memory 112 can also store instructions to cause the control electronics 110 to execute operations.

The display drivers 108 are coupled to the control electronics 106, e.g., the CPU/MCU controller 110, via connections 113 which can be similar to the connections 111. The display drivers 108 are configured to receive image/video data and/or control signals from the control electronics 106. In some examples, the display drivers 108 include data drivers 114, e.g., for columns of the LED pixels array 102, and scanning drivers 116, e.g., for rows of the LED pixels array 102. The data drivers 114 can be coupled to the LED pixels array 102 via bit lines, and the scanning drivers 116 can be coupled to the LED pixels array 102 via word lines.

The LED array 102 can include an array 118 of active-matrix LED pixels 120. Each LED pixel is coupled to a data driver 114 via at least one bit line and a scanning driver (or scanning controller) 116 via at least one word line. The scanning driver 116 is configured to select an LED pixel through the word line and the data driver 114 transmits a data signal to the selected LED pixel through the bit line. The array 118 of LED pixels may be coupled to a plurality of data drivers 114 and a plurality of scanning drivers 116. In some implementations, as illustrated in FIG. 1C, the data drivers 114 and the scanning drivers 116 are formed on the opposite side as the array 102 of the LED pixels 120. The bit lines and the word lines can be formed on the first side of the substrate 101, together with the active-matrix LED array 102, and coupled to the display drivers 108 (the data drivers 114 and the scanning drivers 116) via conductive electrodes 115 penetrating through the substrate 101.

In some implementations, the control electronics 110 includes one or more digital signal processors including: a digital signal analyzer, a digital processor, an image processor, a volatile memory, a non-volatile memory, and/or a touch screen processor. The control electronics 104 can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC (not shown). The digital signal processors are connected to the data drivers 114 and the scanning drivers 116 through the connections 113. In operation, the analog signal processors can receive and process image or video signals from external devices or network (e.g., the control unit 14 of the display 10) or from the internal memory 112. The image or video signals may be analog signals which can be processed and converted into digital signals by an ADC. The digital signals are further processed and analyzed by the digital signal processors. Then the processed digital data can be further transmitted from the digital signal processors to particular data drivers 114 and scanning drivers 116 which then select particular LEDs and control the selected LEDs for display.

Figure 1D:
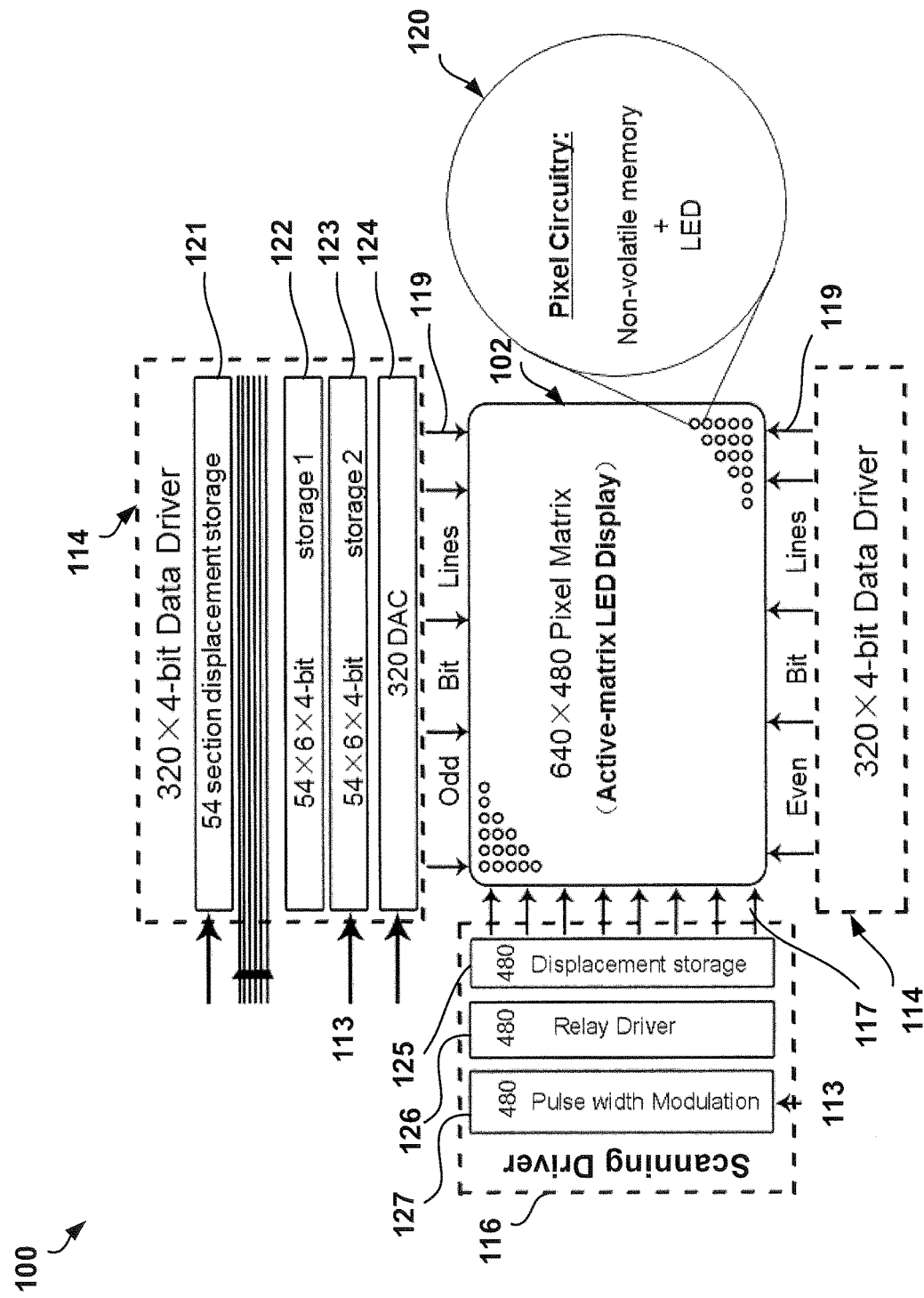

FIG. 1D shows an example implementation of the active-matrix LED display 102 and the display drivers 108. The LED pixel array 102 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

In some examples, an LED pixel includes a plurality of LEDs, e.g., blue, red, and green LEDs, and a plurality of corresponding non-volatile memories. Each LED is coupled to a respective non-volatile memory. In some examples, one LED pixel includes three LEDs and one non-volatile memory coupled to the three LEDs. In some examples, the LED pixel includes a white LED. In some examples, the LED pixel includes four LEDs including three LEDs emitting basic light such as red, blue, and green, and a white LED emitting white light.

The scanning driver 116 can include 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control electronics 110 and select one or more particular LED pixels based on those instructions.

In some implementations, the data driver is divided into two sub-drivers 114 positioned on top and bottom of the array 102 of LED pixels, respectively. Each sub-driver 114 can be a 320×4-bit data driver and include 54 section displacement storage 121, 54×6×4-bit storages 122 and 123, and/or 320 digital-to-analog converters (DACs) 124. Each sub-driver 114 is coupled to 320 columns of LED pixels through respective column bit lines 119. Particularly, the top sub-driver 114 is coupled to 320 columns of LED pixels through odd column bit lines, and the bottom sub-driver 114 is coupled to another 320 columns of LED pixels through even column bit lines. An intersection of an individual bit line 119 and an individual word line 117 is coupled to a respective LED pixel. That is, selecting the individual bit line 119 and the individual word line 117 can uniquely select the respective LED pixel. The sub-data driver 114 can receive instructions and/or data from the control electronics 110 through the connections 113, and select one or more particular LED pixels with the scanning driver 116 based on the instructions and/or data and transmit data to the selected particular LED pixels through respective bit lines 119.

In some implementations, the active-matrix LED micro-display 100, e.g., at least the active-matrix LED pixel array 102, is covered by a protective layer (not shown). The protective layer can be transparent. In some examples, the protective layer is made of glass coated with a conductive material like indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control electronics 110 through the non-volatile memory, a corresponding data driver 114/scanning driver 116 coupled to the non-volatile memory, and corresponding connections 113. Thus, the protective layer, the LED array, and the corresponding non-volatile memories can form a touch screen position sensor, which, together with the touch screen detector/processor in the control electronics 110, enables the LED micro-display 100 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

In some implementations, as discussed in further details in FIGS. 5A-5I, the non-volatile memories of the LED pixels 120 are formed on the second side of the substrate, opposite to the LEDs of the LED pixels 120. The non-volatile memories can be coupled to the LEDs via conductive electrodes penetrating through the substrate 101. Each non-volatile memory can be coupled to one of the scanning drivers on the second side through at least one word line and to one of the data drivers on the second side through at least one bit line. The word lines and the bit lines are formed on the second side.

In some implementations, the LED micro-display 100 only includes the display drivers 108 formed on the second side of the substrate 101, without the control electronics 106.

The display drivers 108 for the LED micro-display 100 can directly receive image/video data and/or control signals from the control unit 14 of the display 10 or from an external computing device.

Example Active Matrix LED Pixels

FIG. 2A shows an example active-matrix LED pixel 200 with non-volatile memory. The LED pixel 200 can be used as the LED pixel 120 of FIGS. 1C-1D. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244. In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage $V_T$ of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

Figure 2C:
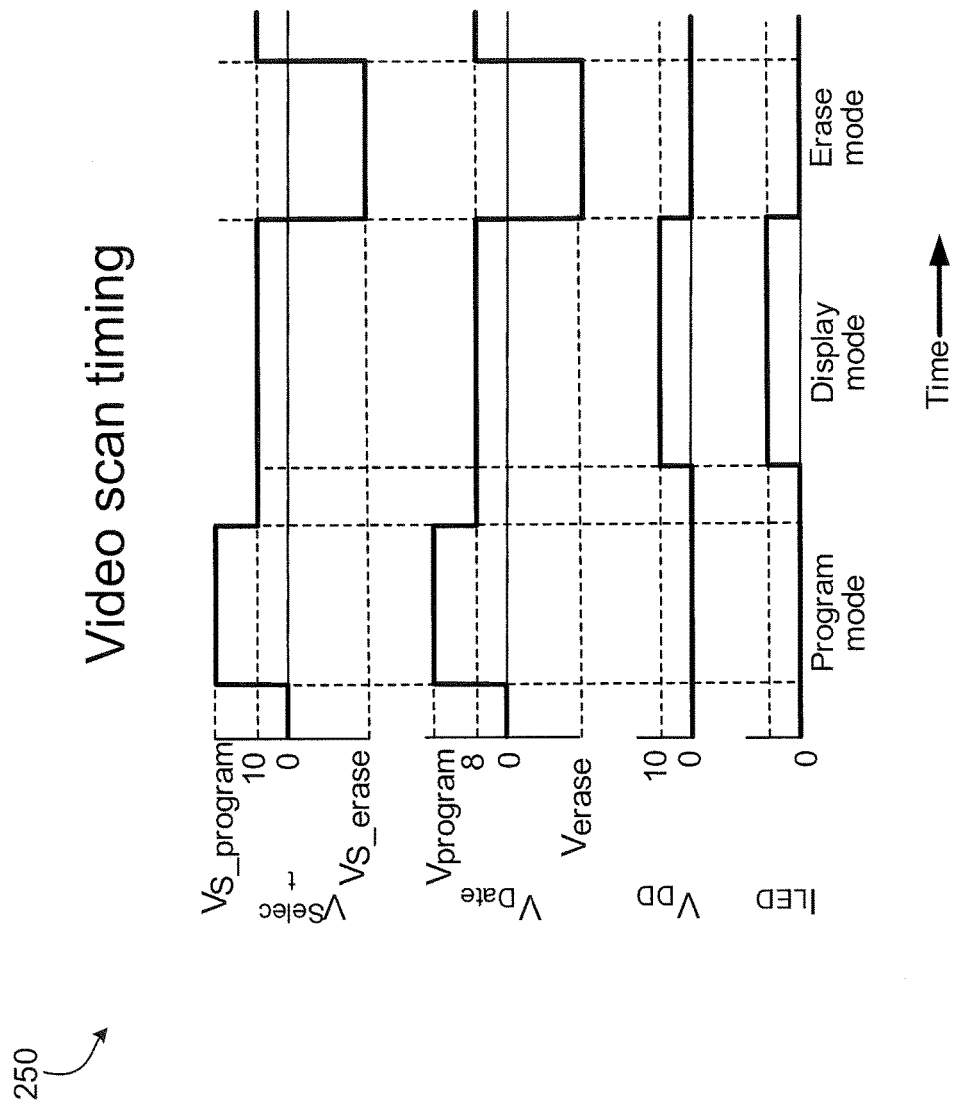
FIG. 2C shows an example video scan timing of a display using an active-matrix LED pixel.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{Select}$ to 10 V on all the word lines (select lines). The LED current and therefore brightness of the pixel 230 is determined by the programmed threshold voltage of the driver transistor 242. Both $V_{Data}$ and $V_{Select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Displaying Process

Figure 3:
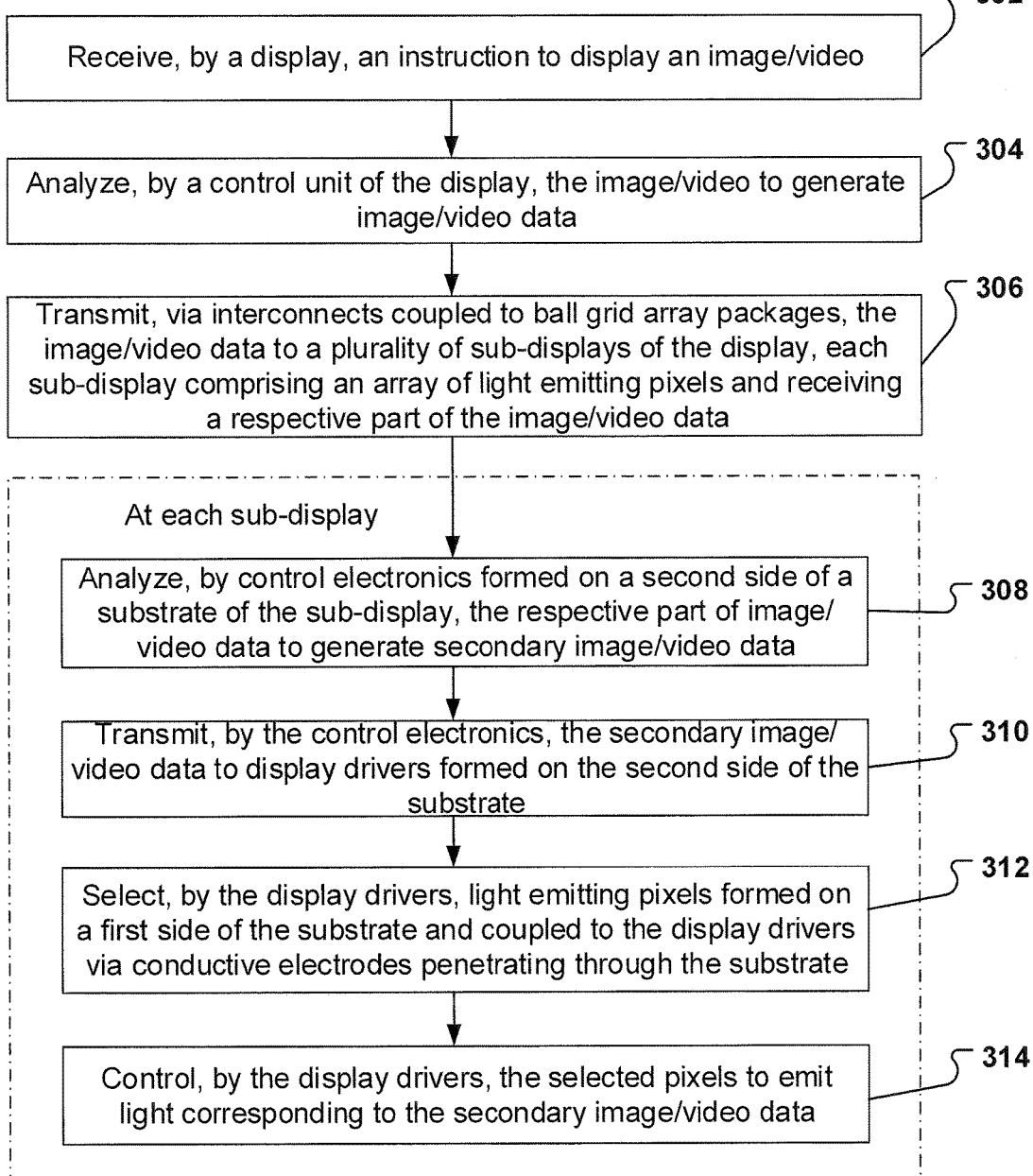
FIG. 3 shows an example process of displaying an image/video on a larger display formed by multiple sub-displays.

FIG. 3 shows an example process 300 of displaying an image/video on a larger display formed by multiple sub-displays. The larger display can be the display 10 of FIGS. 1A-1B and the sub-displays can be the display 100 of FIGS. 1A-1D or any other display system or device according to the present disclosure. The image can be static or dynamic. The video can be considered as a series of sequential images, and pixels of the larger display (or the multiple sub-displays) can be refreshed to display a next image to replace a previous image.

Each sub-display can include an array of light emitting pixels, e.g., the LED pixel array 102 of FIGS. 1C and 1D, and integrated circuits, e.g., the integrated circuits 104 of FIGS. 1C and 1D. The array of pixels is formed on a first side of a substrate and the integrated circuits are formed on a second side of the substrate and coupled to the pixels via conductive electrodes penetrating through the substrate. A BGA package, e.g., the BGA package 1000 of FIGS. 1A-1B, can be formed on the second side of each sub-display and coupled to the integrated circuits. The BGA packages can be connected via interconnects, e.g., the interconnects 1020 of FIG. 1B.

An instruction is received to display an image/video (302). The display can receive the instruction from an external device or network. In some cases, the image/video is received from the external device or network. In some cases, the image/video is stored in a memory, e.g., the memory 18 of FIG. 1B, in the display.

The image/video is analyzed by a control unit of the display to obtain image/video data (304). The control unit can be the control unit 14 of FIG. 1B. The control unit can analyze the image/video to generate the image/video data. In some cases, the image/video data is stored in the memory. The control unit can retrieve the stored image/video data based on the received instruction.

The image/video data is transmitted by the control unit to a plurality of sub-displays of the display (306). Based on the image/video data, the control unit can determine to select the plurality of sub-displays from the multiple sub-displays forming the display. The image/video data can be transmitted to integrated circuits of the selected plurality of sub-displays through the interconnects and the BGA packages. Each sub-display receives a respective part of the image/video data from the control unit.

The integrated circuits of each sub-display can include control electronics, e.g., the control electronics 106 of FIGS. 1C-1D, and display drivers, e.g., the display drivers 108 of FIGS. 1C-1D. After each sub-display receives the respective part of the image/video data from the control unit, the control electronics of the sub-display analyzes the respective part of the image/video data to generate secondary image/video data (308).

The secondary image/video data is transmitted by the control electronics to one or more display drivers of the sub-display (310). The display drivers are formed on the same side as the control electronics and coupled to each other via connections, e.g., the connections 113 of FIGS. 1C-1D. In some examples, the control electronics selects the display drivers based on a result of analyzing the image/video and transmits the secondary image/video data to the selected display drivers. The display drivers can include at least one scanning driver, e.g., the scanning driver 116 of FIGS. 1C-1D, and at least one data driver, e.g., the data driver 114 of FIGS. 1C-1D.

One or more light-emitting pixels of an array of light-emitting pixels are selected by the display drivers (312). The light-emitting pixels can be active-matrix pixels including non-volatile memories. Each light-emitting pixel is coupled to a display driver through connection lines. The connection lines can be formed as conductive electrodes penetrating through the substrate. In some examples, each light-emitting pixel is coupled to a scanning driver through at least one word line and a data driver through at least one bit line. The scanning driver is configured to select a light-emitting pixel with the data driver, and the data driver is configured to transmit a data signal to the selected light-emitting pixel.

The selected light-emitting pixels are controlled by the display drivers to emit light corresponding to the secondary image/video data (314). The secondary image/video data can be transmitted to the selected light-emitting pixels by the display drivers, e.g., via a voltage applied on the connection lines such as bit lines. As noted above in FIGS. 2A-2C, by controlling the voltage applied on the connection lines or a threshold voltage of a transistor in an active-matrix pixel, the selected light-emitting pixels can be controlled to emit light with brightness corresponding to the secondary image/video data, thus to display image/video corresponding to the secondary image/video data. Accordingly, the pixels of the selected plurality of sub-displays can present together an image/video corresponding to the image/video data.

Example Fabrication Processes

Sub-displays, e.g., the micro-displays 100 of FIGS. 1A-1D, can be formed on silicon wafers. The silicon wafers can be standard semiconductor integrated circuits (IC) manufacturing wafers, e.g., 150 mm (6 inches), 200 mm (8 inches), 300 mm (12 inches), and 450 mm (18 inches) in diameter. A number of sub-displays can be formed on a single silicon wafer, and then individual sub-displays can be obtained, e.g., by cutting, from the silicon wafer, and assembled on a display substrate, e.g., the display substrate 12 of FIG. 1A, to form a larger display, e.g., the display 10 of FIGS. 1A-1B.

In some implementations, individual sub-displays are taken from the silicon wafer one by one to be assembled on a display substrate. In some implementations, two or more sub-displays are taken together from the silicon wafer to be assembled on a display substrate. In a particular example, all the sub-displays formed on the silicon wafer are taken together from the silicon wafer to be assembled on a display substrate. The number of the sub-displays formed on a wafer can depend on the shapes of the sub-displays. Each sub-display can have a shape, e.g., square, rectangular, triangle, or any other suitable shape.

FIGS. 4A-4B show schematic diagrams of fabricating multiple square shape sub-displays 100 on a silicon wafer 40. Arrays 102 of light-emitting pixels, e.g., LED pixels, of the multiple sub-displays 100 are formed on a first side 42 of the silicon wafer 40, and integrated circuits 104 and BGA packages 1000 are formed on a second side 44 of the silicon wafer 40. The BGA packages 1000 are coupled to the integrated circuits 104 on the second side 44 via conductive connections, and the integrated circuits 104 are coupled to the arrays 102 of light-emitting pixels via conductive electrodes penetrating through the silicon wafer 40. In a particular example, as shown in FIGS. 4A-4B, there are total 26 square shape sub-displays 100 that can be formed on the single silicon wafer 40.

Figure 4D:
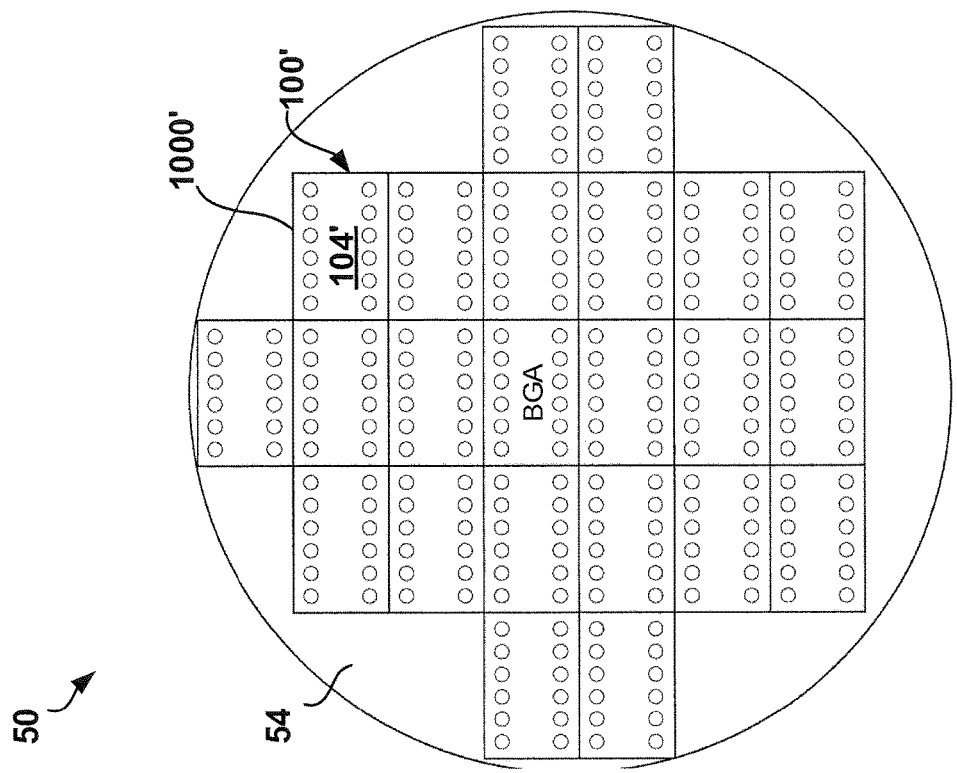
FIGS. 4C-4D show schematic diagrams of fabricating multiple rectangular shape sub-displays on a wafer.
Figure 4C:
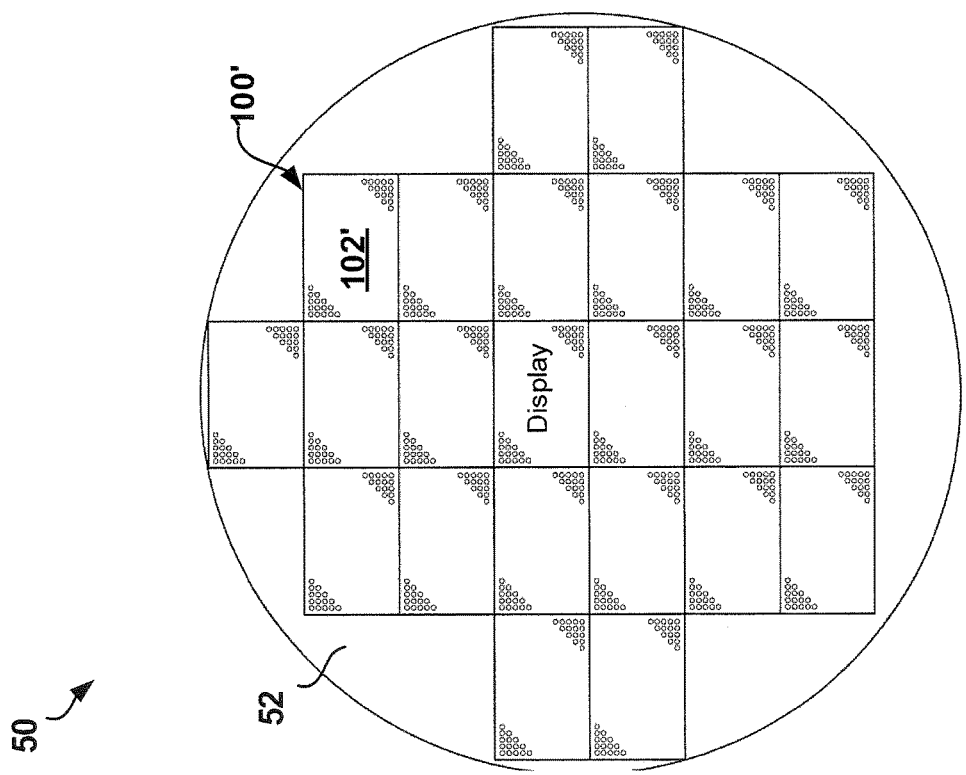

FIGS. 4C-4D show schematic diagrams of fabricating multiple rectangular shape sub-displays 100' on a silicon wafer 50. Arrays 102' of light-emitting pixels, e.g., LED pixels, of the multiple sub-displays 100' are formed on a first side 52 of the silicon wafer 50, and integrated circuits 104' and BGA packages 1000' are formed on a second side 54' of the silicon wafer 50. The BGA packages 1000' are coupled to the integrated circuits 104' on the second side 54 via conductive connections, and the integrated circuits 104' are coupled to the arrays 102' of light-emitting pixels via conductive electrodes penetrating through the silicon wafer 50. In a particular example, as shown in FIGS. 4C-4D, there are total 23 rectangular shape sub-displays 100' that can be formed on the single silicon wafer 50.

The sub-displays can be implemented with different configurations. For example, the sub-displays can be implemented as integrated LED array displays described in a U.S. patent application Ser. No. 15/291,330, entitled "INTEGRATED LIGHT-EMITTING DIODE ARRAYS FOR DISPLAYS" and filed by the same applicant on Oct. 12, 2016 herewith, whose content is hereby incorporated by reference in its entirety.

The sub-displays can be formed on silicon semiconductor substrates with (111) orientation or silicon (111) substrates. In some implementations, a sub-display is similar to the integrated LED display system 400 of FIGS. 4A-4B of the U.S. patent application Ser. No. 15/291,330. An array of active-matrix LED pixels are formed on a first side of a silicon substrate with (111) orientation. Each LED pixel includes at least one LED and at least one non-volatile memory coupled to the at least one LED. Display drivers (e.g., scanning drivers and data drivers) are also formed on the first side of the silicon substrate and conductively coupled to the LED pixels via connection lines (e.g., word lines and bit lines) on the first side. For example, each of the non-volatile memories in the pixels can be coupled to one of the scanning drivers via at least one word line and to one of the data drivers via at least one bit line. The word lines and the bit lines are also formed on the first side. Control electronics can be formed on a second side of the silicon substrate and coupled to the display drivers via conductive electrodes penetrating through the silicon substrate. BGA packages can be formed on the second side of the silicon substrate and coupled to the control electronics via conductive connections.

Figure 8A:
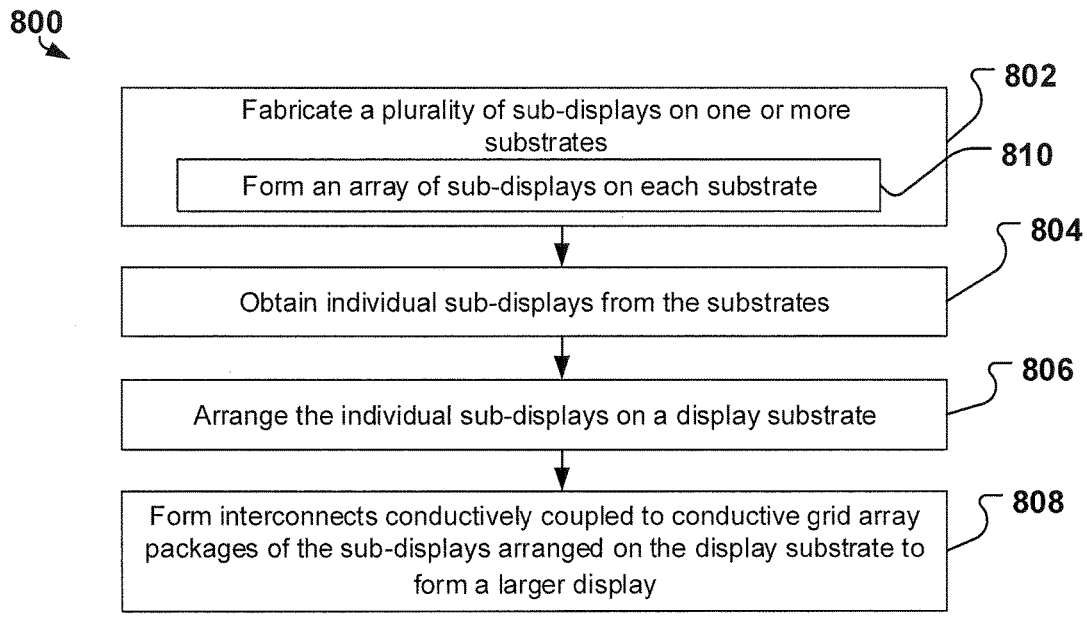
FIG. 8A is a flow diagram of an example process of forming a larger display by multiple sub-displays.

In some implementations, a sub-display is similar to the integrated LED display system 800 of FIG. 8A of the U.S. patent application Ser. No. 15/291,330. An array of active-matrix LED pixels can be formed on a first side of a silicon (111) substrate. Each LED pixel includes at least one LED and at least one non-volatile memory coupled to the at least one LED. Display drivers and control electronics are formed on a second side of the silicon substrate. The non-volatile memories of the LED pixels are coupled to the display drivers (scanning drivers and data drivers) via connection lines (e.g., word lines and bit lines) that can be formed on the first side of the silicon substrate and conductive electrodes that penetrate through the silicon substrate. BGA packages can be formed on the second side of the silicon substrate and coupled to the control electronics via conductive connections.

Figure 8B:
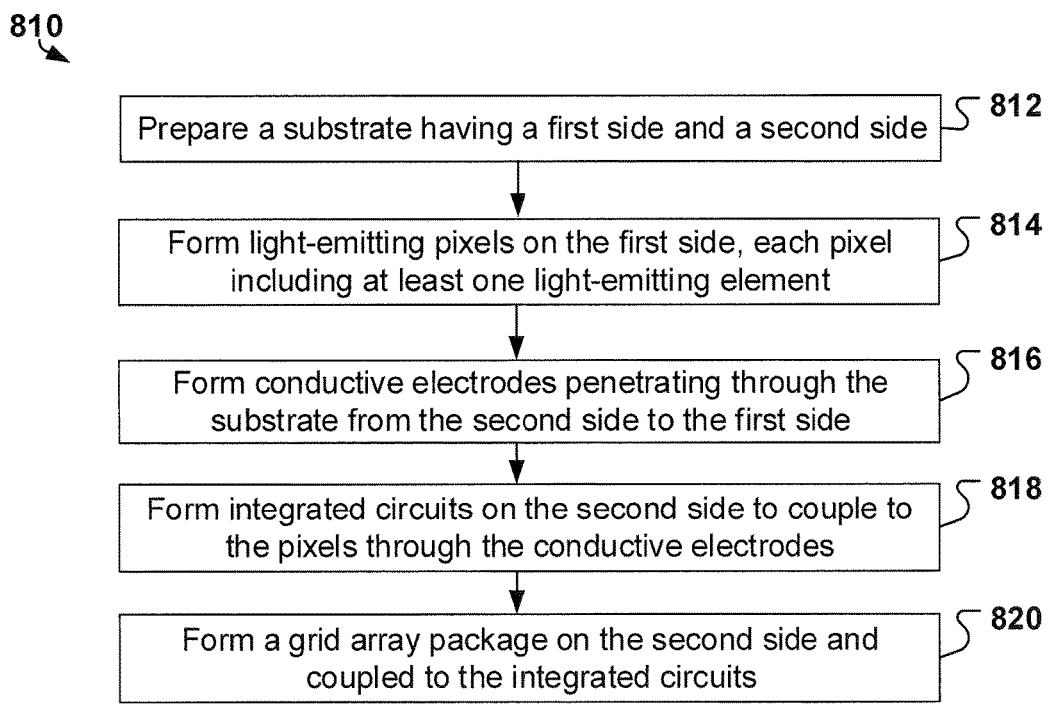
FIG. 8B shows an example process of forming an array of sub-displays on a substrate.

In some implementations, a sub-display is similar to the integrated LED display system 830 of FIG. 8B of the U.S. patent application Ser. No. 15/291,330. An array of LEDs is formed on a first side of a silicon (111) substrate. Non-volatile memories can be formed on a second side of the silicon substrate and coupled to corresponding LEDs through conductive electrodes penetrating through the silicon substrate to form active-matrix LED pixels. Each non-volatile memory can be coupled to a scanning driver via at least one word line and to a data driver via at least one bit line on the second side of the silicon substrate. BGA packages can be formed on the second side of the silicon substrate and coupled to the control electronics via conductive connections. The sub-display can be also similar to any other integrated LED display system formed on a silicon (111) substrate as described in the U.S. patent application Ser. No. 15/291,330.

The sub-displays can be also formed on a silicon semiconductor substrate with (100) orientation or a silicon (100) substrate. The silicon (100) substrate can be etched to generate trenches with silicon (111) sub-surfaces. LEDs can be formed on the silicon (111) sub-surfaces within the trenches of the silicon (100) substrate. A sub-display can be similar to the integrated LED display system 600 of FIGS. 6A-6B or the LED display system 850 of FIG. 8C, or any other integrated LED display system formed on a silicon (100) substrate as described in the U.S. patent application Ser. No. 15/291,330.

In the following, for illustration only, FIGS. 5A-5I show perspective views at different steps of forming an integrated active-matrix LED micro-display 550 on a silicon (111) substrate, where LEDs are formed on one side and non-volatile memories, display drivers, control electronics, and BGA packages are formed on the other side of the silicon (111) substrate. FIGS. 6A-6M show perspective views at different steps of forming an integrated active-matrix LED micro-display 670 on a silicon (111) substrate, where LED pixels including both LEDs and non-volatile memories are formed on one side of the silicon (111) substrate, and display drivers, control electronics, and BGA packages are formed on the other side of the silicon (111) substrate.

Referring now to FIG. 5A-5J, perspective views at different steps of forming the integrated LED display 550 on a silicon (111) substrate 500, e.g., a silicon (111) wafer, are shown. The silicon (111) substrate 500 has an upper side 501 including a top surface 502 and a lower side 503 including a bottom surface 504. The top surface 502 and the bottom surface 504 can be parallel to a (111) crystalline plane. The integrated LED array display 550 can be formed by the following steps.

First, the silicon (111) substrate 500 is prepared. The substrate 500 can be pre-treated, e.g., by cleaning the surfaces 502 and 504. In some cases, wet chemical treatment, e.g., an RCA clean procedure based on solutions, can be used to remove any organic or inorganic contaminations present on the surfaces 502 and 504. The solutions can include hydrogen peroxide, trichloroethylene, acetone, or methanol.

Second, the silicon substrate 500 is patterned. In some implementations, a hard mask layer, e.g., SiNx such as $Si_3N_4$, is used as a protective layer for patterning. The patterning of the silicon substrate 500 can include: 1) patterning a hard mask layer on the silicon substrate 500. This patterning can be formed by putting a mold with the desired pattern over the silicon substrate 500 and then depositing the hard mask layer. The hard mask layer can be deposited on the silicon substrate by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber; 2) dry etching silicon of the silicon substrate, e.g., using reactive ion etching (ME) or plasma etching; 3) removing the remaining hard mask layer.

Figure 5A:
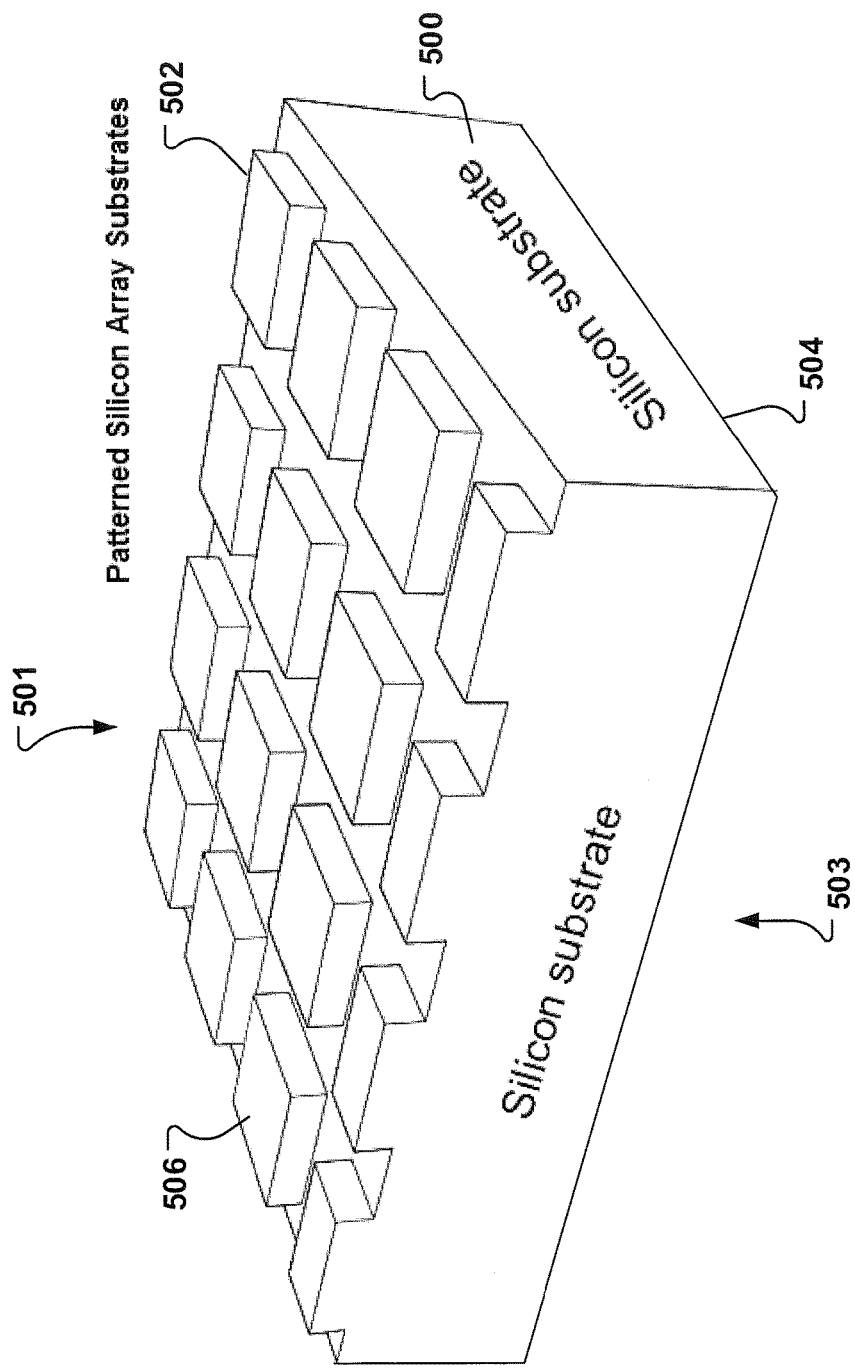
FIGS. 5A-5I show perspective views at different steps of forming an integrated active-matrix LED micro-display with LEDs and non-volatile memories on different sides of a silicon substrate.

In some cases, the patterning of the silicon substrate occurs over the top surface 502 for forming an array of LEDs. The LEDs can be formed on the edges of the top surface 502, so that light emitted from the LEDs can illuminate over the top surface. FIG. 5A illustrates the substrate 500 patterned by using the hard mask layer SiNx.

The patterned silicon substrate includes an array of etched sub-substrates 506 arranged in columns and rows for forming the array of LEDs.

In some implementations, photoresist is used as a protective material for patterning. The patterning of the silicon substrate 500 can include: 1) patterning a photoresist layer on the silicon substrate 500, e.g., by photolithography; 2) etching silicon with plasma; 3) removing the remaining photoresist layer from the silicon substrate.

Third, an array of LEDs 508 are formed on the upper side 501 of the patterned silicon substrate. The LEDs 508 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer, for emitting light with a specified wavelength. The quantum-well layer can include a uniform layer or a plurality of quantum wells. For example, a quantum-well layer can include a substantially uniform layer made of InN, GaN, InGaN, AlGaN, InAlN, or AlInGaN. A quantum-well layer can also include a multi-layer structure defining one or more quantum wells. A quantum well can for example be formed by an InGaN, an AlGaN, an InAlN, or an InCaAlN layer sandwiched in between two GaN layers. A quantum well can also be formed by an InCaM layer sandwiched in between GaN or AlGaN layers. The quantum-well layer can include one or a stack of such layered structure each defining a quantum well as described above.

Figure 5B:
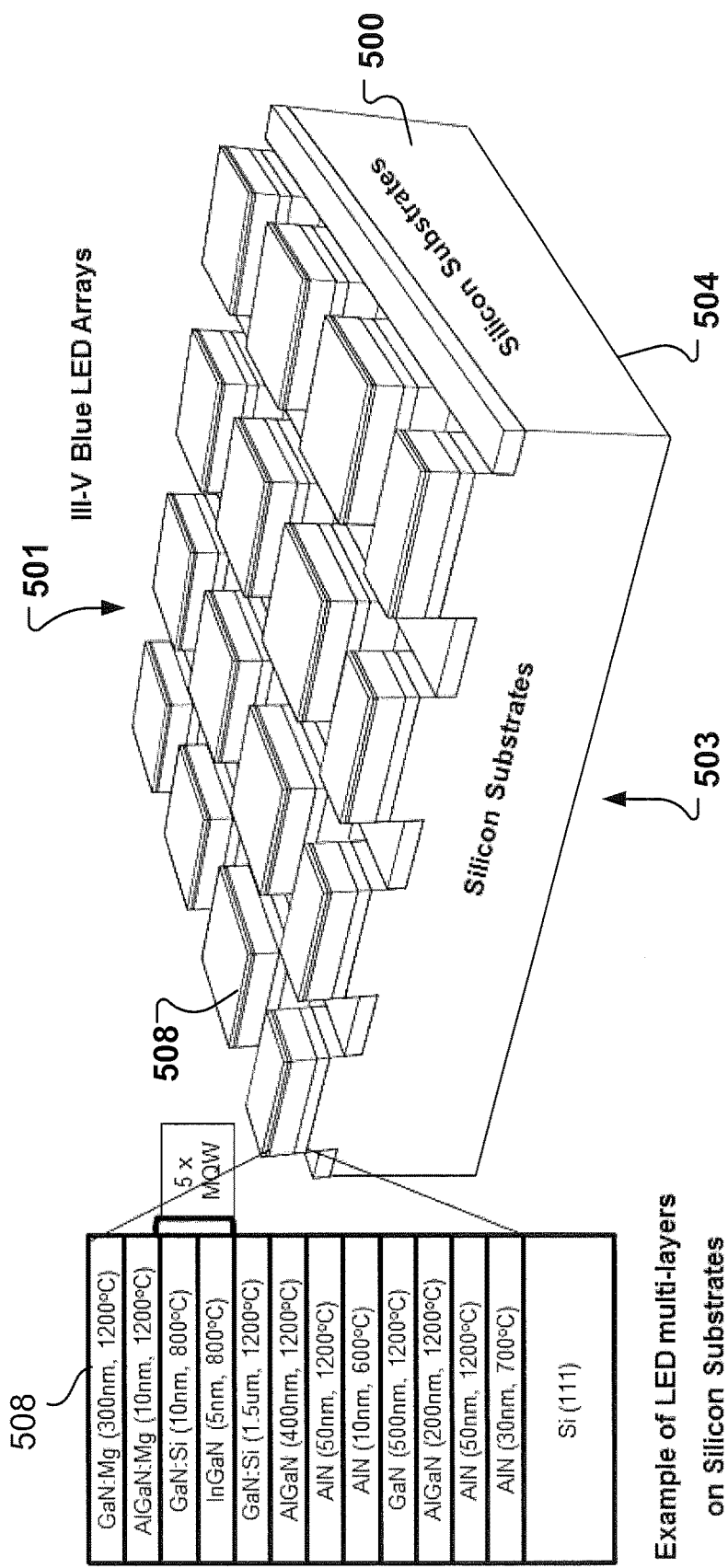

As an example illustrated in FIG. 5B, III-V blue light LEDs 508 are formed on the silicon (111) surfaces by using pairs of InGaN and GaN:Si as the quantum well (MQW) layer. The LEDs 508 can include one or more buffer layers deposited on the silicon (111) surface, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

Figure 5C:
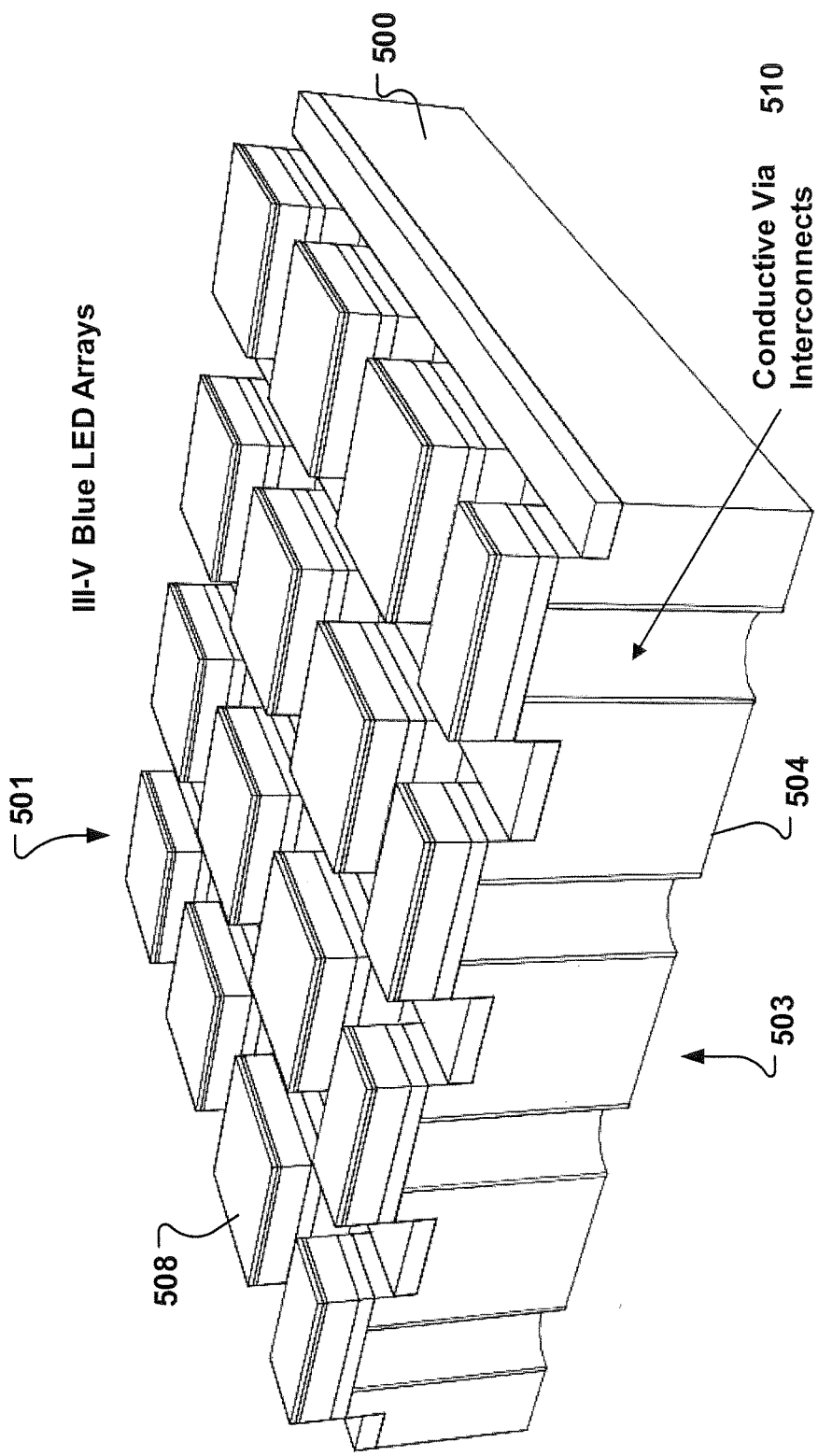

Fourth, as shown in FIG. 5C, conductive electrodes 510 are formed as interconnects from a bottom side of each LED 508 to the bottom surface 504, which penetrate through the silicon substrate 500. The conductive electrodes 510 can be implemented with the following steps: 1) the silicon substrate 500 is thinned from the lower side 503; 2) the silicon substrate 500 is selectively etched, e.g., by deep RIE or plasma etch, from the lower side 503 to form deep trenches (or through-holes) underneath each of the LEDs 508; 3) conductive electrodes are formed inside the deep trenches to form interconnects. In some cases, inner surfaces of the deep trenches are insulated and then metal is filled inside the deep trenches, e.g., by CVD, to form the conductive electrodes 510 as interconnects from the LEDs 508 to the lower side 503.

Figure 5D:
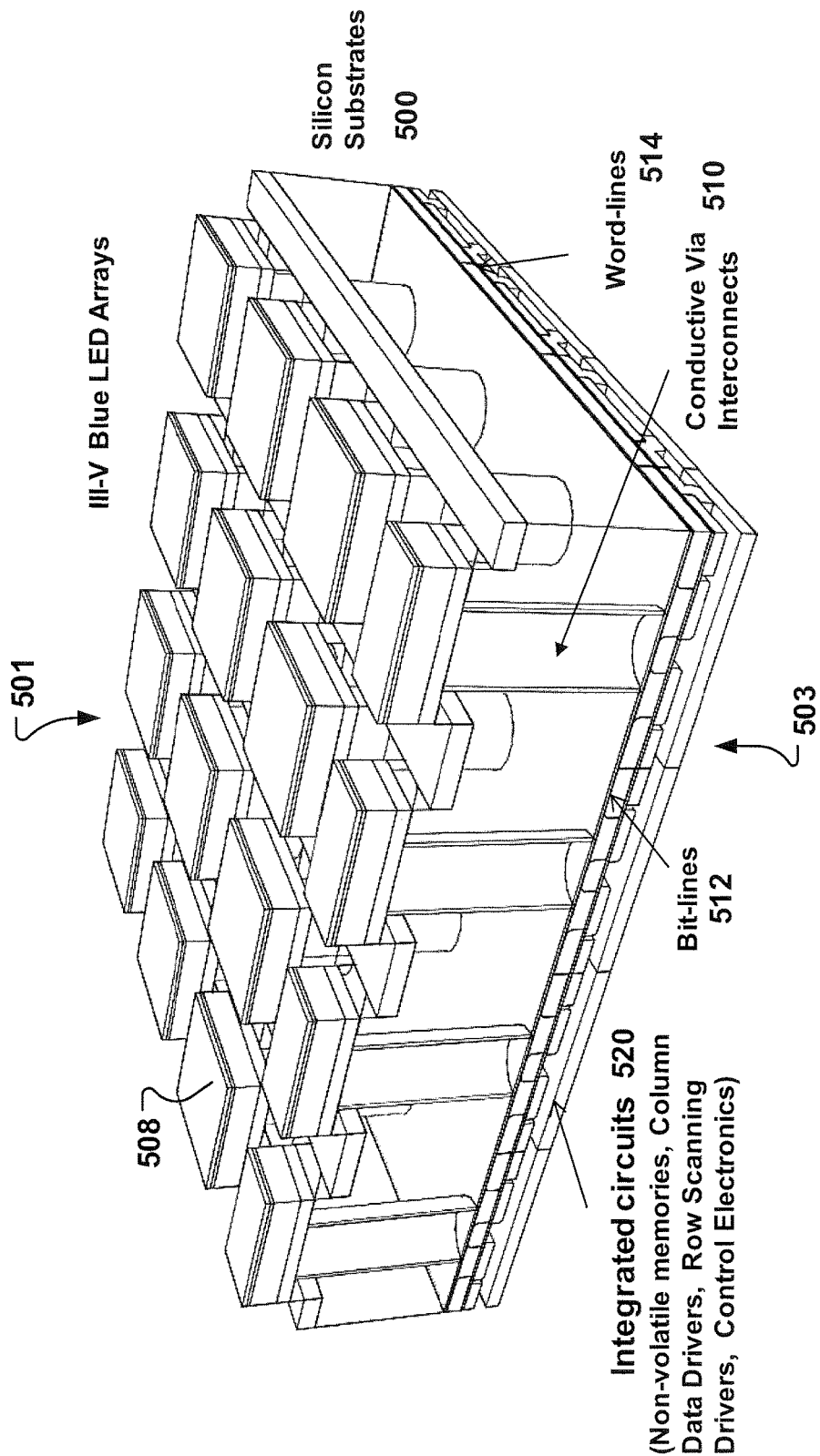

Fifth, as shown in FIG. 5D, integrated circuits 520 are formed on the lower side 503 and coupled to the LEDs 508 via the conductive electrodes 510. The integrated circuits 520 can include non-volatile memories, display drivers (column data drivers and row scanning drivers), and control electronics (e.g., CPU/MPU, memory, A/D converters, D/A converters, amplifiers, and other ICs). Each of the non-volatile memories can be similar to the non-volatile memory 200 of FIG. 2A or the non-volatile memory 230 of FIG. 2B. The display drivers can be similar to the display driver 108 of FIG. 1C. The control electronics can be similar to the control electronics 106 of FIG. 1C.

Each non-volatile memory can be coupled to each LED on the upper side 501 through the conductive electrodes 510 to form an active-matrix LED pixel. Each non-volatile memory can be coupled to a column data driver via at least one bit line 512 and to a row scanning driver via at least one word line 514. The bit lines 512 and the word lines 514 are formed on the bottom side 503. The display drivers (column data drivers and the scanning drivers) are coupled to the control electronics via connections, e.g., the connections 113 of FIG. 1C. Components in the control electronics can be connected to each other, e.g., via internal bus.

Figure 5E:
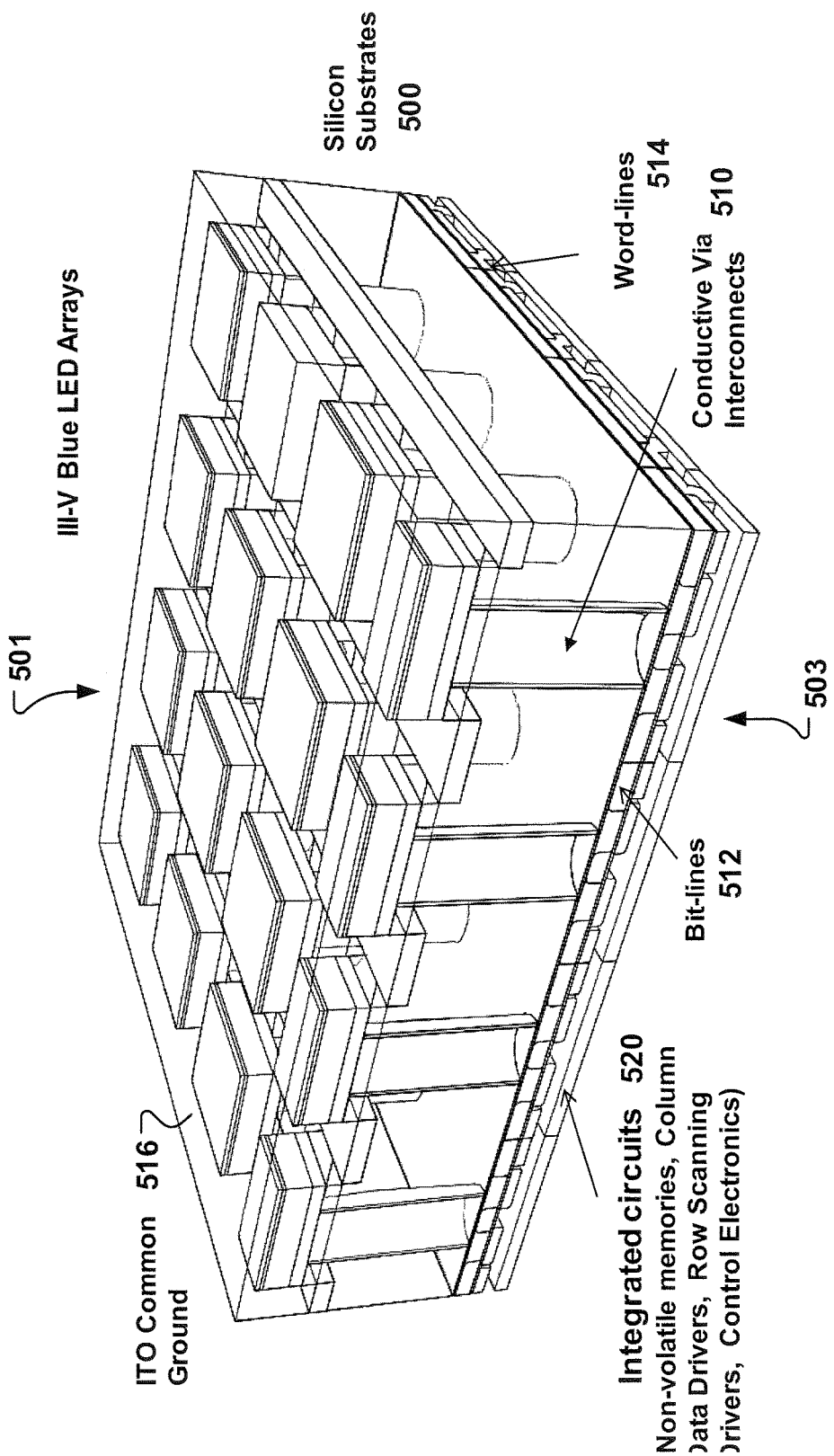

Sixth, the silicon substrate 500 is flipped back from the lower side 503 to the upper side 501. As shown in FIG. 5E, a conductive layer, e.g., an ITO layer, can be deposited on top of the LEDs arrays to form electrical common ground.

Figure 5F:
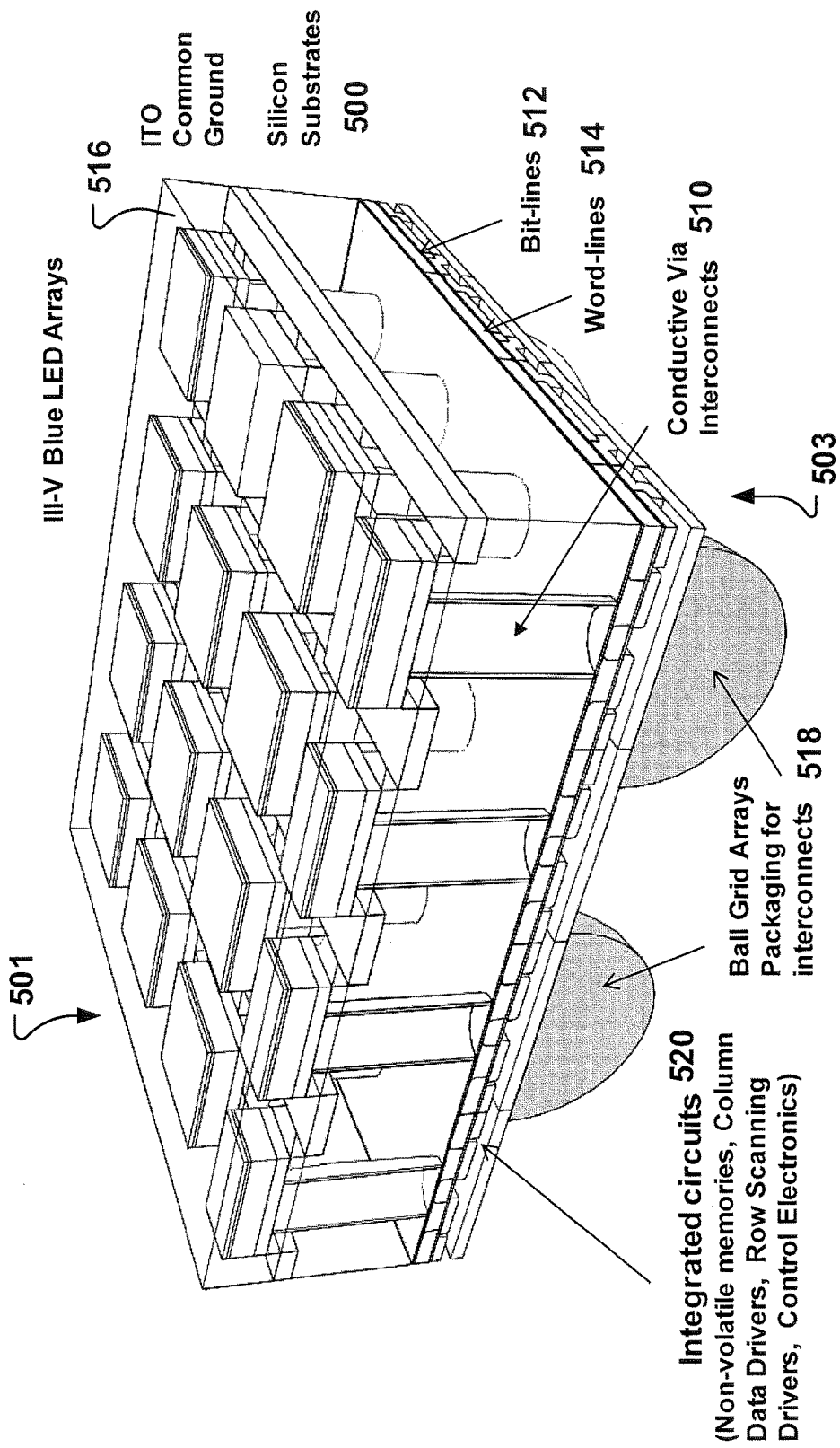

Seventh, as shown in FIG. 5F, a ball grid array (BGA) package 518 is formed on the lower side 503, e.g., on a surface of the ICs 520. The BGA package 518 can be similar to the BGA package 1000 of FIGS. 1A-1B. Each BGA package 1000 can include a number of BGA solider balls on the ICs, e.g., no less than 4. A larger number of BGA solider balls with corresponding grid lines enables a higher connection resolution for the ICs 520. The BGA package 518 function as conductive interconnects to connect the ICs 520 to other displays or to a control unit of a larger display, e.g., the control unit 14 of FIG. 1B.

Figure 5G:
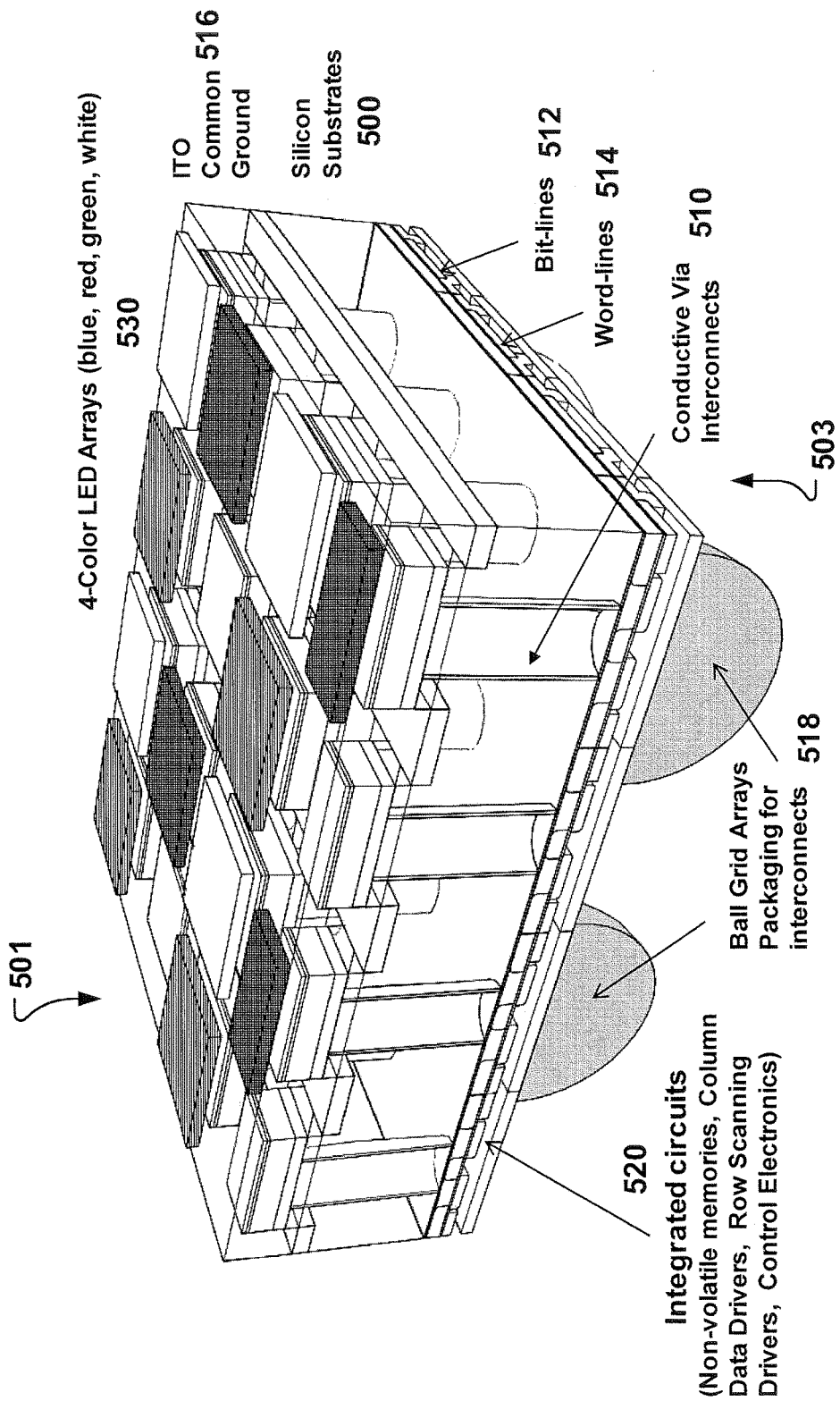

Eighth, the silicon substrate 500 is flipped back from the lower side 503 to the upper side 501. As shown in FIG. 5G, secondary color LEDs, e.g., red color LEDs, green color LEDs, and white color LEDs, can be formed based on the previously-formed LEDs 508, e.g., blue color LED 508. The different color LEDs can form multi-color LED pixels 530. A white color LED can be included in each pixel to increase a sharpness of displayed images/pictures.

Secondary color LEDs can be formed on surface of the LEDs 508 by using different color phosphor materials or different size quantum-dot (QD) materials. For example, potassium fluorosilicate (PFS)/$K_2SiF_6$ (KSF) phosphors can be used to make red color LEDs with an emission wavelength of about 630 nm. Aluminate, or silicate, or green garnet (GNYAG) phosphors can be used to make green color LEDs with an emission wavelength of about 530 nm. Cerium(III)-doped YAG phosphors can be used to make white color LEDs.

In some implementations, an array of the multi-color LED pixels 530 is formed by the following processes: 1) patterning using photoresist for specific color LEDs, e.g., red LEDs; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green phosphor films or green QD thin-films; and 5) repeating the same processes above to form another specific color LED arrays, e.g., white LED arrays, but with another specific color phosphor films or another specific size QD thin-films, e.g., white phosphor films or white QD thin-films.

In the example fabrication process, blue LEDs 508 are first formed using Group III-V compound layers, e.g., In(0.3)Ga(0.7)N layer, as quantum well layers. Then other color LEDs, e.g., red LEDs, green LEDs, or white LEDs, are formed by depositing corresponding color phosphor films or corresponding size QD thin-films on the blue LEDs.

In some other implementations, red LEDs are first formed using Group III-V compound layers, e.g., InN layer, as quantum well layers. Then other color LEDs, e.g., blue LEDs, green LEDs, or white LEDs, are formed by depositing corresponding color phosphor films or QD thin-films on the red LEDs. In some other implementations, green LEDs are first formed using Group III-V compound layers, e.g., In(0.5)Ga(0.5)N layer, as quantum well layers. Then other color LEDs, e.g., blue LEDs, red LEDs, or white LEDs, are formed by depositing corresponding color phosphor films or QD thin-films on the red LEDs.

In some implementations, instead of using color phosphor films or QD thin-films on one primary color LEDs to generate the other two or more secondary color LEDs, all the color LEDs, e.g., blue LEDs, red LEDs, and green LEDs, can be formed using Group III-V compound layers as quantum well layers. For example, after the second step where the silicon substrate 500 is patterned, blue LED arrays can be first selectively formed on a first plurality of sub-substrates by using Group III-V compound layers, e.g., In(0.3)Ga(0.7)N layer, as quantum well layers; then red LED arrays can be selectively formed on a second plurality of sub-substrates by using Group III-V compound layers, e.g., InN layer, as quantum well layers; and then green LED arrays can be selectively formed on a third plurality of sub-substrate by using Group III-V compound layers, e.g., In(0.5)Ga(0.5)N layer, as quantum well layers. The formation of the three color LED arrays can be arranged in any desired order. Each LED pixel can include a blue LED, a red LED, and a green LED. The number of the first plurality of sub-substrates is identical to the number of the second plurality of sub-substrates and to the number of the third plurality of sub-substrates.

Figure 5H:
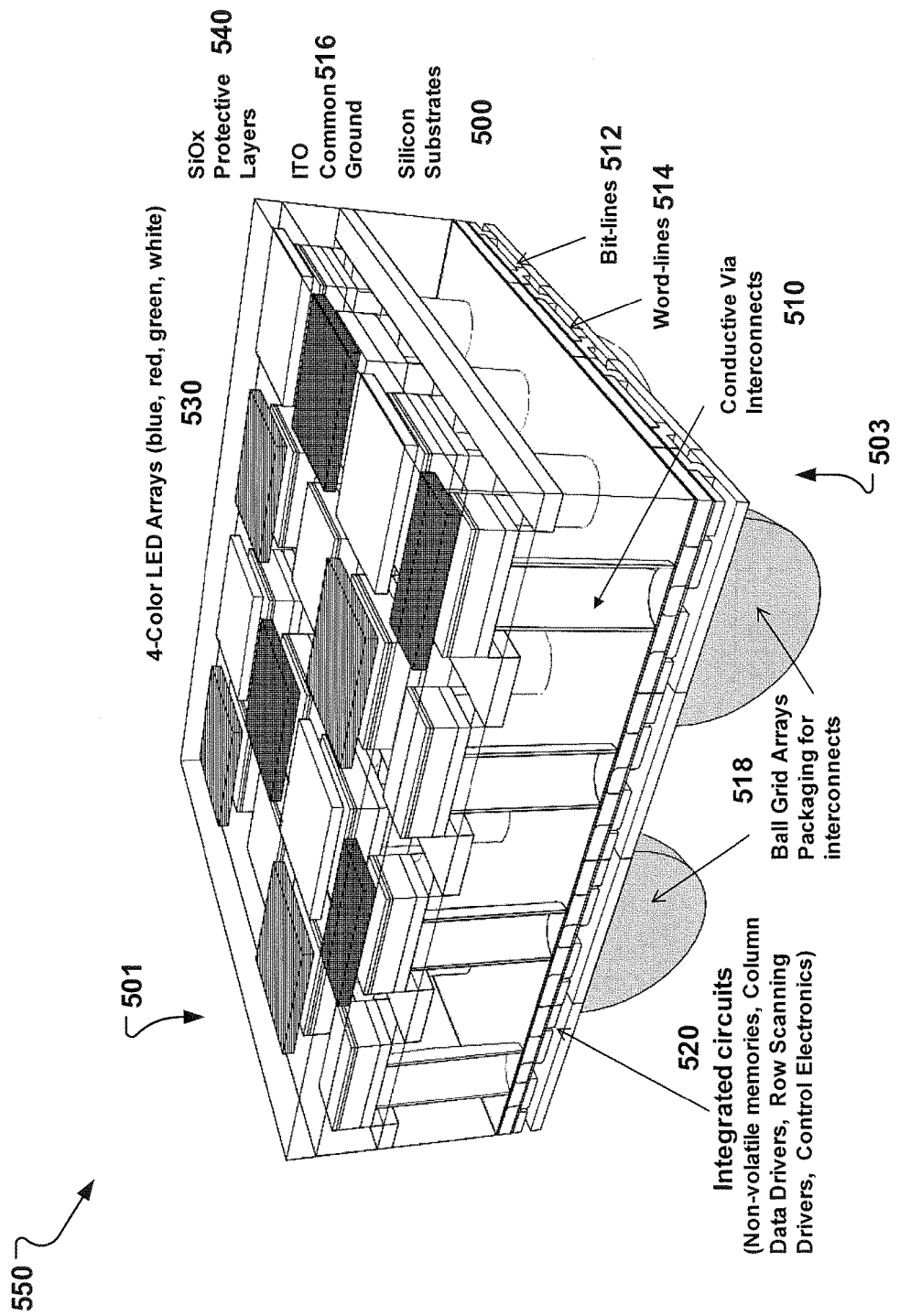

Ninth, as shown in FIG. 5H, a protective layer 540 can be further formed on surfaces of the array of LEDs. The protective layer can be made of transparent material, e.g., glass SiOx or plastic. In some implementations, the protective layer can be coated with a conductive material, e.g., indium tin oxide (ITO). The protective layer is coupled to electrodes of individual LED pixels under the protective layer and forms a touch screen position sensor. The touch screen position sensor can use capacitive sensing. As noted above, a touch on the protective layer can be converted to a capacitance change which is detected by a touch screen detector/analyzer in the control electronics of the ICs 520 through conductive connections.

Figure 5I:
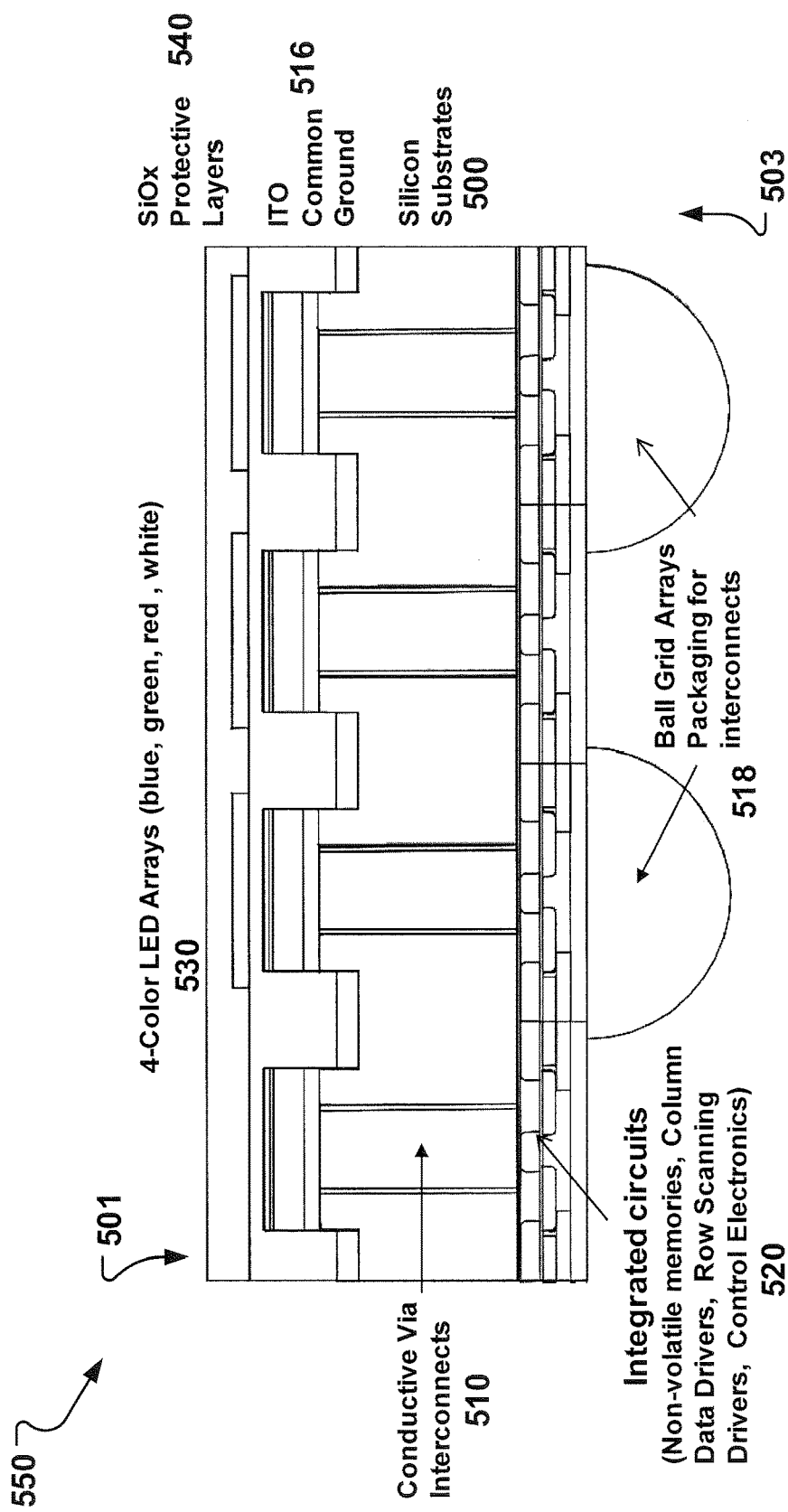

FIG. 5H shows an integrated LED array display 550 formed by the fabrication process as described above. FIG. 5I shows a cross-sectional view of the integrated LED array display 550. The multi-color LEDs 530 on the upper side 501 are coupled to the ICs 520, e.g., the non-volatile memories, on the lower side 503 through conductive electrodes 510. As the non-volatile memories are on the lower side 503, the number of LEDs 530 on the upper side 501 can be maximized. Also the LEDs 530 can be formed on edges of the upper side 501, such that when multiple displays 550 are arranged together, a distance between adjacent LEDs on the edges of the displays can be minimized, e.g., less than 1 mm. Thus, the formed larger display by the multiple displays can be borderless, and the aspect ratio of the integrated LED display 550 can be maximized, e.g., to 90% or more. Note that an aspect ratio can be defined by an illumination area of LED pixels over a physical area of the LED pixels for a display.

Referring back to FIGS. 6A-6M, perspective views at different steps of forming an integrated active-matrix LED micro-display 670 on a silicon (111) substrate 600 are shown. Compared to the integrated LED display 550, the LED display 670 have LEDs and non-volatile memories on the same side of the silicon (111) substrate to form active-matrix LED pixels, which may reduce the number of conductive electrodes penetrating through the silicon substrate, although an aspect ratio of the LED display 670 may be smaller than the LED display 550. For example, the aspect ratio of the LED display 670 can be about 70% or more.

The silicon (111) substrate 600 has an upper side 601 including a top surface 602 and a lower side 603 including a bottom surface 604. The top surface 602 and the bottom surface 604 can be parallel to a (111) crystalline plane. The integrated LED display system 670 can be formed by the following steps.

First, the silicon (111) substrate 600 is prepared. The substrate 600 can be pre-treated, e.g., by cleaning the surfaces 602 and 604. In some cases, wet chemical treatment, e.g., an RCA clean procedure based on solutions, can be used to remove any organic or inorganic contaminations present on the surfaces 602 and 604. The solutions can include hydrogen peroxide, trichloroethylene, acetone, or methanol.

Figure 6A:
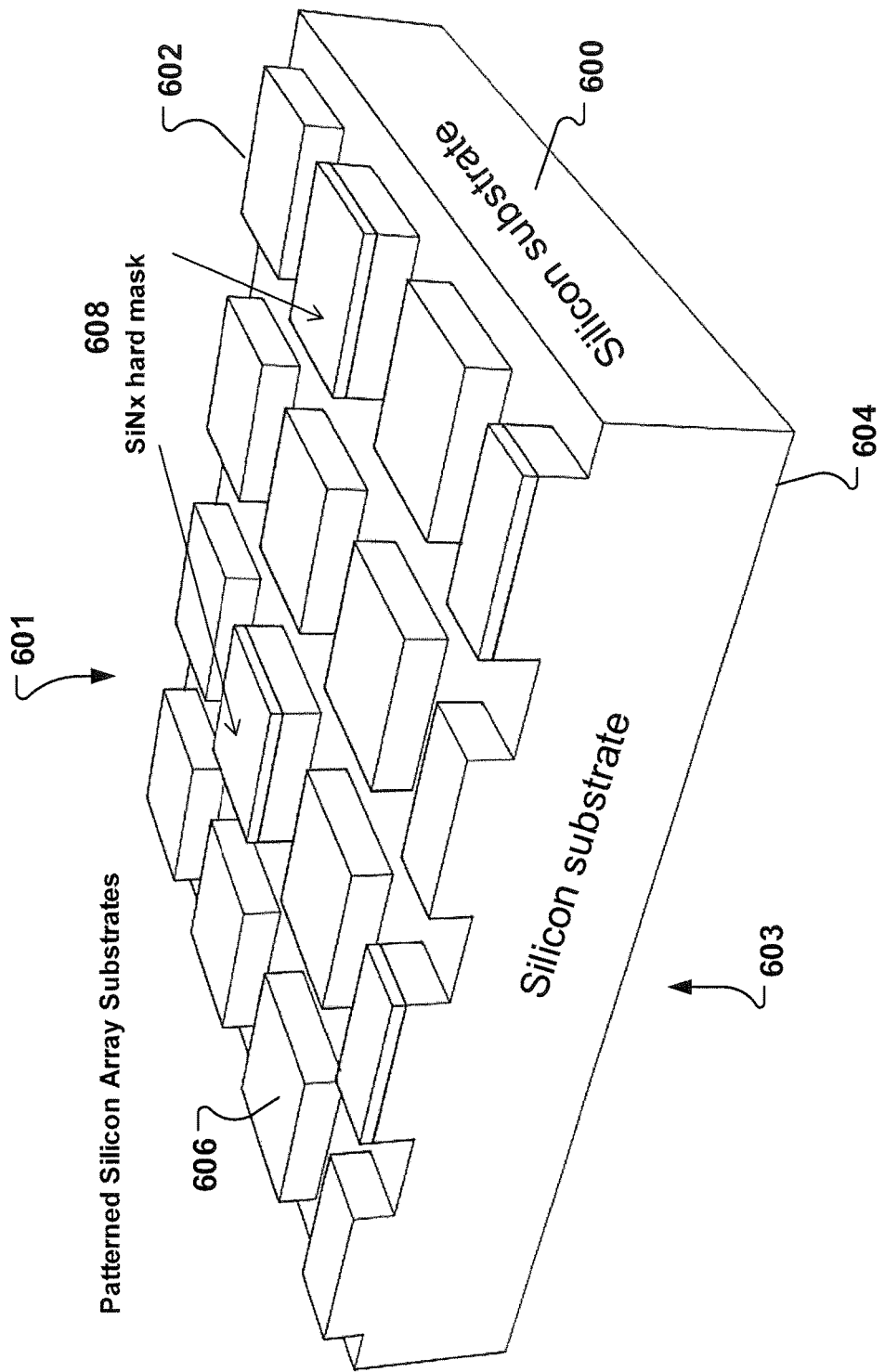
FIGS. 6A-6M show perspective views at different steps of forming another integrated active-matrix LED micro-display with LEDs and non-volatile memories on the same side of a silicon substrate.

Second, as shown in FIG. 6A, the silicon substrate 600 is patterned. In some implementations, a hard mask layer, e.g., SiNx such as $Si_3N_4$, is used as a protective layer for patterning. The patterning of the silicon substrate 600 can include: 1) patterning a hard mask layer on the silicon substrate 600. This patterning can be formed by putting a mold with the desired pattern over the silicon substrate 600 and then depositing the hard mask layer. The hard mask layer can be deposited on the silicon substrate by MOCVD, MBE, ALD, PVD, CVD, or any other deposition methods in a vacuum chamber; 2) dry etching silicon of the silicon substrate, e.g., using reactive ion etching (ME) or plasma etching; 3) selective removing the remaining hard mask layer to expose patterned silicon substrates 606. The exposed patterned silicon substrates 606 are used for forming LEDs. A plurality of patterned silicon substrates 608 is kept with the remaining hard mask layer to be used for forming non-volatile memories for the LEDs formed on the patterned silicon substrates 606.

In some implementations, photoresist is used as a protective material for patterning. The patterning of the silicon substrate 600 can include: 1) patterning a photoresist layer on the silicon substrate 600, e.g., by photolithography; 2) etching silicon with plasma. In some cases, edges (e.g., 507 and 508) of the silicon substrate for forming data drivers and scanning drivers can also be protected from etching; 3) removing the remaining photoresist layer from the silicon substrate to expose patterned silicon substrates 606 that are used for forming LEDs. A plurality of the patterned silicon substrates 606 is selected to be coated with a hard mask layer, e.g., SiNx, to get patterned silicon substrates 608, which is used for forming non-volatile memories for the LEDs.

Figure 6B:
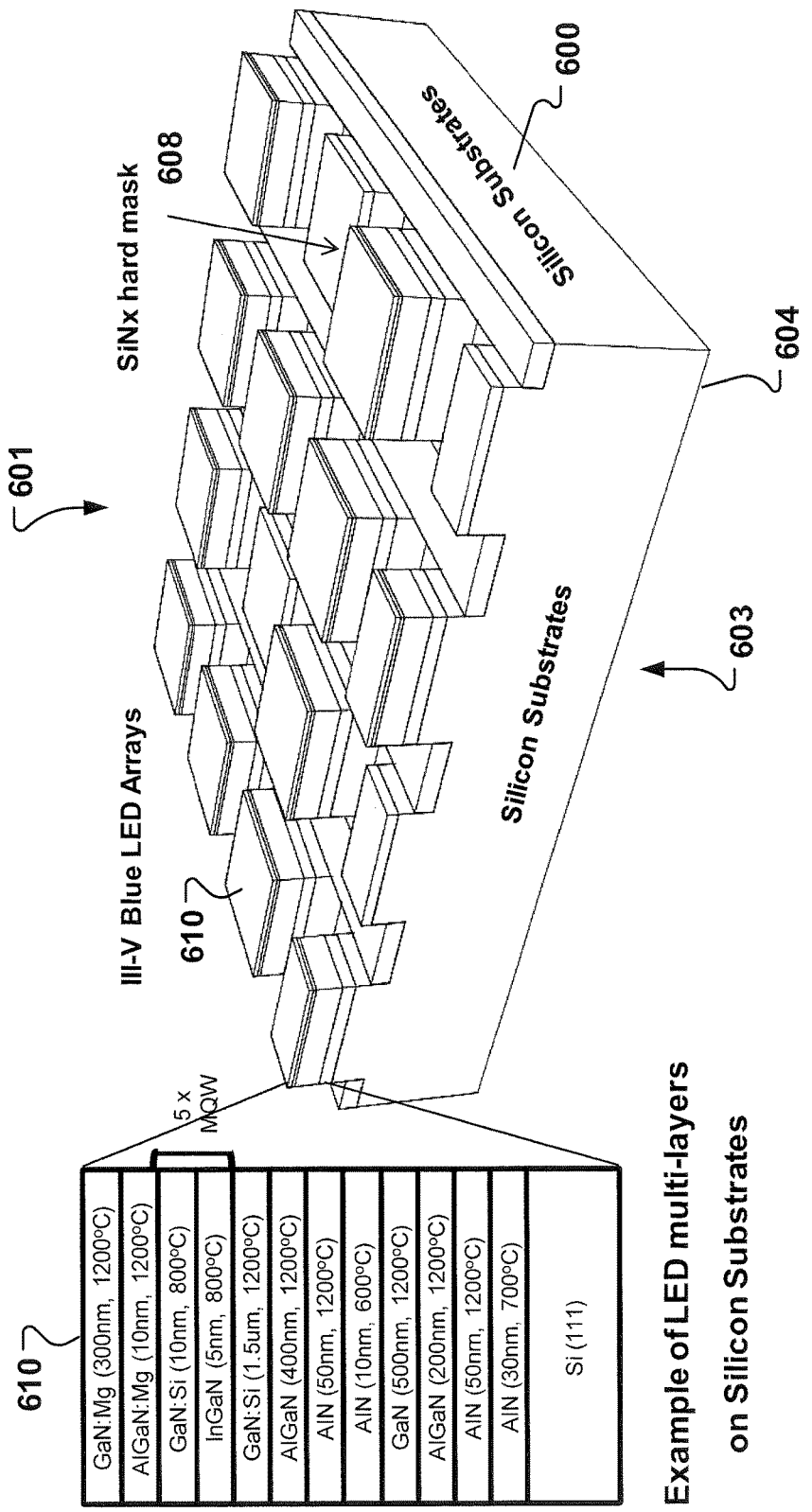

Third, as shown in FIG. 6B, an array of LEDs 610 is formed on the upper side 601 of the patterned silicon substrates 606. The LEDs 610 can be similar to the LEDs 508 of FIG. 5B. The LEDs 610 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer, for emitting light with a specified wavelength. The quantum-well layer can include a uniform layer or a plurality of quantum wells. For example, a quantum-well layer can include a substantially uniform layer made of InN, GaN, InGaN, AlGaN, InAlN, or AlInGaN. A quantum-well layer can also include a multi-layer structure defining one or more quantum wells. A quantum well can for example be formed by an InGaN, an AlGaN, an InAlN, or an InCaAlN layer sandwiched in between two GaN layers. A quantum well can also be formed by an InCaM layer sandwiched in between GaN or AlGaN layers. The quantum-well layer can include one or a stack of such layered structure each defining a quantum well as described above.

As an example illustrated in FIG. 6B, III-V blue light LEDs 610 are formed on the silicon (111) surfaces by using pairs of InGaN and GaN:Si as the quantum well (MQW) layer. The LEDs 610 can include one or more buffer layers deposited on the silicon (111) surface, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

The LEDs 610 are selectively formed on the number of etched substrates 606. The other patterned silicon substrates 608 are protected, by the hard mask layer, from depositing the LED multiple layers and reserved for forming non-volatile memories for the LEDs 610. Each patterned silicon substrate 608 can be configured adjacent to three or four substrates 606. The substrates 606 and 608 can be configured for forming LED pixels each with a minimized size or a specified size. Some other areas for forming conductive connections, e.g., bit lines, word lines, and/or interconnects, can be also protected from depositing the LED multiple layers.

Figure 6C:
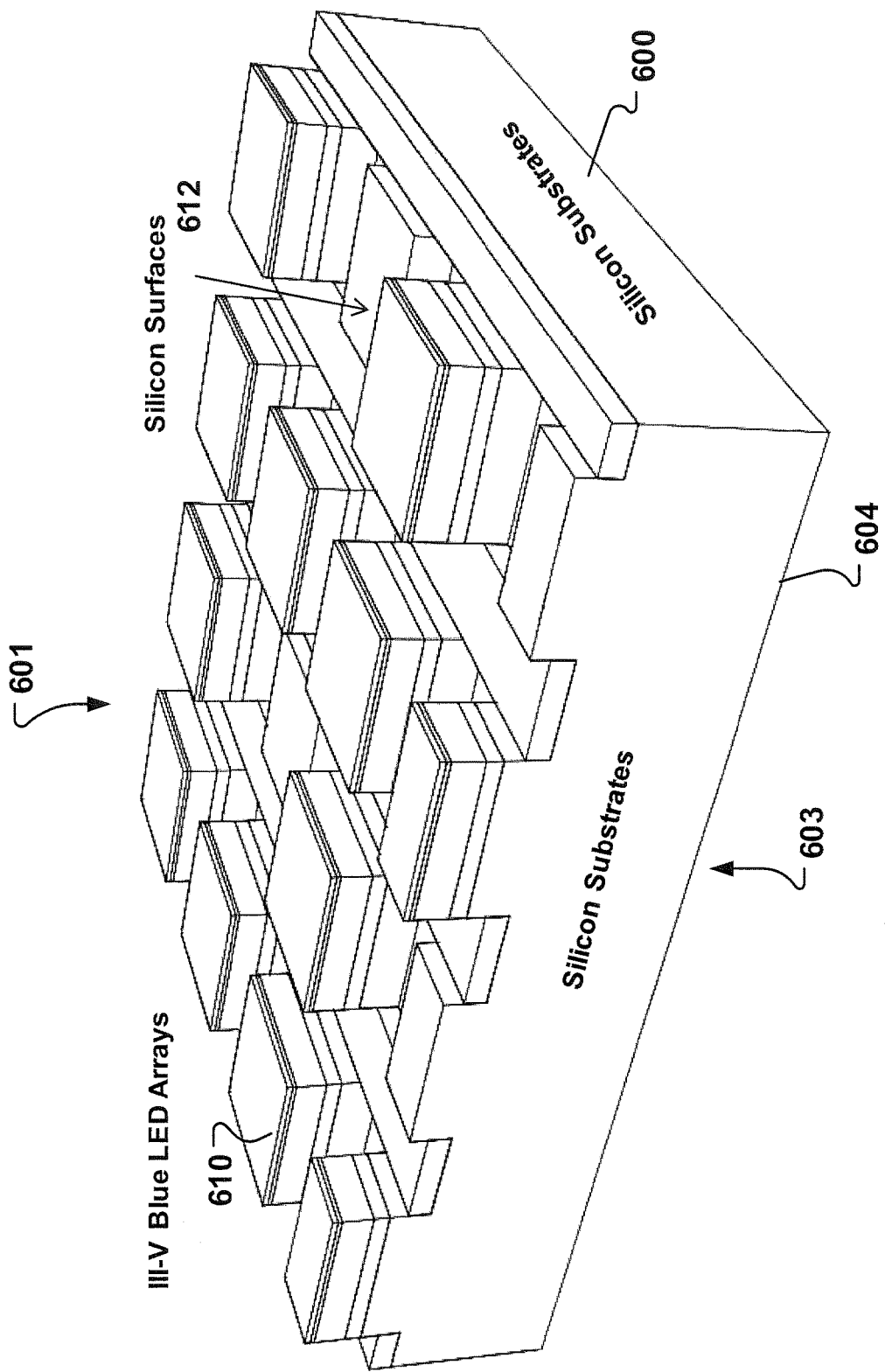

Fourth, the areas for forming non-volatile memories, bit lines, word lines, and/or interconnects can be selectively opened, e.g., by etching, and/or cleaned to prepare for forming these components. As illustrated in FIG. 6C, the areas including the patterned silicon substrates 608 are selectively etched and cleaned, such that the previously remained hard mask layer SiNx can also be removed to expose silicon surfaces. The cleaned patterned silicon substrates become patterned silicon substrates 612 with exposed silicon surfaces.

Figure 6D:
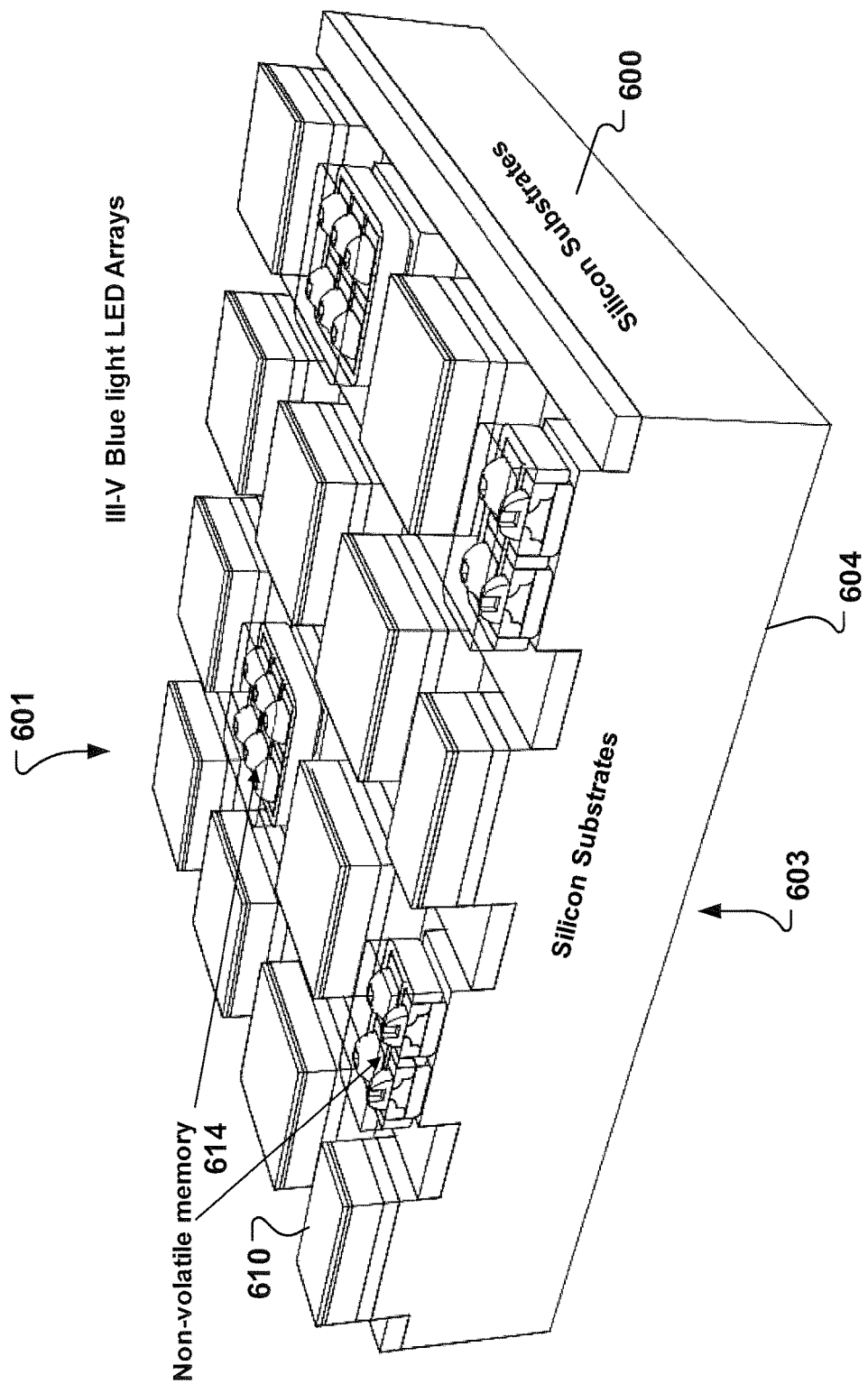

Fifth, as illustrated in FIG. 6D, non-volatile memories 614 are formed on the cleaned patterned silicon substrates 612 on the upper side 601 of the silicon substrate 600. Each non-volatile memory can be coupled to a respective LED or multiple LEDs to form an active-matrix LED pixel. In some examples, for three LEDs in one pixel, there may have three respective non-volatile memories.

Figure 6E:
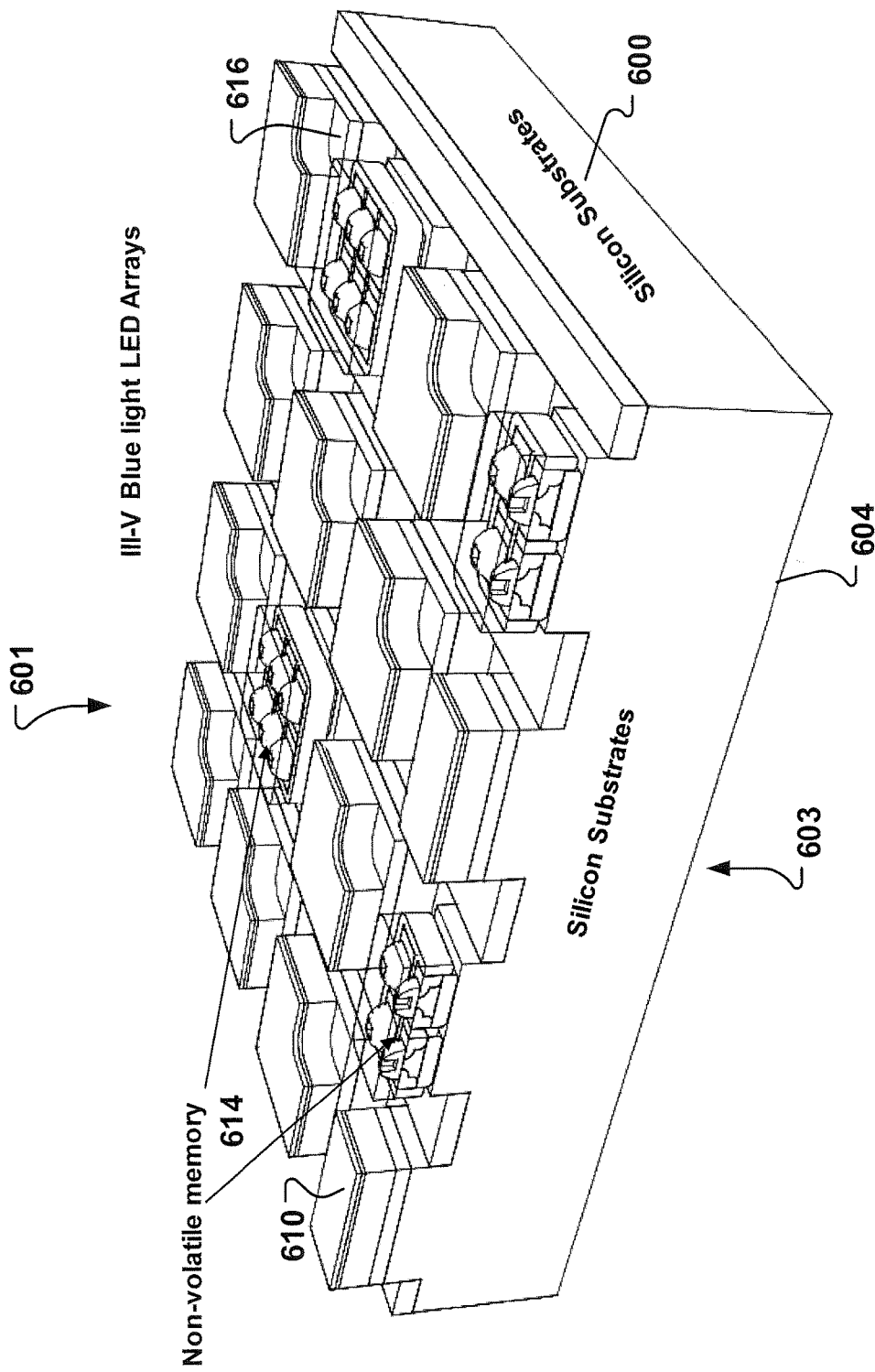

Sixth, as illustrated in FIG. 6E, the LEDs 610 are selectively etched to open for forming Ohmic contacts 616 of the LEDs 610. For example, the LEDs 610 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the Ohmic contacts 616. A top layer of the LEDs 610 can be an n-doped Group III-V compound layer, and a p-type electrode (anode), e.g., a passivation ITO layer, can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 616; the top layer of the LEDs can be p-doped Group III-V compound layer, e.g., p-GaN, and a n-type electrode (cathode) can be formed on the p-doped Group III-V compound layer.

Figure 6F:
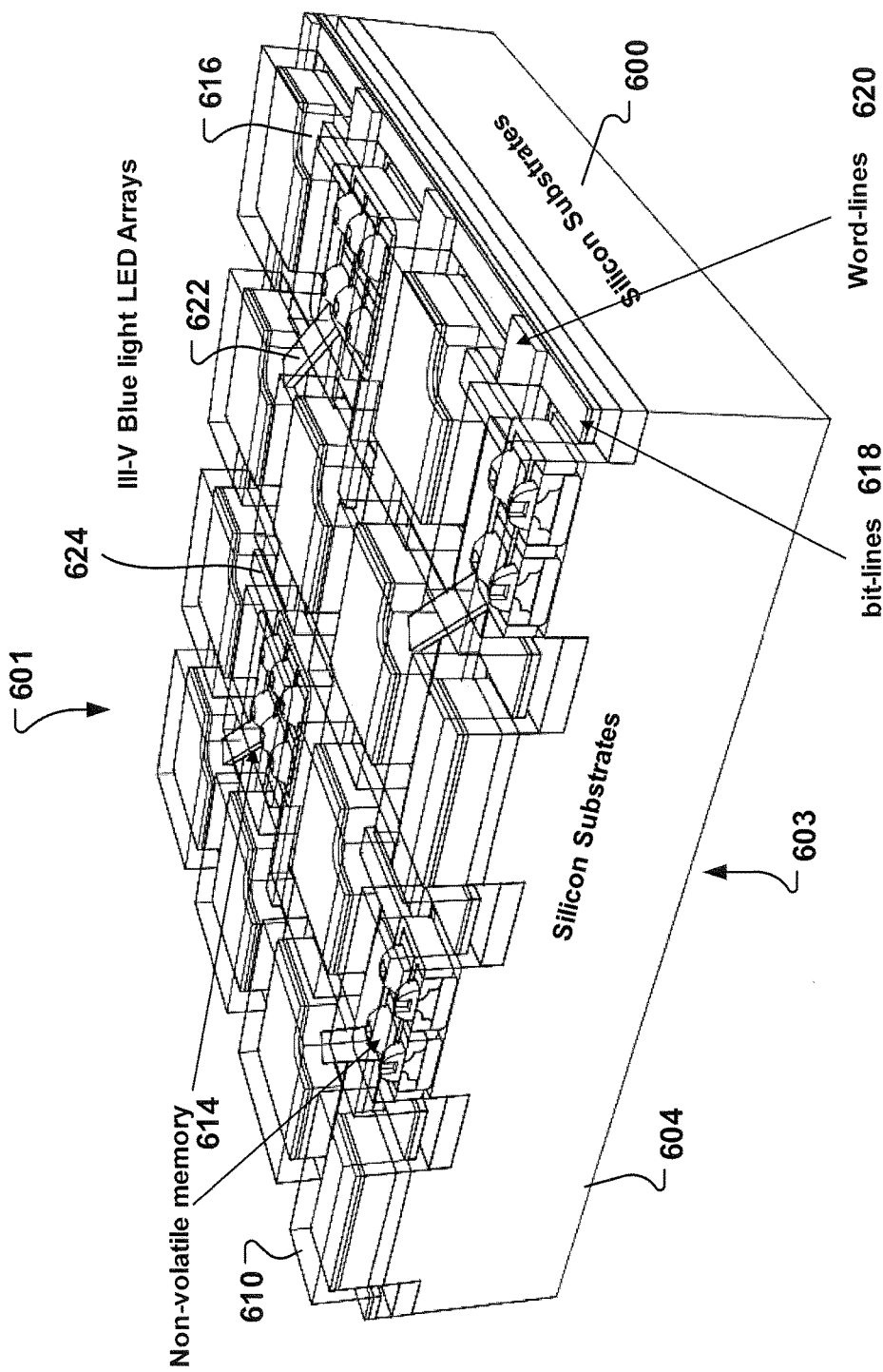

Seventh, as illustrated in FIG. 6F, bit lines 618 and word lines 620 are formed, e.g., in multiple rows and columns, respectively. The bit lines 618 and word lines 620 are conductively connected to the non-volatile memories 614. Particularly, each non-volatile memory 614 is connected to at least one respective column bit line 618 and to at least one respective row word line 620.

Interconnects 622 between the Ohmic contacts 616 of the LEDs 610 and the non-volatile memories 614 and interconnects 624 between the non-volatile memories 614 and the bit lines 618 and the word lines 620 are also formed. In such a way, each LED 610 is conductively coupled to a non-volatile memory 614 that is further coupled to at least one corresponding bit line 618 and to at least one corresponding word line 620.

Figure 6G:
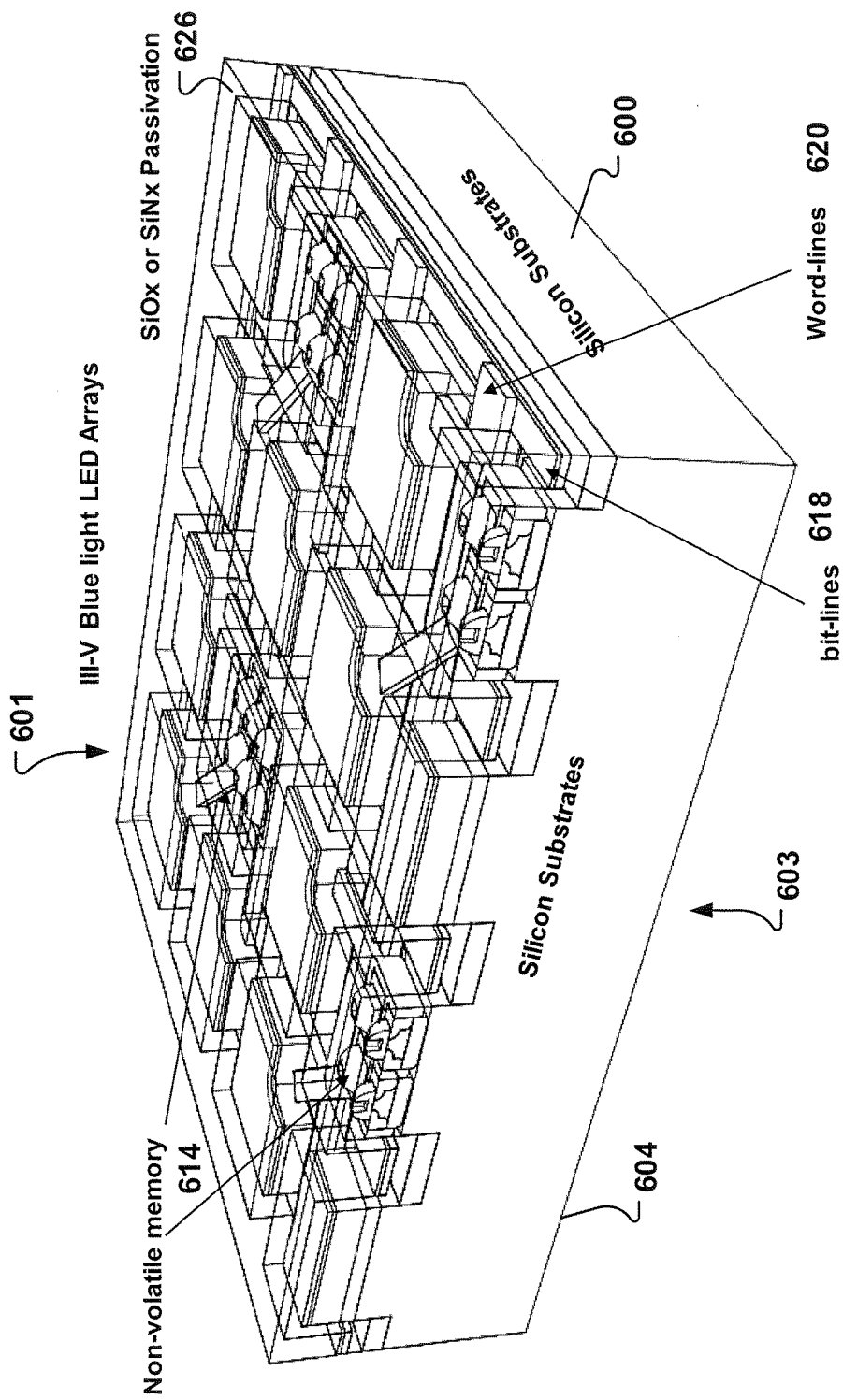

Eighth, as illustrated in FIG. 6G, a passivation layer 626, e.g., a transparent SiOx or SiNx layer, is formed to cover surfaces of the silicon substrate, including the LED pixel arrays. The passivation layer 626 can be deposited on the surfaces by MOCVD, ALD, PVD, CVD, or any suitable deposition methods.

Figure 6H:
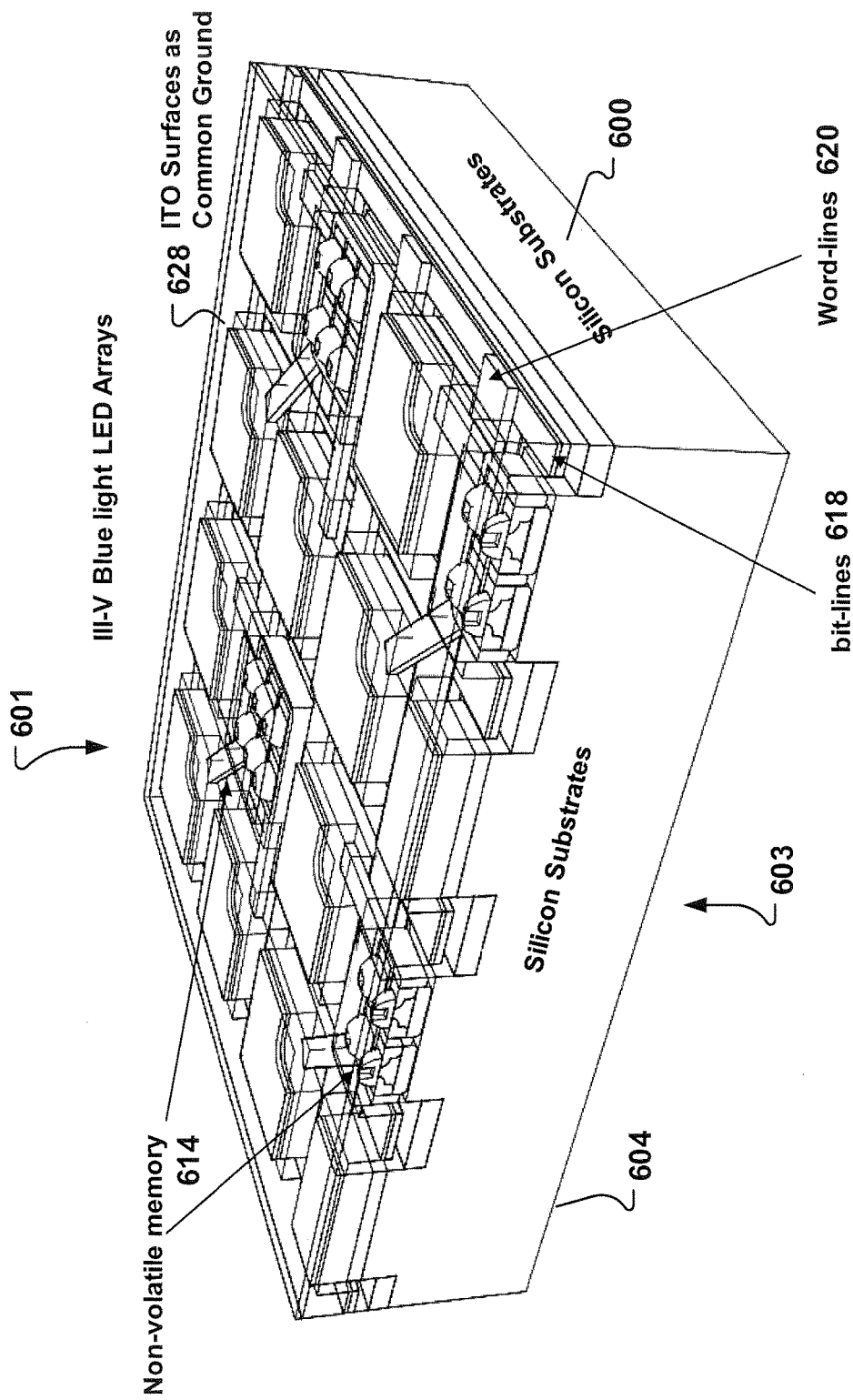

Ninth, the upper side 601 of the silicon substrate 600 is polished, e.g., by chemical-mechanical planarization (CMP) polish, to expose doped surfaces of all the LEDs 610, e.g., to the top layer GaN:Mg. Then, as shown in FIG. 6H, a conductive layer 628, e.g., an ITO layer, is deposited on top of the doped surfaces of the LEDs 610 to form electrical common ground.

Figure 6I:
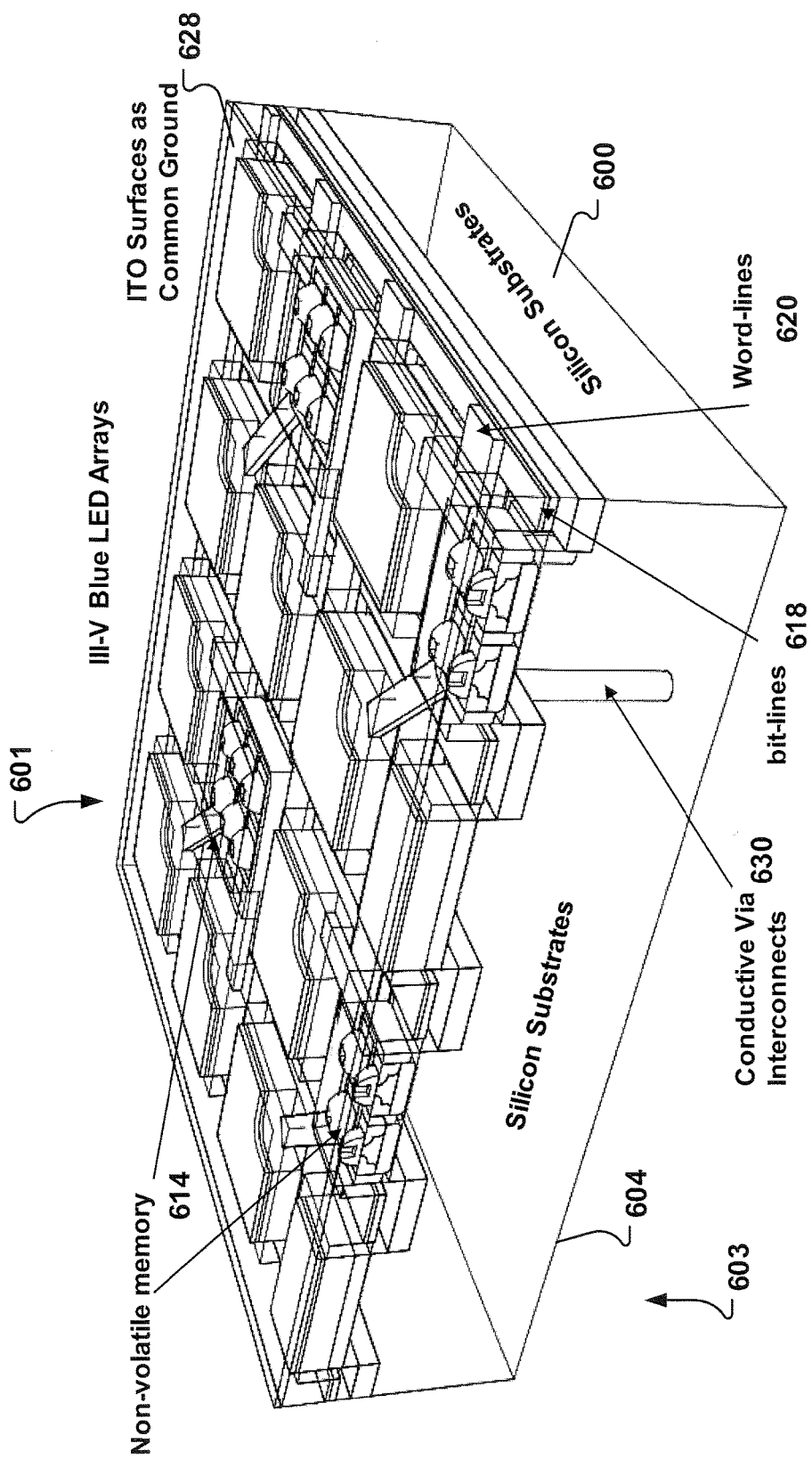

All the above steps are performed on the upper side 601 of the silicon substrate 600. In the following tenth step, the silicon substrate 600 is flipped from the upper side 601 to the lower side 603, and a plurality of deep trenches (or throughholes) are formed from the lower side 603, through the substrate 600, and towards the upper side 601. The deep trenches can be formed by deep etching, e.g., deep RIE or plasma etch. Then conductive electrodes are formed inside the deep trenches to form interconnects 630, as shown in FIG. 6I. In some cases, inner surfaces of the deep trenches are insulated and then metals are filled inside the deep trenches to form the conductive electrodes. The interconnects 630 are configured to connect the column bit lines 618 and the row word lines 620 to data drivers and scanning drivers to be formed on the lower side 603. As each column bit line 618 is coupled to a column of non-volatile memories 614 and each row word line 620 is coupled to a row of non-volatile memories 614, the number of interconnects 630 can be smaller than the total number of non-volatile memories 614.

Figure 6J:
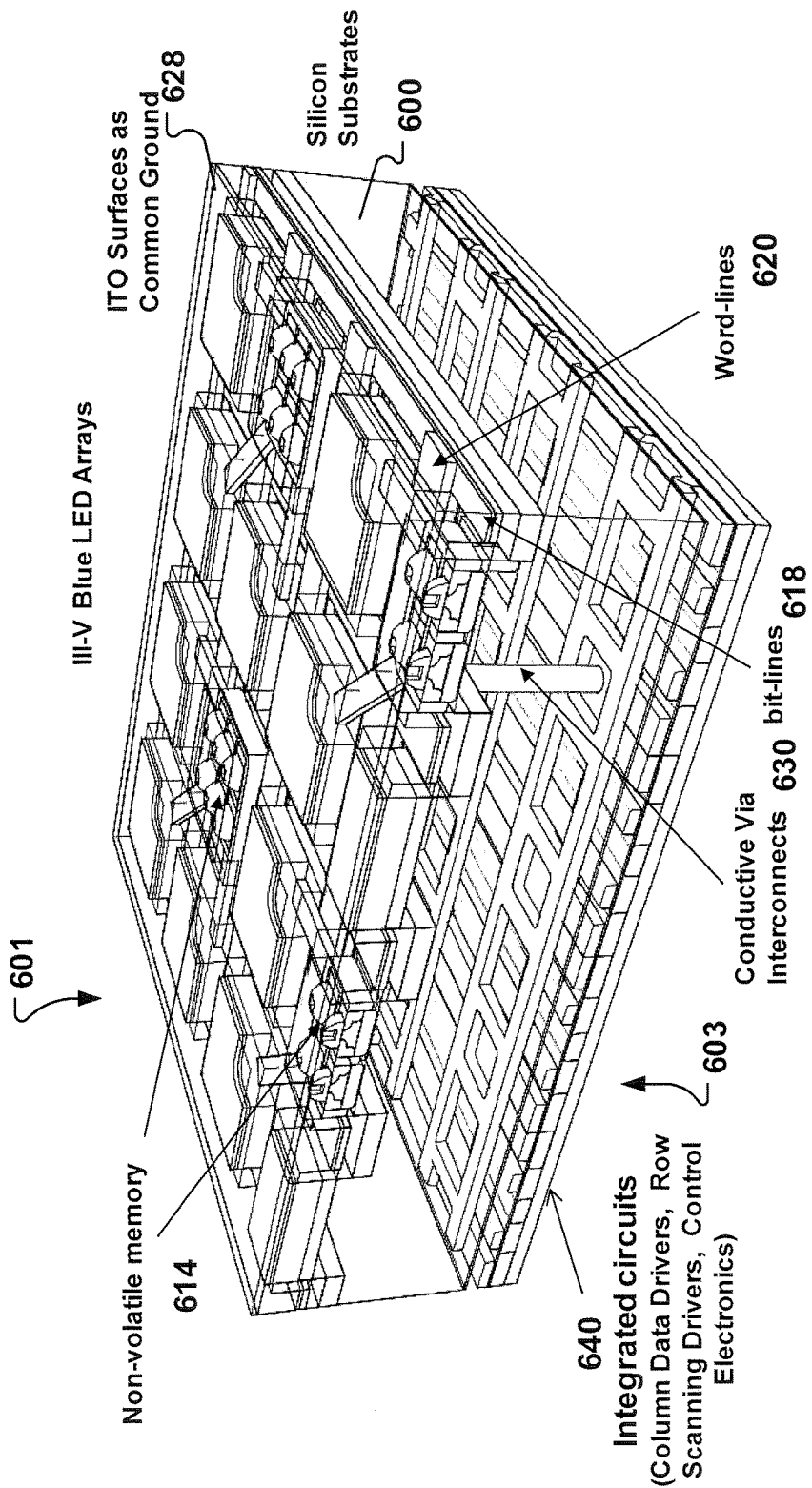

Eleventh, as illustrated in FIG. 6J, integrated circuits 640 is formed on the bottom surface 604 of the lower side 603 of the silicon substrate 600. The integrated circuits 640 can include display drivers (column data drivers and row scanning drivers), and control electronics (e.g., CPU/MPU, memory, A/D converters, D/A converters, amplifiers, and other ICs). The display drivers can be similar to the display driver 108 of FIG. 1C. The control electronics can be similar to the control electronics 106 of FIG. 1C. Components in the integrated circuits 640 can be connected to each other via conductive connections, e.g., via an internal bus. The control electronics is coupled to the data drivers and the scanning drivers through the conductive connections. The data drivers and the scanning drivers on the lower side 603 are coupled to the bit lines and the word lines on the upper side 601 through conductive interconnects 630 that penetrate through the silicon substrate 600, such that each non-volatile memory 614 is coupled to a respective data driver through at least one bit line and to a respective scanning driver through at least one word line.

Figure 6K:
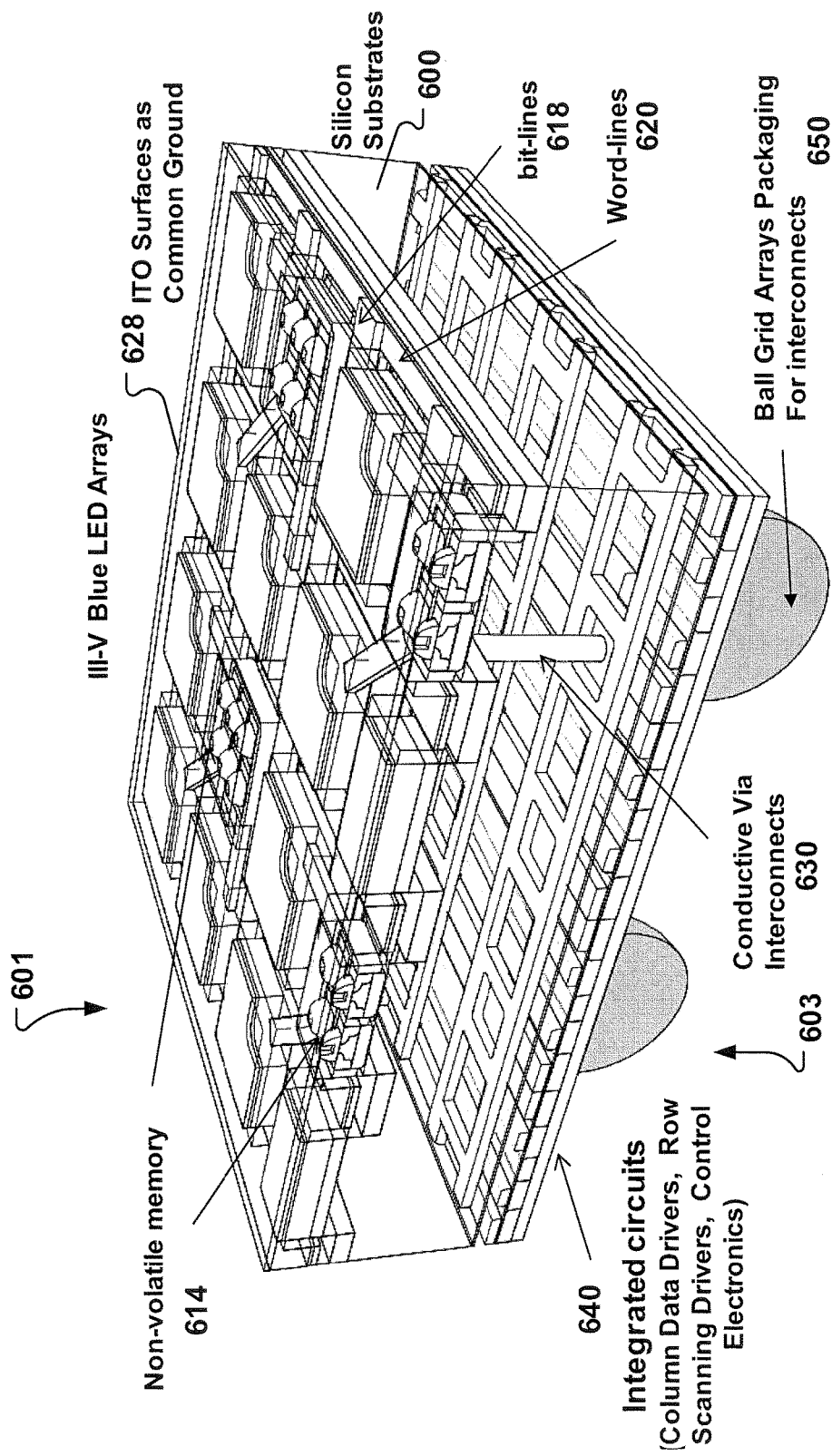

Twelfth, as shown in FIG. 6K, a ball grid array (BGA) package 650 is formed on the lower side 503, e.g., on a surface of the ICs 640. The BGA package 650 can be similar to the BGA package 1000 of FIGS. 1A-1B. Each BGA package 650 can include a number of BGA solider balls on the ICs. A larger number of BGA solider balls with corresponding grid lines enables a higher connection resolution for the ICs 640. The BGA package 650 function as conductive interconnects to connect the ICs 640 to other displays or to a control unit of a larger display, e.g., the control unit 14 of FIG. 1B.

Figure 6L:
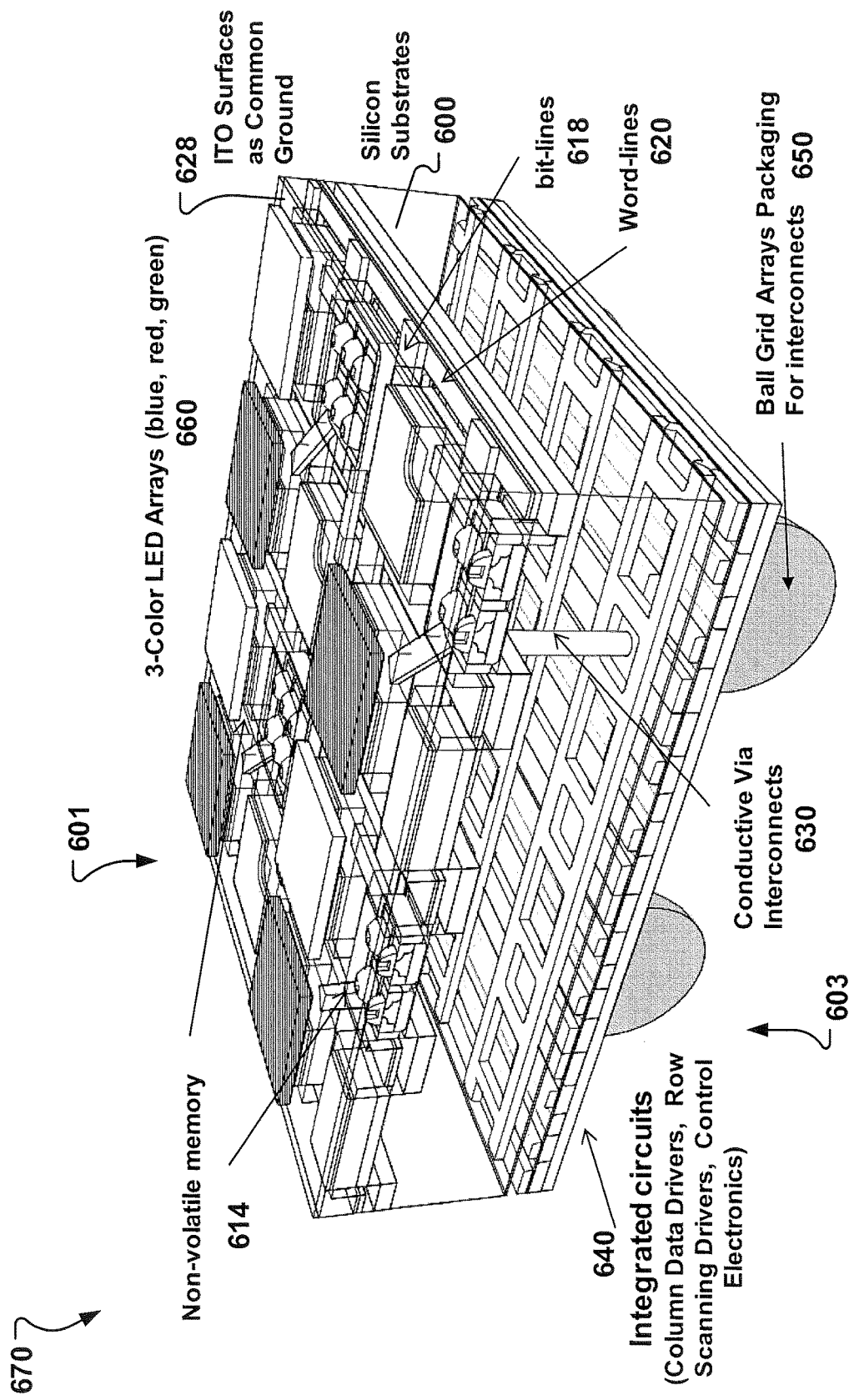

Thirteenth, as shown in FIG. 6L, the silicon substrate 600 is flipped back from the lower side 603 to the upper side 601. Secondary color LEDs, e.g., red color LEDs and green color LEDs, can be formed based on the previously-formed LEDs 610, e.g., blue color LED 610. The different color LEDs can form a multi-color LED pixel 660. Secondary color LEDs can be formed on surface of the LEDs 610 by using different color phosphor materials or different size quantum-dot (QD) materials. For example, potassium fluorosilicate (PFS)/ $K_2SiF_6$ (KSF) phosphors can be used to make red color LEDs with an emission wavelength of about 630 nm. Aluminate, or silicate, or green garnet (GNYAG) phosphors can be used to make green color LEDs with an emission wavelength of about 530 nm. Cerium(III)-doped YAG phosphors can be used to make white color LEDs.

In some implementations, an array of the multi-color LED pixels 660 is formed by the following processes: 1) patterning using photoresist for specific color LEDs, e.g., red LEDs; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green phosphor films or green QD thin-films. In a particular example, a white LED can be also formed to be included in each pixel to increase a sharpness of displayed images/pictures.

Figure 6M:
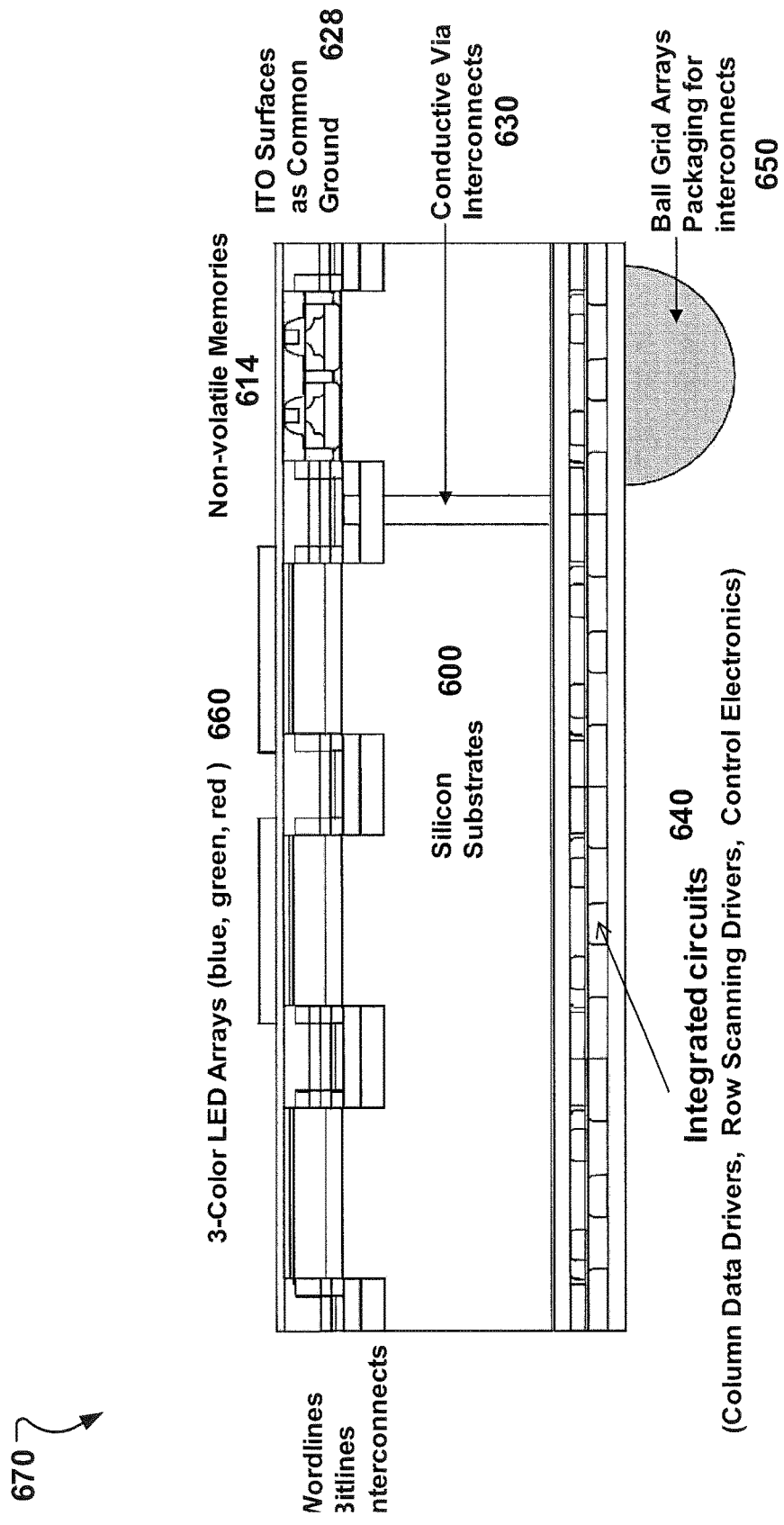

FIG. 6L shows the formed integrated active-matrix LED pixel array display 670 formed by the fabrication process as described above. FIG. 6M shows a cross-sectional view of the integrated LED array display 670.

After forming the multi-color LED pixel display 670, a protective layer can be further formed on surfaces of the array of LED pixels. The protective layer can be made of transparent material, e.g., glass or plastic, coated with a conductive material, e.g., indium tin oxide (ITO). The protective layer is coupled to non-volatile memories 614 in the LED pixels 660 under the protective layer and forms, with the non-volatile memories 614, a touch screen position sensor. The touch screen position sensor can use capacitive sensing. As noted above, a touch on the protective layer can be converted to a capacitance change which is detected by a touch screen detector/analyzer in the integrated circuits 640 through conductive connections between the non-volatile memories 614 and the data drivers/scanning drivers, and interconnects 630.

Example Assembling Process

As described above in FIGS. 4A to 6M, sub-displays, e.g., the integrated LED display 550 of FIGS. 5H and 5I or the integrated LED display 670 of FIGS. 6L and 6M, can be formed on silicon wafers. A number of sub-displays can be formed on a single silicon wafer, and then individual sub-displays can be obtained, e.g., by cutting, from the silicon wafer, and assembled on a display substrate, e.g., the display substrate 12 of FIG. 1A, to form a larger display, e.g., the display 10 of FIGS. 1A-1B. In some implementations, individual sub-displays are taken from the silicon wafer one by one to be assembled on a display substrate. In some implementations, two or more sub-displays are taken together from the silicon wafer to be assembled on a display substrate. In a particular example, all the sub-displays formed on the silicon wafer are taken from the silicon wafer to be assembled on a display substrate. The number of the sub-displays formed on a wafer can depend on the shapes of the sub-displays. Each sub-display can have a shape, e.g., square, rectangular, triangle, or any other suitable shape.

Figure 7A:
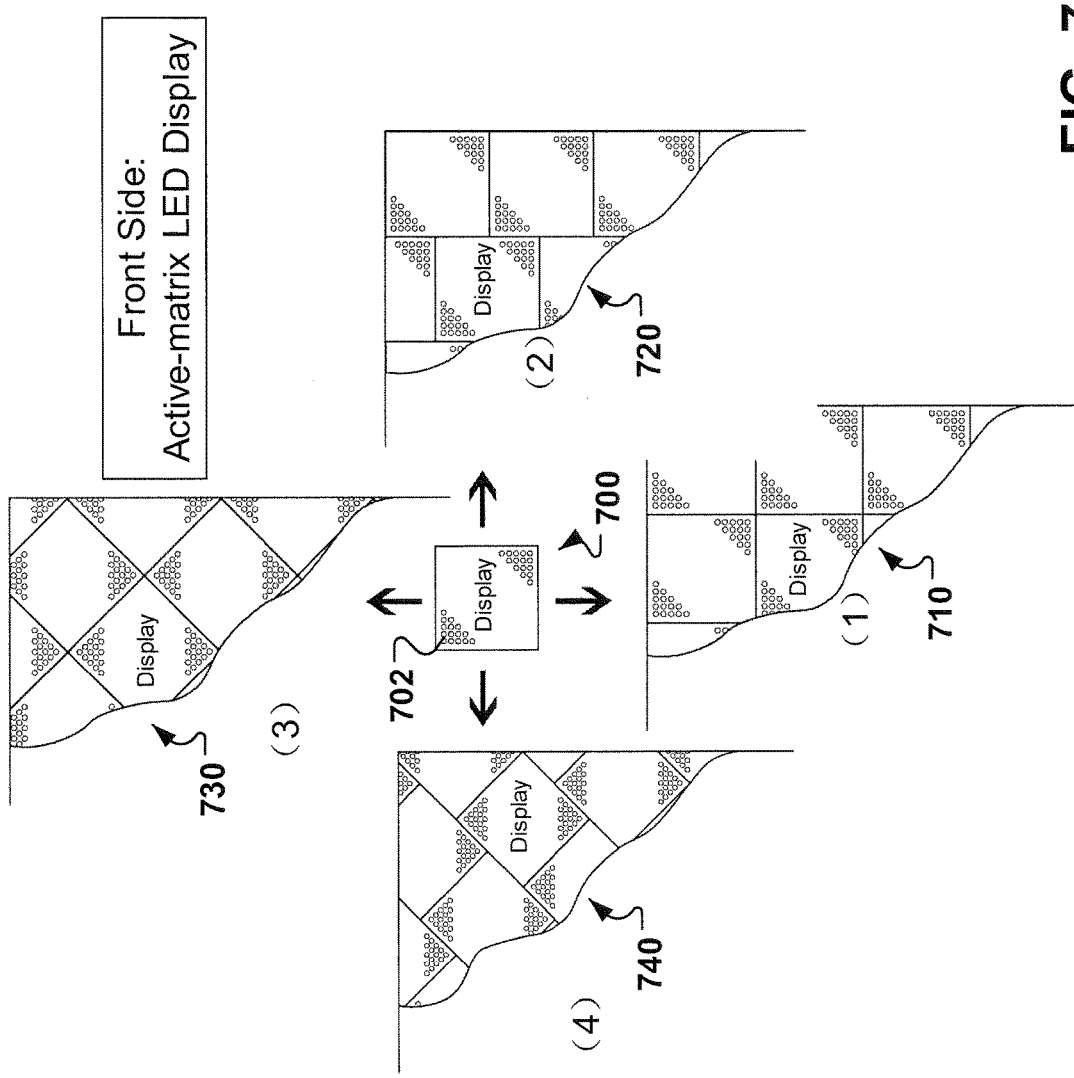
FIGS. 7A-7B show schematic diagrams of methods to arrange a larger display using multiple square shape LED display panels.
Figure 7B:
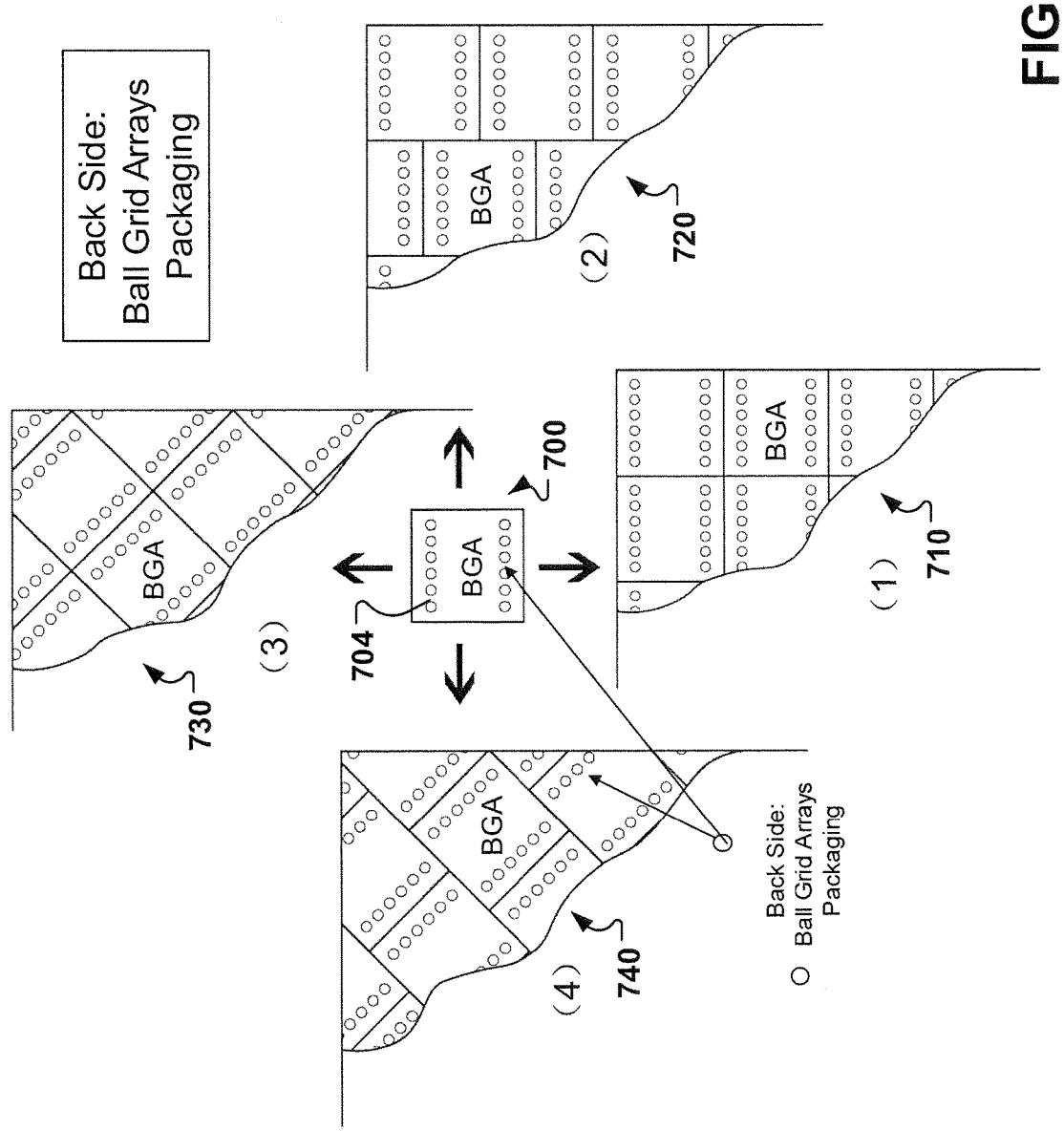

FIGS. 7A-7B show schematic diagrams of methods to compose and assemble (or arrange) a larger display using multiple square shape LED display panels 700. Each LED display panel 700 includes an array 702 of active-matrix LED pixels on a front side and a BGA package 704 on the back side. FIG. 7A shows front sides of the larger LED displays, and FIG. 7B shows back sides of the larger LED displays.

In a first method, a larger LED display 710 is formed by assembling the LED display panels 700 in rows and columns perpendicular to respective edges of a display substrate, and the display panels 700 in adjacent columns and rows are matched with each other. That is, a first row of a first display panel can be aligned to a second row of a second display panel on a left or right side of the first display panel, and a first column of the first display panel can be aligned to a second column of a third display panel on a top or a bottom side of the first display panel.

In a second method, a larger LED display 720 is formed by assembling the LED display panels 700 in multiple columns perpendicular to edges of a display substrate. The display panels 700 in adjacent columns are mismatched with each other in rows. That is, a first column of a first display panel can be aligned to a second column of a second display panel on a top or a bottom side of the first display panel, and a first row of the first display panel is mismatched or not aligned to a second row of a third display panel on a left or right side of the first display panel. In some other implementations, using a similar method, a larger LED display can be formed by assembling the LED display panels 700 in multiple rows perpendicular to edges of a display substrate. The display panels 700 in adjacent rows are mismatched with each other in columns.

In a third method, a larger LED display 730 is formed by assembling the LED display panels 700 in rows and columns with a titled angle to respective edges of a display substrate. The display panels 700 in adjacent columns and rows are matched with each other. The larger LED display 730 is similar to the LED display 710, except that the larger LED display 730 is tilted with respect to the edges of the display substrate. Due to the titled angle, on the edges of the LED display 730, the display panels 700 may be cut into desired shapes (e.g., triangle shape) or into parts.

In a fourth method, a larger LED display 740 is formed by assembling the LED display panels 700 in multiple columns (or rows) with a titled angle to respective edges of a display substrate. The display panels 700 in adjacent columns (or rows) are not matched with each other in rows (or columns). The larger LED display 740 is similar to the LED display 720, except that the larger LED display 740 is tilted with respect to the edges of the display substrate. Due to the titled angle, on the edges of the LED display 740, the display panels 700 may be cut into desired shapes (e.g., triangle shape) or in parts.

Figure 7C:
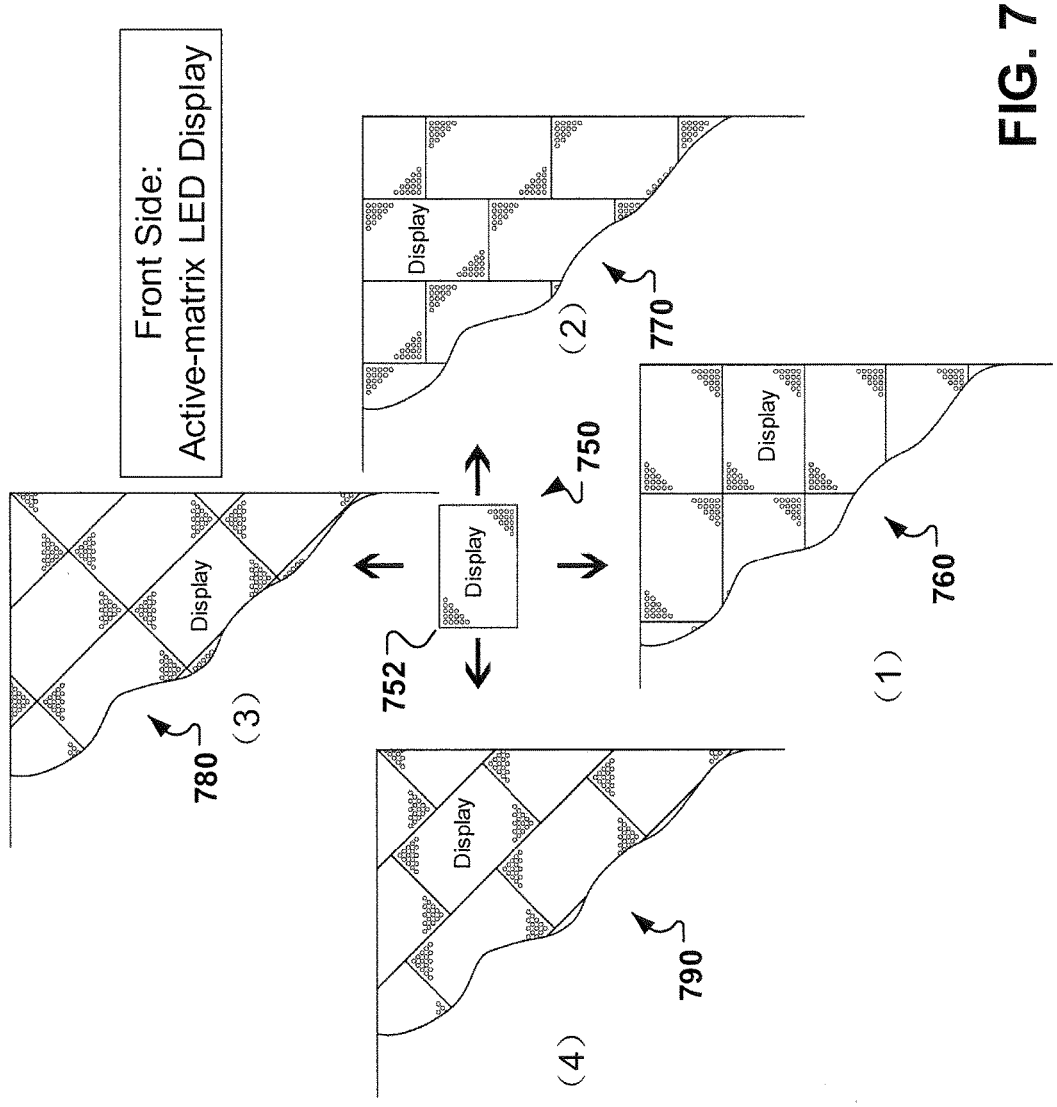
FIGS. 7C-7D show schematic diagrams of methods to arrange a larger display using multiple rectangular shape LED display panels.
Figure 7D:
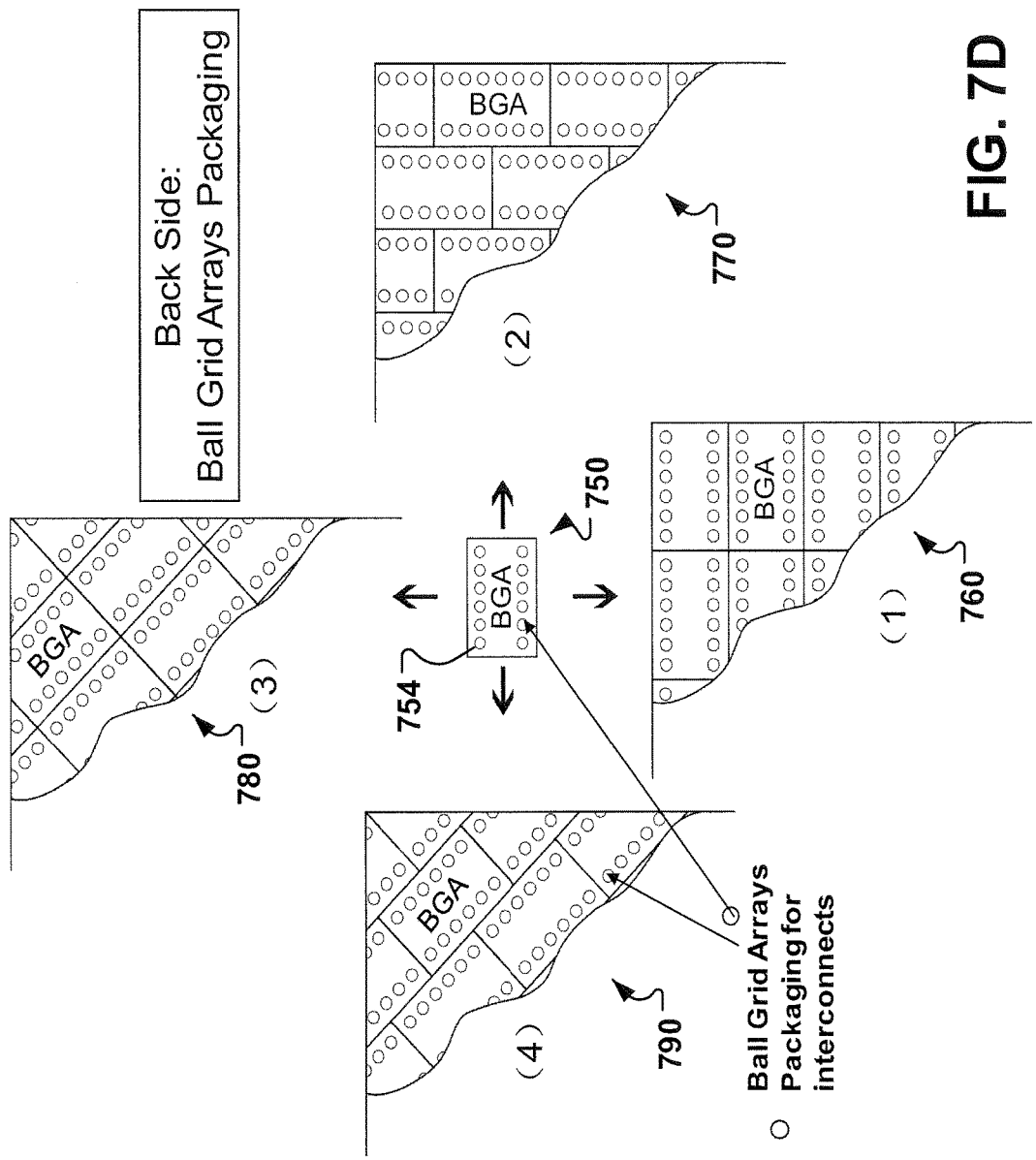

FIGS. 7C-7D show schematic diagrams of methods to compose and assemble (or arrange) a larger display using multiple rectangular shape LED display panels 750. Each LED display panel 750 includes an array 752 of active-matrix LED pixels on a front side and a BGA package 754 on the back side. FIG. 7C shows front sides of the larger LED displays, and FIG. 7D shows back sides of the larger LED displays.

In a first method, a larger LED display 760 is formed by assembling the LED display panels 750 in rows and columns perpendicular to respective edges of a display substrate, and the display panels 750 in adjacent columns and rows are matched with each other. That is, a first row of a first display panel can be aligned to a second row of a second display panel on a left or right side of the first display panel, and a first column of the first display panel can be aligned to a second column of a third display panel on a top or a bottom side of the first display panel.

In a second method, a larger LED display 770 is formed by assembling the LED display panels 750 in multiple columns perpendicular to edges of a display substrate. The display panels 750 in adjacent columns are mismatched with each other in rows. That is, a first column of a first display panel can be aligned to a second column of a second display panel on a top or a bottom side of the first display panel, and a first row of the first display panel is mismatched or not aligned to a second row of a third display panel on a left or right side of the first display panel. In some other implementations, using a similar method, a larger LED display can be formed by assembling the LED display panels 750 in multiple rows perpendicular to edges of a display substrate. The display panels 750 in adjacent rows are mismatched with each other in columns.

In a third method, a larger LED display 780 is formed by assembling the LED display panels 750 in rows and columns with a titled angle to respective edges of a display substrate. The display panels 750 in adjacent columns and rows are matched with each other. The larger LED display 780 is similar to the LED display 760, except that the larger LED display 780 is tilted with respect to the edges of the display substrate. Due to the titled angle, on the edges of the LED display 780, the display panels 750 may be cut into desired shapes (e.g., triangle shape) or in parts.

In a fourth method, a larger LED display 790 is formed by assembling the LED display panels 750 in multiple columns (or rows) with a titled angle to respective edges of a display substrate. The display panels 750 in adjacent columns (or rows) are not matched with each other in rows (or columns). The larger LED display 790 is similar to the LED display 770, except that the larger LED display 790 is tilted with respect to the edges of the display substrate. Due to the titled angle, on the edges of the LED display 730, the display panels 700 may be cut into desired shapes (e.g., triangle shape) or in parts.

Example Fabrication Process

FIG. 8A is a flow diagram of an example process 800 of forming a larger display by multiple sub-displays (or display panels). The larger display can be the display 10 of FIGS. 1A-1B. The sub-displays can be the LED pixel array microdisplay 100 of FIGS. 1A-1D, 550 of FIGS. 5H-5I, or 670 of FIGS. 6L-6M.

A plurality of sub-displays is fabricated on one or more substrates (802). The substrates can be a silicon (111) wafer or a silicon (100) wafer. The sub-displays can have a same size or different sizes. Depending on the size of the larger display to be formed and the sizes (and/or shapes) of the sub-displays, a number of sub-displays needed to form the larger display can be determined. Based on the number of sub-displays, the sizes (and/or shapes) of the sub-displays, the sizes (and/or shapes) of the substrates, and the assembling methods (e.g., as shown in FIGS. 7A-7B), a number of substrates can be determined.

For example, to form a display with 64 inch in width×36 inch in height, 2304 pieces of square shape sub-displays with 1 inch×1 inch are needed according to the first assembling method shown in FIG. 7A. On a silicon wafer with 6 inch in diameter, 26 pieces of sub-displays with 1 inch×1 inch can be formed, as illustrated by FIG. 4A. Thus, about 90 silicon wafers (larger than 2304/26=88.6) may be required to form these sub-displays with some redundancy.

The step 802 can include process 810 of forming an array of sub-displays on each substrate. FIG. 8B shows an example process 810 of forming an array of sub-displays on a substrate. The example process 810 can be similar to the processes described according to FIGS. 5A-5I or the processes described according to FIGS. 6A-6M.

The substrate is prepared (812). The substrate can be pre-treated, e.g., by cleaning surfaces of the substrate. The substrate can include a first side, e.g., an upper side, and a second side, e.g., a lower side opposite to the upper side.

A light-emitting pixel array is formed on the first side of the substrate (814). Each pixel includes at least one light-emitting element. In some implementations, each pixel includes at least one light-emitting element and at least one non-volatile memory coupled to the at least one light-emitting element. The at least one non-volatile memory can be arranged adjacent to the at least one light-emitting element. Each light-emitting element can be connected to one respective non-volatile memory in one pixel.

In some implementations, the substrate is a (111) silicon semiconductor substrate having a first surface on the first side and a second surface on the second side and opposite to the first surface. In some examples, as described in FIGS. 5A-5I, the light-emitting elements and the non-volatile memories are formed on the first surface and the second surface, respectively, and coupled to each other via conductive interconnects penetrating through the substrate. In some examples, as described in FIGS. 6A-6M, the light-emitting elements and the non-volatile memories are formed on the same first surface.

In some implementations, the substrate is a (100) silicon semiconductor substrate having a first surface along a (100) crystalline plane direction on the first side and a second surface along the (100) crystal plane direction on the second side, the second surface being parallel to the first surface. Preparing the substrate could include etching the first side of the substrate to form a third surface having along a (111) crystalline plane, e.g., a Si (111) sub-surface, the third surface being not parallel to the first surface. Forming light-emitting pixel arrays on the first side can include forming the light-emitting elements of the pixels on the third surface; and forming the non-volatile memories on the first surface.

The light-emitting elements can be light-emitting diodes (LEDs) having one or more quantum well layers including Group III-V compounds, e.g., InGaN. The LEDs can be epitaxially grown (e.g., by MOCVD, MBE, or ALD) on Si (111) surfaces. In some implementations, the light-emitting pixel array is a multi-color pixel array, e.g., including blue, red, green, and/or white colors. As noted above, an array of primary LEDs emitting a first color, e.g., blue, is first formed on the substrate. Secondary color LEDs, e.g., red or green, can be formed by depositing different color phosphor materials or different size quantum dot materials, on surfaces of the primary LED.

Conductive electrodes for interconnects are formed from the second side to the first side (816). The substrate can be first deep etched from the second side, e.g., by dry reaction ion etching (ME) or plasma etching, to form through-holes or deep trenches in the substrate. Then inner surfaces of the through-holes or deep trenches are insulated, and metals or other conductive materials are filled in the through-holes or deep trenches to form the conductive electrodes for interconnects.

Integrated circuits are formed on the second side and coupled to the pixels through the conductive electrodes (818). The integrated circuits can be similar to the integrated circuits 104 of FIG. 1C, 520 of FIGS. 5D to 5I, 640 of FIGS. 6J to 6M. The integrated circuits can include display drivers (scanning drivers and data drivers) and control electronics. The display drivers are coupled to the control electronics via conductive connections on the second side.

In some implementations, the non-volatile memories of the pixels are formed on the first side. Word lines and bit lines are formed on the first side and coupled to the non-volatile memories on the first side and coupled to the scanning drivers and data drivers on the second side through the conductive electrodes that penetrate through the substrate. Each non-volatile memory is configured to be coupled to one of the scanning drivers through at least one word line and to one of the data drivers through at least one bit line.

In some implementations, the non-volatile memories of the pixels are formed on the second side and coupled to the LEDs on the first side through the conductive electrodes that penetrate through the substrate. Word lines and bit lines are formed on the second side as the non-volatile memories, such that each non-volatile memory is coupled to one of the scanning drivers through at least one word line and to one of the data drivers through at least one bit line.

A grid array package is formed on the second side of the substrate and coupled to the integrated circuits via conductive connections (820). The grid array package can be the BGA package, e.g., the BGA package 1000 of FIGS. 1A-1B,

520 of FIGS. 5F-5I, or 650 of FIGS. 6K to 6M. The grid array package can be formed on a top surface of the integrated circuits.

Referring back to FIG. 8A, after the arrays of sub-displays are formed on the substrates, individual sub-displays can be obtained from the substrates, e.g., by cutting. As noted above, the sub-displays can be cut from the substrates one by one, or two or more sub-displays can be cut from the substrates together.

The obtained individual sub-displays are arranged on a display substrate (806). The display substrate can be similar to the display substrate 12 of FIGS. 1A-1B. The display substrate can be transparent, e.g., glass, polymer, sapphire, or thin-film, or semi-transparent, e.g., with scattering material. The sub-displays can be arranged according to at least one of the methods described in FIGS. 7A-7B and FIGS. 1A-1B.

Interconnects are formed to conductively couple grid array packages (e.g., BGA packages) formed on the sub-displays on the display substrate to form the larger display (820). The formed larger display can display images or videos according to the process 300 of FIG. 3.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. A display formed by sub-displays comprising:
a plurality of sub-displays each including:
an array of light-emitting pixels, each pixel including at least one light-emitting element formed on a first side of a semiconductor substrate, the at least one light-emitting element comprising multiple layers epitaxially grown on a semiconductor surface of the semiconductor substrate on the first side;
integrated circuits formed on a second side of the semiconductor substrate;
conductive electrodes penetrating through the semiconductor substrate and coupling the light-emitting elements of the array of light-emitting pixels on the first side to the integrated circuits on the second side; and
a conductive grid array package formed on the second side of the semiconductor substrate and conductively coupled to the integrated circuits; and interconnects conductively coupled to the conductive grid array packages of the plurality of sub-displays.

2. The display of claim 1, wherein the integrated circuits comprise display drivers configured to transmit image or video data to one or more particular light-emitting pixels and control the particular light-emitting pixels to emit light based on the image or video data.

3. The display of claim 2, wherein each of the light-emitting pixels comprises at least one non-volatile memory formed on the first side of the substrate and coupled to the at least one light-emitting element,
  wherein the sub-display further comprises word lines and bit lines formed on the first side of the substrate and coupled to the non-volatile memories of the light-emitting pixels, and
  wherein the display drivers comprise scanning drivers and control drivers coupled to the word lines and the bit lines through the conductive electrodes, respectively, such that each of the non-volatile memories is coupled to one of the scanning drivers through at least one word line and to one of the control drivers through at least one bit line.

4. The display of claim 2, wherein the integrated circuits comprise a plurality of non-volatile memories formed on the second side of the substrate and coupled to the light-emitting elements on the first side through the conductive electrodes, and
  wherein the display drivers comprise scanning drivers and data drivers, and each of the non-volatile memories is coupled to one of the scanning drivers through at least one word line and to one of the data drivers through at least one bit line, the word lines and the bits lines being formed on the second side.

5. The display of claim 2, wherein the integrated circuits comprise control electronics, and
  wherein the display drivers are coupled to the control electronics via first conductive connections formed on the second side of the substrate, and the control electronics are coupled to the conductive grid array package via second conductive connections formed on the second side of the substrate.

6. The display of claim 5, wherein the control electronics comprises at least one of:
  one or more digital signal processors including at least one of: a digital signal analyzer, a digital processor, an image processor, a volatile memory, a non-volatile memory, or a touch screen processor; or
  one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

7. The display of claim 1, further comprising a control unit coupled to the integrated circuits of the plurality of sub-displays through the interconnects and the conductive grid array packages of the plurality of sub-displays,
  wherein the control unit is configured to transmit image or video data and control signals to integrated circuits of one or more particular sub-displays of the plurality of sub-displays, such that the particular sub-displays are operable to display an integrated image or video representing the image or video data based on the control signals.

8. The display of claim 1, further comprising a display substrate, wherein the plurality of sub-display is arranged on the display substrate and adjacent to each other.

9. The display of claim 8, wherein a distance between adjacent light-emitting pixels on respective edges of adjacent sub-displays is less than 1 mm.

10. The display of claim 8, wherein the display substrate comprises a transparent solid substrate including one of a transparent glass substrate, a transparent plastic substrate, a transparent sapphire substrate, and a transparent thin-film substrate.

11. The display of claim 8, further comprising a conductive layer formed on a bottom side of the display substrate,
  wherein the conductive layer is arranged to face the light-emitting pixels on the plurality of sub-displays and coupled to respective electrodes of the light-emitting pixels, and
  wherein the conductive layer and the respective electrodes of the light-emitting pixels form a touch screen position sensor operable to generate an electrical change in response to a touch on a spot of a top side of the display substrate.

12. The display of claim 1, wherein the conductive grid array package comprises a ball grid array (BGA) package, and the BGA package is formed on a surface of the integrated circuits.

13. The display of claim 1, wherein the substrate is a silicon semiconductor substrate including:
  a first surface having a (111) orientation on the first side, and
  a second surface having a (111) orientation on the second side and opposite to the first surface, and
  wherein the light-emitting pixels are formed on the first surface, and the integrated circuits are formed on the second surface.

14. The display of claim 1, wherein each of the pixels includes at least three light-emitting diodes (LEDs) operable to emit at least three different colors,
  wherein the at least three LEDs comprise same quantum well layers formed by Group III-V compounds and configured to emit light with a first color, and
  wherein at least one of the at least three LEDs comprises a phosphor material or a quantum-dot material configured to emit a second light different from the first color.

15. The display of claim 1, wherein each sub-display further comprises one or more display drivers formed on the first side of the substrate, and
  wherein the display drivers are coupled to the array of light-emitting pixels via conductive connections on the first side and to the integrated circuits on the second side via the conductive electrodes.

16. The display of claim 15, wherein each pixel further comprises at least one non-volatile memory formed on the first side and coupled to the at least one light-emitting element, and
  wherein each of the non-volatile memories is coupled to one of scanning drivers in the display drivers via at least one word line and to one of data drivers in the display drivers via at least one data line, the word lines and the data lines being formed on the first side.

17. The display of claim 15, further comprising a display substrate, wherein the plurality of sub-displays is arranged on the display substrate and adjacent to each other, and wherein the display substrate comprises a scattering material configured to scatter light emitted from the pixels of the sub-displays to thereby improve an illumination area of the pixels.

18. A method of fabricating a display by multiple sub-displays, comprising:

fabricating a plurality of sub-displays on one or more semiconductor substrates, including:
  forming an array of sub-displays on each, each sub-display including:
    an array of light-emitting pixels, each pixel including at least one light-emitting element formed on a first side of the substrate, the at least one light-emitting element comprising multiple layers epitaxially grown on a semiconductor surface of the substrate on the first side;
    integrated circuits formed on a second side of the substrate;
    conductive electrodes penetrating through the substrate and coupling the light-emitting elements of the array of light-emitting pixels on the first side to the integrated circuits on the second side; and
    a conductive grid array package formed on the second side of the substrate and coupled to the integrated circuits; then
  obtaining individual sub-displays from the one or more semiconductor substrates;
  arranging the individual sub-displays on a display substrate; and
  forming interconnects conductively coupled to the conductive grid array packages of the sub-displays arranged on the display substrate to form the display.

19. The method of claim 18, wherein each of the sub-displays has a rectangular shape or a square shape.

20. The method of claim 18, wherein arranging the individual sub-displays on the display substrate comprises at least one of:
  arranging the individual sub-displays in rows and columns perpendicular to respective edges of the display substrate, the sub-displays in adjacent columns and rows being matched with each other,
  arranging the individual sub-displays in rows and columns with a tilted angle to respective edges of the display substrate, the sub-displays in adjacent columns and rows being matched with each other,
  arranging the individual sub-displays in multiple columns or rows perpendicular to edges of the display substrate, the sub-displays of adjacent columns or rows being mismatched with each other in rows or columns, or
  arranging the individual sub-displays in multiple columns or rows with a tilted angle to edges of the display substrate, the sub-displays in adjacent columns or rows being mismatched with each other in rows or columns.

21. The method of claim 18, wherein a distance between adjacent light-emitting pixels on respective edges of adjacent sub-displays of the display is less than 1 mm.

22. The method of claim 18, wherein, for each sub-display, the conductive grid array package comprises a ball grid array (BGA) package, and the BGA package is formed on a surface of the integrated circuits.

23. A method of displaying an image or video on a display formed by multiple sub-displays, the method comprising:
  receiving an instruction to display an image or video on the display;
  analyzing, by a control unit of the display, the image or video to obtain image or video data;
  transmitting, by the control unit, the image or video data to a plurality of sub-displays of the display via interconnects coupled to grid array packages formed on the plurality of sub-displays, each sub-display comprising an array of light emitting pixels and receiving a respective part of the image/video data;
  at each sub-display,
    analyzing, by control electronics formed on a first side of a semiconductor substrate of the sub-display, the respective part of image or video data to generate secondary image or video data;
    transmitting, by the control electronics, the secondary image or video data to display drivers;
    selecting, by the display drivers, particular light emitting pixels formed on the semiconductor substrate, each of the particular light emitting pixels including at least one light-emitting element formed on a second side of the semiconductor substrate, the at least one light-emitting element comprising multiple layers epitaxially grown on a semiconductor surface of the semiconductor substrate on the second side, the light-emitting elements of the particular light emitting pixels being coupled to the first side via conductive electrodes penetrating through the semiconductor substrate; and
    controlling, by the display drivers, the selected particular light emitting pixels to emit light corresponding to the secondary image or video data; and
  transmitting, by the controller, control signals to the plurality of sub-displays, such that the sub-displays are operable to display an integrated image or video representing the image or video data based on the control signals.

24. The method of claim 23, wherein the display drivers are formed on the first side of the substrate, and wherein the particular light emitting pixels on the second side are coupled to the display drivers via the conductive electrodes penetrating through the substrate.

25. The method of claim 23, wherein the display drivers are formed on the second side of the substrate and coupled to the particular light emitting pixels via conductive connections formed on the second side and to the control electronics via the conductive electrodes penetrating through the substrate.

* * * * *